US011476431B2

(12) United States Patent
Hiroki et al.

(10) Patent No.: US 11,476,431 B2
(45) Date of Patent: Oct. 18, 2022

(54) FOLDABLE ELECTRONIC DEVICE HAVING AN ELASTIC BODY IN OPENINGS OF THE SPACERS

(71) Applicant: Semiconductor Energy Laboratory Co., Ltd., Atsugi (JP)

(72) Inventors: Masaaki Hiroki, Kanagawa (JP); Akio Endo, Kanagawa (JP)

(73) Assignee: Semiconductor Energy Laboratory Co., Ltd., Atsugi (JP)

(*) Notice: Subject to any disclaimer, the term of this patent is extended or adjusted under 35 U.S.C. 154(b) by 0 days.

(21) Appl. No.: 17/095,943

(22) Filed: Nov. 12, 2020

(65) Prior Publication Data

US 2021/0159434 A1 May 27, 2021

Related U.S. Application Data

(63) Continuation of application No. 16/248,890, filed on Jan. 16, 2019, now Pat. No. 10,840,464, which is a (Continued)

(30) Foreign Application Priority Data

Oct. 28, 2014 (JP) .................... 2014-219135

(51) Int. Cl.
*H01L 51/00* (2006.01)
*G09F 9/30* (2006.01)
(Continued)

(52) U.S. Cl.
CPC .......... *H01L 51/0097* (2013.01); *G09F 9/301* (2013.01); *G09G 3/3266* (2013.01);
(Continued)

(58) Field of Classification Search
CPC ......... H01L 51/0097; H01L 2251/5338; H01L 14/50; H01L 31/03926; H01L 23/4985
See application file for complete search history.

(56) References Cited

U.S. PATENT DOCUMENTS 6,144,358 A 11/2000 Narayanaswamy et al.
6,262,785 B1 7/2001 Kim
(Continued)

FOREIGN PATENT DOCUMENTS

CN 001577435 A 2/2005
CN 101133434 A 2/2008
(Continued)

OTHER PUBLICATIONS

Taiwanese Office Action (Application No. 108100736), dated May 27, 2021.
(Continued)

*Primary Examiner* — Hoai V Pham
(74) *Attorney, Agent, or Firm* — Fish & Richardson P.C.

(57) ABSTRACT

A highly portable and highly browsable light-emitting device is provided. A light-emitting device that is less likely to be broken is provided. The light-emitting device has a strip-like region having high flexibility and a strip-like region having low flexibility that are arranged alternately. In the region having high flexibility, a light-emitting panel and a plurality of spacers overlap with each other. In the region having low flexibility, the light-emitting panel and a support overlap with each other. When the region having high flexibility is bent, the angle between normals of facing planes of the two adjacent spacers changes according to the bending of the light-emitting panel; thus, a neutral plane can be formed in the light-emitting panel or in the vicinity of the light-emitting panel.

14 Claims, 23 Drawing Sheets

Related U.S. Application Data continuation of application No. 15/807,670, filed on Nov. 9, 2017, now Pat. No. 10,199,585, which is a continuation of application No. 14/921,059, filed on Oct. 23, 2015, now Pat. No. 9,818,961.

(51) Int. Cl.
  *G09G 3/3266* (2016.01)
  *H01L 51/52* (2006.01)

(52) U.S. Cl.
  CPC .... *H01L 51/525* (2013.01); *H01L 2251/5338* (2013.01); *Y02E 10/549* (2013.01)

(56) References Cited

U.S. PATENT DOCUMENTS

| | | |
|---|---|---|
| 6,372,608 B1 | 4/2002 | Shimoda et al. |
| 6,747,638 B2 | 6/2004 | Yamazaki et al. |
| 6,828,727 B2 | 12/2004 | Yamazaki |
| 7,027,110 B2 | 4/2006 | Akiyama et al. |
| 7,176,947 B2 | 2/2007 | Kudo et al. |
| 7,242,445 B2 | 7/2007 | Akiyama et al. |
| 7,242,449 B1 | 7/2007 | Yamazaki et al. |
| 7,525,523 B2 | 4/2009 | Yamazaki et al. |
| RE40,821 E | 7/2009 | Narayanaswamy et al. |
| 7,724,269 B2 | 5/2010 | Kudo et al. |
| 7,787,097 B2 | 8/2010 | Satoh |
| 7,965,266 B2 | 6/2011 | Yamaguchi et al. |
| 7,970,443 B2 | 6/2011 | Wong et al. |
| 8,228,667 B2 | 7/2012 | Ma |
| 8,237,165 B2 | 8/2012 | Kim et al. |
| 8,319,219 B2 | 11/2012 | Yamazaki |
| 8,319,725 B2 | 11/2012 | Okamoto et al. |
| 8,367,440 B2 | 2/2013 | Takayama et al. |
| 8,373,166 B2 | 2/2013 | Yamazaki |
| 8,415,208 B2 | 4/2013 | Takayama et al. |
| 8,427,420 B2 | 4/2013 | Yamazaki et al. |
| 8,450,914 B2 | 5/2013 | Gyoda |
| 8,456,459 B2 | 6/2013 | Yamazaki et al. |
| 8,576,209 B2 | 11/2013 | Miyaguchi |
| 8,593,061 B2 | 11/2013 | Yamada |
| 8,662,731 B2 | 3/2014 | Wang et al. |
| 8,735,896 B2 | 5/2014 | Yamazaki |
| 8,736,162 B2 | 5/2014 | Jin et al. |
| 8,780,015 B2 | 7/2014 | Watanabe |
| 8,803,816 B2 | 8/2014 | Kilpatrick, II et al. |
| 8,804,349 B2 | 8/2014 | Lee et al. |
| 8,810,508 B2 | 8/2014 | Okamoto et al. |
| 8,830,217 B2 | 9/2014 | Yamazaki et al. |
| 8,836,611 B2 | 9/2014 | Kilpatrick, II et al. |
| 8,837,126 B2 | 9/2014 | Cho et al. |
| 8,860,632 B2 | 10/2014 | Kilpatrick, II et al. |
| 8,860,765 B2 | 10/2014 | Kilpatrick, II et al. |
| 8,863,038 B2 | 10/2014 | King et al. |
| 8,866,840 B2 | 10/2014 | Dahl et al. |
| 8,907,928 B2 | 12/2014 | Yamaguchi et al. |
| 8,929,085 B2 | 1/2015 | Franklin et al. |
| 8,933,874 B2 | 1/2015 | Lundqvist et al. |
| 8,947,320 B2 | 2/2015 | King et al. |
| 8,988,405 B2 | 3/2015 | Endo |
| 9,009,984 B2 | 4/2015 | Caskey et al. |
| 9,013,884 B2 | 4/2015 | Fukuma et al. |
| 9,021,657 B2 | 5/2015 | Park et al. |
| 9,024,863 B2 | 5/2015 | Okamoto et al. |
| 9,047,799 B2 | 6/2015 | Yamazaki et al. |
| 9,088,006 B2 | 7/2015 | Yamazaki et al. |
| 9,176,535 B2 | 11/2015 | Bohn et al. |
| 9,261,998 B2 | 2/2016 | Kurokawa et al. |
| 9,274,562 B2 | 3/2016 | Franklin et al. |
| 9,316,857 B2 | 4/2016 | Yamazaki et al. |
| 9,348,362 B2 | 5/2016 | Ko et al. |
| 9,361,853 B2 | 6/2016 | Yamazaki et al. |
| 9,368,064 B2 | 6/2016 | Toyomura et al. |
| 9,370,094 B2 | 6/2016 | Miyaguchi |
| 9,397,117 B2 | 7/2016 | Okamoto et al. |
| 9,448,592 B2 | 9/2016 | Jin et al. |
| 9,450,133 B2 | 9/2016 | Nakamura et al. |
| 9,543,533 B2 | 1/2017 | Yamazaki et al. |
| 9,557,874 B2 | 1/2017 | Franklin et al. |
| 9,627,648 B2 | 4/2017 | Yamazaki et al. |
| 9,645,430 B2 | 5/2017 | Nakano |
| 9,651,998 B2 | 5/2017 | Matsueda |
| 9,735,178 B2 | 8/2017 | Miyaguchi |
| 9,748,275 B2 | 8/2017 | Miyaguchi |
| 9,818,961 B2 | 11/2017 | Hiroki et al. |
| 9,905,795 B2 | 2/2018 | Matsueda |
| 9,923,156 B2 * | 3/2018 | Jeong .................... G06F 1/1652 |
| 9,971,448 B2 | 5/2018 | Franklin et al. |
| 9,980,389 B2 | 5/2018 | Okamoto et al. |
| 10,003,047 B2 | 6/2018 | Yamazaki et al. |
| 10,054,988 B2 | 8/2018 | Jin et al. |
| 10,096,669 B2 | 10/2018 | Yamazaki et al. |
| 10,147,742 B2 | 12/2018 | Miyaguchi |
| 10,199,585 B2 | 2/2019 | Hiroki et al. |
| 10,263,063 B2 | 4/2019 | Yamazaki et al. |
| 10,297,784 B2 | 5/2019 | Matsueda |
| 10,318,061 B2 | 6/2019 | Franklin et al. |
| 10,361,221 B2 | 7/2019 | Miyaguchi |
| 10,381,599 B2 | 8/2019 | Yamazaki et al. |
| 10,411,038 B2 | 9/2019 | Miyaguchi |
| 10,528,084 B2 | 1/2020 | Jin et al. |
| 10,580,796 B2 | 3/2020 | Okamoto et al. |
| 10,680,055 B2 | 6/2020 | Yamazaki et al. |
| 10,692,891 B2 | 6/2020 | Miyaguchi |
| 10,739,908 B2 | 8/2020 | Franklin et al. |
| 10,840,464 B2 | 11/2020 | Hiroki et al. |
| 10,903,453 B2 | 1/2021 | Yamazaki et al. |
| 10,983,564 B2 | 4/2021 | Jin et al. |
| 10,985,186 B1 | 4/2021 | Miyaguchi |
| 11,018,159 B2 | 5/2021 | Miyaguchi |
| 11,074,025 B2 | 7/2021 | Hirakata |
| 2002/0027636 A1 | 3/2002 | Yamada |
| 2003/0162162 A1 | 8/2003 | Marggraff |
| 2004/0183958 A1 | 9/2004 | Akiyama et al. |
| 2005/0012097 A1 | 1/2005 | Yamazaki |
| 2006/0125973 A1 | 6/2006 | Akiyama et al. |
| 2006/0244693 A1 | 11/2006 | Yamaguchi et al. |
| 2008/0042940 A1 | 2/2008 | Hasegawa |
| 2008/0055831 A1 | 3/2008 | Satoh |
| 2008/0266277 A1 | 10/2008 | Ichikura et al. |
| 2009/0289877 A1 | 11/2009 | Kwon et al. |
| 2010/0060664 A1 | 3/2010 | Kilpatrick, II et al. |
| 2010/0064244 A1 | 3/2010 | Kilpatrick, II et al. |
| 2010/0064536 A1 | 3/2010 | Caskey et al. |
| 2010/0066643 A1 | 3/2010 | King et al. |
| 2010/0079355 A1 | 4/2010 | Kilpatrick, II et al. |
| 2010/0085274 A1 | 4/2010 | Kilpatrick, II et al. |
| 2010/0085382 A1 | 4/2010 | Lundqvist et al. |
| 2010/0201604 A1 | 8/2010 | Kee et al. |
| 2010/0308335 A1 | 12/2010 | Kim et al. |
| 2011/0050657 A1 | 3/2011 | Yamada |
| 2011/0050673 A1 | 3/2011 | Lee |
| 2011/0109591 A1 | 5/2011 | Kurokawa et al. |
| 2011/0126141 A1 | 5/2011 | King et al. |
| 2011/0216023 A1 | 9/2011 | Kurokawa et al. |
| 2011/0216064 A1 | 9/2011 | Dahl et al. |
| 2011/0286157 A1 | 11/2011 | Ma |
| 2012/0217516 A1 | 8/2012 | Hatano et al. |
| 2012/0262367 A1 | 10/2012 | Chiu et al. |
| 2012/0307423 A1 | 12/2012 | Bohn et al. |
| 2012/0314399 A1 | 12/2012 | Bohn et al. |
| 2013/0010405 A1 | 1/2013 | Rothkopf et al. |
| 2013/0083496 A1 | 4/2013 | Franklin et al. |
| 2013/0187839 A1 | 7/2013 | Yang et al. |
| 2013/0214324 A1 | 8/2013 | Takayama et al. |
| 2013/0299789 A1 | 11/2013 | Yamazaki et al. |
| 2013/0314611 A1 | 11/2013 | Okutsu et al. |
| 2013/0321340 A1 | 12/2013 | Seo et al. |
| 2013/0342090 A1 | 12/2013 | Ahn et al. |
| 2014/0028596 A1 | 1/2014 | Seo et al. |
| 2014/0043546 A1 | 2/2014 | Yamazaki et al. |
| 2014/0065326 A1 | 3/2014 | Lee et al. |
| 2014/0102877 A1 | 4/2014 | Yamazaki |
| 2014/0104185 A1 | 4/2014 | Hu et al. |

(56) References Cited

U.S. PATENT DOCUMENTS

| | | |
|---|---|---|
| 2014/0111954 A1 | 4/2014 | Lee et al. |
| 2014/0152576 A1 | 6/2014 | Kim et al. |
| 2014/0217382 A1 | 8/2014 | Kwon et al. |
| 2014/0217875 A1 | 8/2014 | Park et al. |
| 2014/0223343 A1 | 8/2014 | Lee et al. |
| 2014/0226275 A1 | 8/2014 | Ko et al. |
| 2014/0240985 A1 | 8/2014 | Kim et al. |
| 2014/0247252 A1 | 9/2014 | Lee |
| 2014/0254111 A1 | 9/2014 | Yamazaki et al. |
| 2014/0307396 A1 | 10/2014 | Lee |
| 2015/0009128 A1 | 1/2015 | Matsumoto |
| 2015/0016126 A1 | 1/2015 | Hirakata et al. |
| 2015/0022515 A1 | 1/2015 | Ikeda et al. |
| 2015/0022561 A1 | 1/2015 | Ikeda et al. |
| 2015/0035777 A1 | 2/2015 | Hirakata et al. |
| 2015/0062927 A1 | 3/2015 | Hirakata et al. |
| 2015/0177789 A1 | 6/2015 | Jinbo |
| 2015/0198978 A1 | 7/2015 | Catchpole |
| 2015/0261259 A1 | 9/2015 | Endo et al. |
| 2015/0277496 A1 | 10/2015 | Reeves et al. |
| 2016/0007441 A1 | 1/2016 | Matsueda |
| 2016/0165718 A1 | 6/2016 | Oh |
| 2016/0172623 A1 | 6/2016 | Lee |
| 2016/0224166 A1 | 8/2016 | Yamazaki et al. |
| 2019/0004569 A1 | 1/2019 | Jin et al. |
| 2019/0033919 A1 | 1/2019 | Hirakata et al. |
| 2020/0363900 A1 | 11/2020 | Franklin et al. |
| 2020/0395431 A1 | 12/2020 | Yamazaki et al. |
| 2020/0395576 A1 | 12/2020 | Yamazaki et al. |
| 2021/0240228 A1 | 8/2021 | Jin et al. |
| 2021/0263619 A1 | 8/2021 | Hirakata |
| 2021/0280612 A1 | 9/2021 | Miyaguchi |
| 2021/0302778 A1 | 9/2021 | Okamoto et al. |

FOREIGN PATENT DOCUMENTS

| | | | |
|---|---|---|---|
| CN | 101908555 A | | 12/2010 |
| CN | 101996535 A | | 3/2011 |
| CN | 103620516 A | | 3/2014 |
| CN | 103985315 A | | 8/2014 |
| CN | 104019120 A | | 9/2014 |
| CN | 105280099 A | | 1/2016 |
| CN | 105474290 A | | 4/2016 |
| EP | 1122792 A | | 8/2001 |
| EP | 1830336 A | | 9/2007 |
| EP | 2259321 A | | 12/2010 |
| EP | 2264687 A | | 12/2010 |
| EP | 2573644 A | | 3/2013 |
| EP | 2765478 A | | 8/2014 |
| EP | 2765479 A | | 8/2014 |
| EP | 3299927 A | | 3/2018 |
| JP | 11-085108 A | | 3/1999 |
| JP | 2000-122039 A | | 4/2000 |
| JP | 2001-109394 A | | 4/2001 |
| JP | 2001-166849 A | | 6/2001 |
| JP | 2001-255513 A | | 9/2001 |
| JP | 2002-247164 A | | 8/2002 |
| JP | 2003-174153 A | | 6/2003 |
| JP | 2004-279867 A | | 10/2004 |
| JP | 2004-317837 A | | 11/2004 |
| JP | 2005-051211 A | | 2/2005 |
| JP | 2005-095309 A | | 4/2005 |
| JP | 2005-114759 A | | 4/2005 |
| JP | 2006-243621 A | | 9/2006 |
| JP | 2006-287982 A | | 10/2006 |
| JP | 2006-301864 A | | 11/2006 |
| JP | 2007-206648 A | | 8/2007 |
| JP | 2008-046565 A | | 2/2008 |
| JP | 2008-089884 A | | 4/2008 |
| JP | 2008-281615 A | | 11/2008 |
| JP | 2008-293680 A | | 12/2008 |
| JP | 2009-282521 A | | 12/2009 |
| JP | 2010-099122 A | | 5/2010 |
| JP | 2010-153834 A | | 7/2010 |
| JP | 2010-282183 A | | 12/2010 |
| JP | 2011-034066 A | | 2/2011 |
| JP | 2011-047976 A | | 3/2011 |
| JP | 2011-118082 A | | 6/2011 |
| JP | 2011-118877 A | | 6/2011 |
| JP | 2011-198207 A | | 10/2011 |
| JP | 2011-210241 A | | 10/2011 |
| JP | 2012-064949 A | | 3/2012 |
| JP | 2013-015835 A | | 1/2013 |
| JP | 2013-068719 A | | 4/2013 |
| JP | 2013-242904 A | | 12/2013 |
| JP | 2013-254747 A | | 12/2013 |
| JP | 2014-016519 A | | 1/2014 |
| JP | 2014-029423 A | | 2/2014 |
| JP | 2014-056566 A | | 3/2014 |
| JP | 2014-063484 A | | 4/2014 |
| JP | 2014-129590 A | | 7/2014 |
| JP | 2014-519626 | | 8/2014 |
| JP | 2014-161009 A | | 9/2014 |
| JP | 2014-197181 A | | 10/2014 |
| JP | 2014-197522 A | | 10/2014 |
| JP | 2015-501461 | | 1/2015 |
| JP | 2016-015618 A | | 1/2016 |
| JP | 2016-085972 A | | 5/2016 |
| KR | 2005-0009179 A | | 1/2005 |
| KR | 10-0598746 | | 7/2006 |
| KR | 2009-0121711 A | | 11/2009 |
| KR | 2010-0130898 A | | 12/2010 |
| KR | 2013-0005278 A | | 1/2013 |
| KR | 2013-0125715 A | | 11/2013 |
| KR | 2014-0020748 A | | 2/2014 |
| KR | 2014-0026547 A | | 3/2014 |
| KR | 2014-0050504 A | | 4/2014 |
| KR | 2014-0100866 A | | 8/2014 |
| KR | 2014-0101295 A | | 8/2014 |
| KR | 2014-0108971 A | | 9/2014 |
| KR | 2015-0126353 A | | 11/2015 |
| TW | 200506450 | | 2/2005 |
| TW | 200630669 | | 9/2006 |
| TW | 201044899 | | 12/2010 |
| TW | 201142772 | | 12/2011 |
| TW | 201205379 | | 2/2012 |
| TW | 201239459 | | 10/2012 |
| TW | 201250645 | | 12/2012 |
| TW | 201301002 | | 1/2013 |
| TW | 201311066 | | 3/2013 |
| TW | 201411240 | | 3/2014 |
| TW | 201415319 | | 4/2014 |
| TW | 201442577 | | 11/2014 |
| TW | 201443621 | | 11/2014 |
| WO | WO-2001/053919 | | 7/2001 |
| WO | WO-2006/090434 | | 8/2006 |
| WO | WO-2007/000719 | | 1/2007 |
| WO | WO-2009/122691 | | 10/2009 |
| WO | WO-2010/128614 | | 11/2010 |
| WO | WO-2011/111504 | | 9/2011 |
| WO | WO-2012/167204 | | 12/2012 |
| WO | WO-2012/170593 | | 12/2012 |
| WO | WO-2013/048925 | | 4/2013 |
| WO | WO-2014/027187 | | 2/2014 |
| WO | WO-2014/087951 | | 6/2014 |
| WO | WO-2014/136856 | | 9/2014 |
| WO | WO-2016/067141 | | 5/2016 |

OTHER PUBLICATIONS

International Search Report (Application No. PCT/IB2015/057841) dated Feb. 2, 2016.
Written Opinion (Application No. PCT/IB2015/057841) dated Feb. 2, 2016.
Taiwanese Office Action (Application No. 104134205) dated Jan. 2, 2020.
Taiwanese Office Action (Application No. 110124653), dated Nov. 30, 2021.
Taiwanese Office Action (Application No. 110124648), dated Jan. 25, 2022.

(56) References Cited

OTHER PUBLICATIONS

Taiwanese Office Action (Application No. 110124652), dated Jan. 25, 2022.

\* cited by examiner

103b(1)   108   106  103b(2)

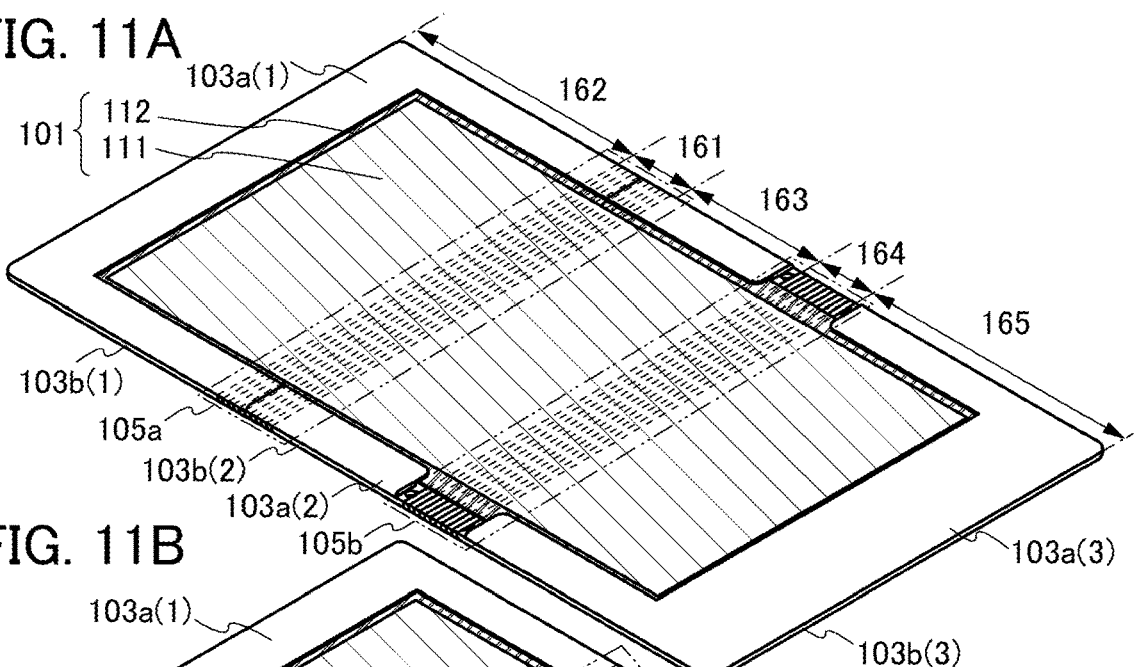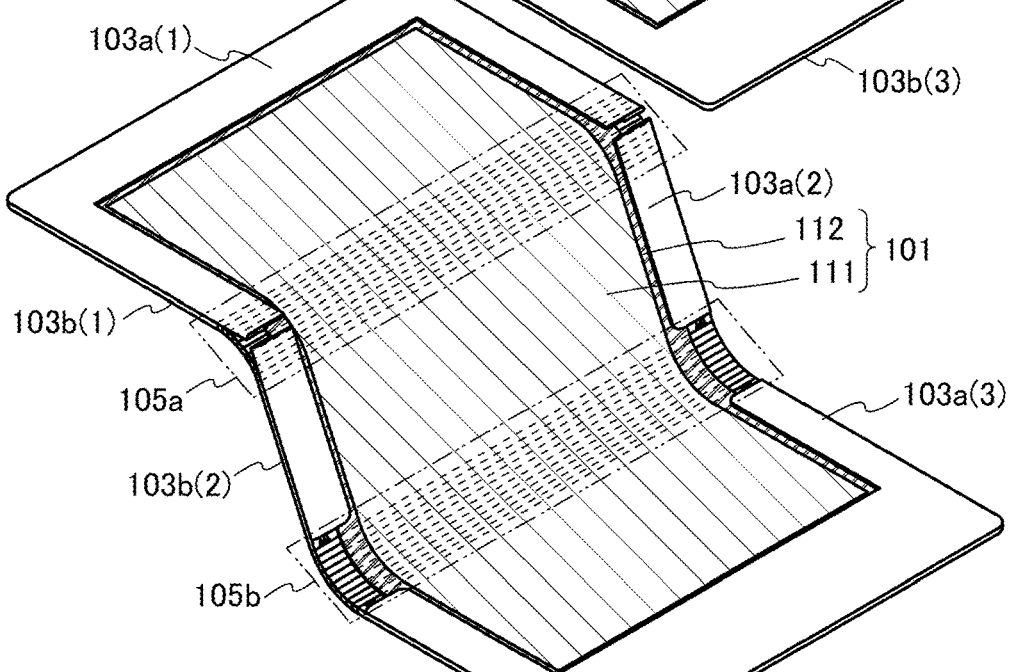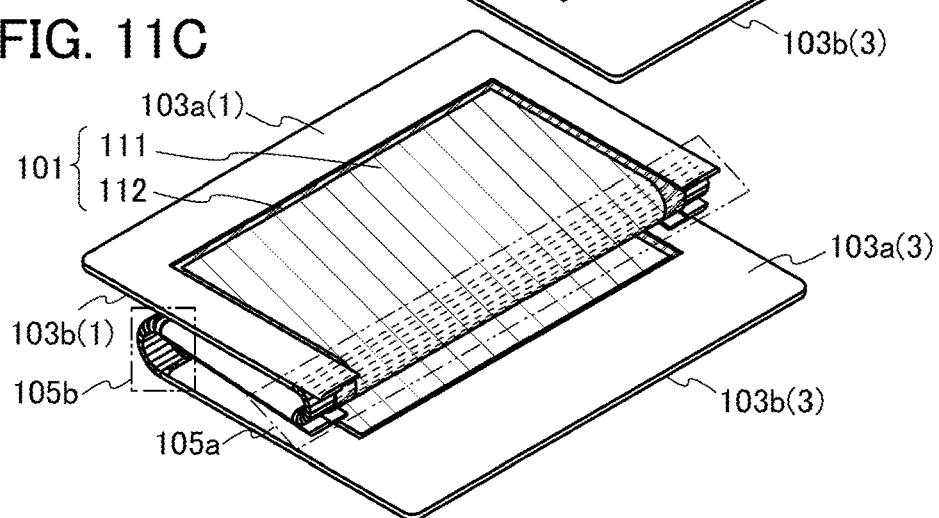

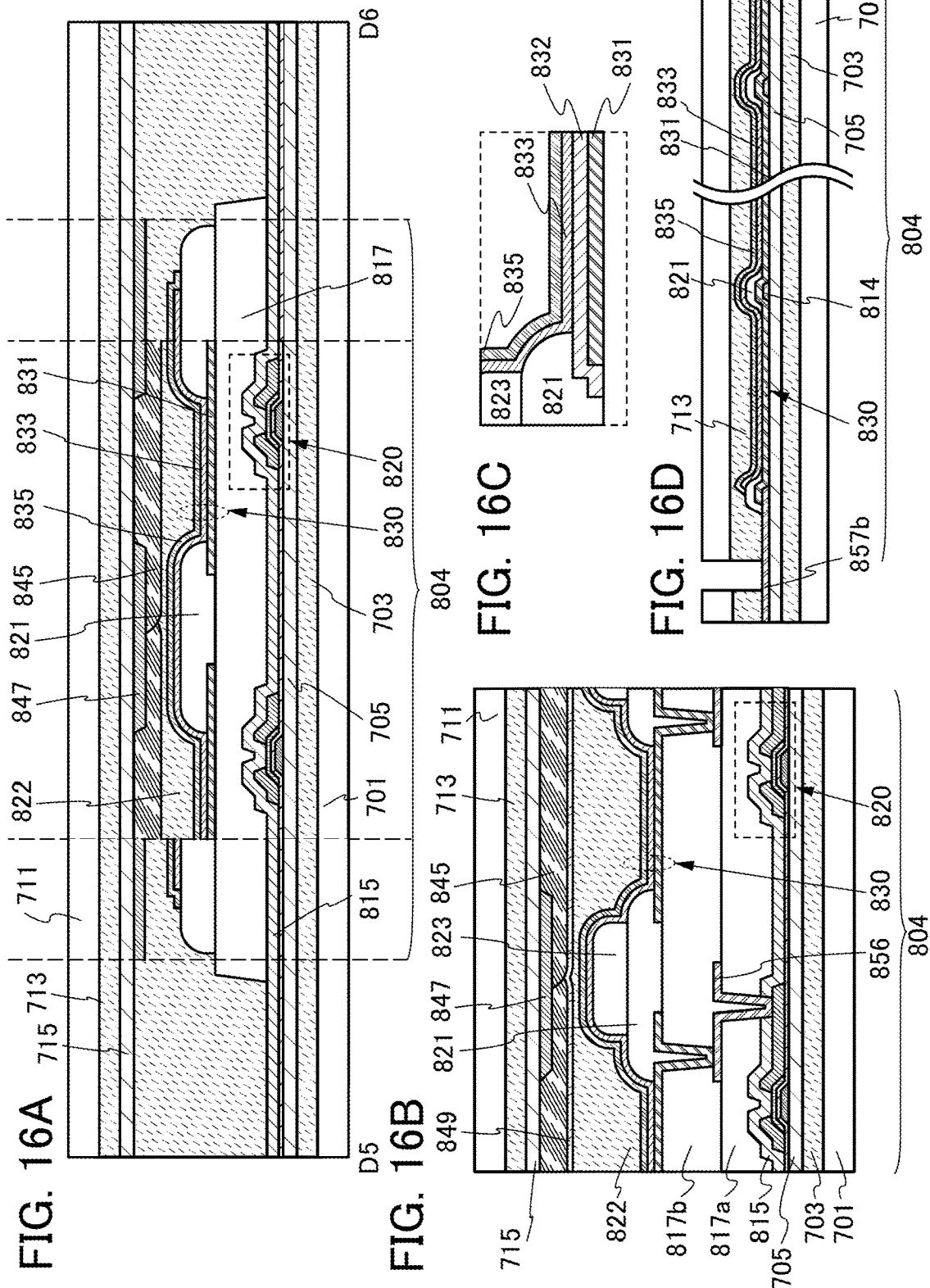

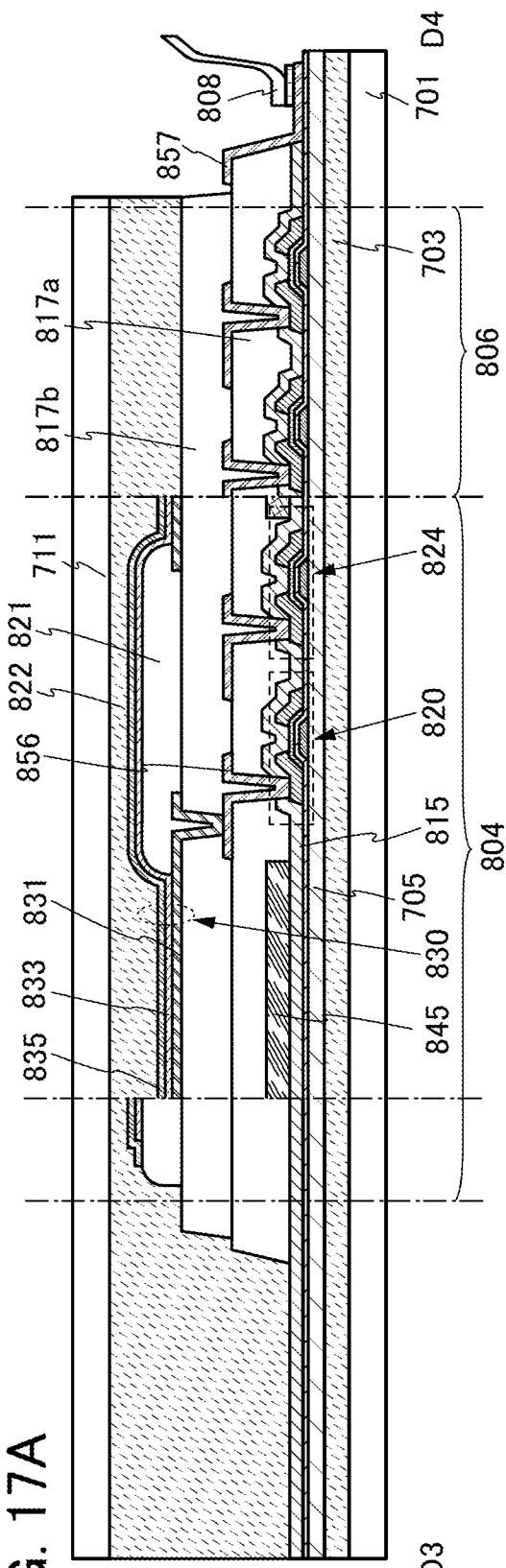

505

505

FOLDABLE ELECTRONIC DEVICE HAVING AN ELASTIC BODY IN OPENINGS OF THE SPACERS

CROSS-REFERENCE TO RELATED APPLICATIONS

This application is a continuation of U.S. application Ser. No. 16/248,890, filed Jan. 16, 2019, now allowed, which is a continuation of U.S. application Ser. No. 15/807,670, filed Nov. 9, 2017, now U.S. Pat. No. 10,199,585, which is a continuation of U.S. application Ser. No. 14/921,059, filed Oct. 23, 2015, now U.S. Pat. No. 9,818,961, which claims the benefit of a foreign priority application filed in Japan as Serial No. 2014-219135 on Oct. 28, 2014, all of which are incorporated by reference.

TECHNICAL FIELD

One embodiment of the present invention relates to a light-emitting device. In particular, one embodiment of the present invention relates to a light-emitting device utilizing organic electroluminescence (hereinafter also referred to as EL).

Note that one embodiment of the present invention is not limited to the above technical field. Examples of the technical field of one embodiment of the present invention include a semiconductor device, a display device, a light-emitting device, a power storage device, a memory device, an electronic device, a lighting device, an input device (e.g., a touch sensor), an input/output device (e.g., a touch panel), a driving method thereof, and a manufacturing method thereof.

BACKGROUND ART

Recent light-emitting devices and display devices are expected to be applied to a variety of uses and become diversified.

For example, light-emitting devices and display devices for mobile devices and the like are required to be thin, lightweight, and less likely to be broken.

Light-emitting elements utilizing EL (also referred to as EL elements) have features such as ease of thinning and lightening, high-speed response to input signal, and driving with a direct-current low voltage source; therefore, application of the light-emitting elements to light-emitting devices and display devices has been proposed.

For example, Patent Document 1 discloses a flexible active matrix light-emitting device in which an organic EL element and a transistor serving as a switching element are provided over a film substrate.

REFERENCE

Patent Document

[Patent Document 1] Japanese Published Patent Application No. 2003-174153

DISCLOSURE OF INVENTION

For application to mobile devices, the size of a light-emitting device or display device has been reduced so that the device can be highly portable. On the other hand, a larger light-emitting region or display region has been required so that the device can be highly browsable.

An object of one embodiment of the present invention is to provide a highly portable light-emitting device, display device, input/output device, electronic device, or lighting device. Another object of one embodiment of the present invention is to provide a highly browsable light-emitting device, display device, input/output device, or electronic device. Another object of one embodiment of the present invention is to provide a highly portable and highly browsable light-emitting device, display device, input/output device, or electronic device.

Another object of one embodiment of the present invention is to provide a novel light-emitting device, display device, input/output device, electronic device, or lighting device. Another object of one embodiment of the present invention is to provide a light-emitting device, display device, input/output device, electronic device, or lighting device that is less likely to be broken. Another object of one embodiment of the present invention is to provide a highly reliable light-emitting device, display device, input/output device, electronic device, or lighting device. Another object of one embodiment of the present invention is to provide a light-emitting device, display device, input/output device, electronic device, or lighting device with low power consumption.

Another object of one embodiment of the present invention is to provide a lightweight light-emitting device or the like. Another object of one embodiment of the present invention is to provide a thin light-emitting device or the like. Another object of one embodiment of the present invention is to provide a flexible light-emitting device or the like. Another object of one embodiment of the present invention is to provide a light-emitting device or lighting device with a seamless large light-emitting region or a display device, input/output device, or electronic device with a seamless large display region.

Note that the descriptions of these objects do not disturb the existence of other objects. In one embodiment of the present invention, there is no need to achieve all the objects. Other objects can be derived from the description of the specification, the drawings, and the claims.

One embodiment of the present invention is a light-emitting device including a first region, a second region, and a third region. The first region is positioned between the second region and the third region. The first region has higher flexibility than the second region and the third region. The first region includes a light-emitting panel and a plurality of spacers. The second region includes the light-emitting panel and a first support. The third region includes the light-emitting panel and a second support. The light-emitting panel has higher flexibility than the first support and the second support. The first region includes a portion where each of the plurality of spacers and the light-emitting panel overlap with each other. The second region includes a portion where the first support and the light-emitting panel overlap with each other. The third region includes a portion where the second support and the light-emitting panel overlap with each other. When the first region is bent, the angle between normals of facing planes of the two adjacent spacers changes according to the bending of the light-emitting panel.

Another embodiment of the present invention is a light-emitting device including a first region, a second region, and a third region. The first region is positioned between the second region and the third region. The first region has higher flexibility than the second region and the third region. The first region includes a light-emitting panel and a plurality of spacers. The second region includes the light-emitting panel and a first support. The third region includes the light-emitting panel and a second support. The light-emitting panel has higher flexibility than the first support and the second support. The first region includes a portion where each of the plurality of spacers and the light-emitting panel overlap with each other. The second region includes a portion where the first support and the light-emitting panel overlap with each other. The third region includes a portion where the second support and the light-emitting panel overlap with each other. The plurality of spacers each include a portion fixed to the light-emitting panel.

Another embodiment of the present invention is a light-emitting device including a first region, a second region, and a third region. The first region is positioned between the second region and the third region. The first region has higher flexibility than the second region and the third region. The first region includes a light-emitting panel, a protective layer, and a plurality of spacers. The second region includes the light-emitting panel, the protective layer, and a first support. The third region includes the light-emitting panel, the protective layer, and a second support. The light-emitting panel has higher flexibility than the first support and the second support. The protective layer has higher flexibility than the first support and the second support. The first region includes a portion where each of the plurality of spacers and the light-emitting panel overlap with each other with the protective layer positioned therebetween. The second region includes a portion where the first support and the light-emitting panel overlap with each other with the protective layer positioned therebetween. The third region includes a portion where the second support and the light-emitting panel overlap with each other with the protective layer positioned therebetween. The plurality of spacers each include a portion fixed to the protective layer.

In one embodiment of the present invention, the number of the spacers is two or more. For example, one embodiment of the present invention is a light-emitting device including a first region, a second region, and a third region. The first region is positioned between the second region and the third region. The first region has higher flexibility than the second region and the third region. The first region includes a light-emitting panel, a first spacer, and a second spacer. The second region includes the light-emitting panel and a first support. The third region includes the light-emitting panel and a second support. The light-emitting panel has higher flexibility than the first support and the second support. The first region includes a portion where the first spacer and the light-emitting panel overlap with each other. The first region includes a portion where the second spacer and the light-emitting panel overlap with each other. The second region includes a portion where the first support and the light-emitting panel overlap with each other. The third region includes a portion where the second support and the light-emitting panel overlap with each other. When the first region is bent, the angle between normals of facing planes of the first spacer and the second spacer changes according to the bending of the light-emitting panel.

Another embodiment of the present invention is a light-emitting device including a first region, a second region, and a third region. The first region is positioned between the second region and the third region. The first region has higher flexibility than the second region and the third region. The first region includes a light-emitting panel, a first spacer, and a second spacer. The second region includes the light-emitting panel and a first support. The third region includes the light-emitting panel and a second support. The light-emitting panel has higher flexibility than the first support and the second support. The first region includes a portion where the first spacer and the light-emitting panel overlap with each other. The first region includes a portion where the second spacer and the light-emitting panel overlap with each other. The second region includes a portion where the first support and the light-emitting panel overlap with each other. The third region includes a portion where the second support and the light-emitting panel overlap with each other. The first spacer includes a portion fixed to the light-emitting panel. The second spacer includes a portion fixed to the light-emitting panel.

Another embodiment of the present invention is a light-emitting device including a first region, a second region, and a third region. The first region is positioned between the second region and the third region. The first region has higher flexibility than the second region and the third region. The first region includes a light-emitting panel, a protective layer, a first spacer, and a second spacer. The second region includes the light-emitting panel, the protective layer, and a first support. The third region includes the light-emitting panel, the protective layer, and a second support. The light-emitting panel has higher flexibility than the first support and the second support. The protective layer has higher flexibility than the first support and the second support. The first region includes a portion where the first spacer and the light-emitting panel overlap with each other with the protective layer positioned therebetween. The first region includes a portion where the second spacer and the light-emitting panel overlap with each other with the protective layer positioned therebetween. The second region includes a portion where the first support and the light-emitting panel overlap with each other with the protective layer positioned therebetween. The third region includes a portion where the second support and the light-emitting panel overlap with each other with the protective layer positioned therebetween. The first spacer includes a portion fixed to the protective layer. The second spacer includes a portion fixed to the protective layer.

In the above structure, the protective layer preferably includes a portion fixed to the light-emitting panel. In particular, in the first region, the protective layer preferably includes a portion fixed to the light-emitting panel.

Another embodiment of the present invention is a light-emitting device including a first region, a second region, and a third region. The first region is positioned between the second region and the third region. The first region has higher flexibility than the second region and the third region. The first region includes a light-emitting panel and a connection portion. The second region includes the light-emitting panel and a first support. The third region includes the light-emitting panel and a second support. The light-emitting panel has higher flexibility than the first support and the second support. The first region includes a portion where the connection portion and the light-emitting panel overlap with each other. The second region includes a portion where the first support and the light-emitting panel overlap with each other. The third region includes a portion where the second support and the light-emitting panel overlap with each other. The connection portion includes an elastic body and a plurality of spacers. The elastic body is configured to connect the first support and the second support. The plurality of spacers each include an opening. The plurality of spacers are connected to each other through the elastic body in the openings.

Another embodiment of the present invention is a light-emitting device including a first region, a second region, and a third region. The first region is positioned between the second region and the third region. The first region has higher flexibility than the second region and the third region. The first region includes a light-emitting panel and a connection portion. The second region includes the light-emitting panel and a first support. The third region includes the light-emitting panel and a second support. The light-emitting panel has higher flexibility than the first support and the second support. The first region includes a portion where the connection portion and the light-emitting panel overlap with each other. The second region includes a portion where the first support and the light-emitting panel overlap with each other. The third region includes a portion where the second support and the light-emitting panel overlap with each other. The connection portion is configured to connect the first support and the second support. The connection portion includes an elastic body, a first spacer, and a second spacer. The first spacer includes an opening. The second spacer includes an opening. The first spacer and the second spacer are connected to each other through the elastic body in the openings.

In the above structure, the plurality of spacers each preferably include a portion fixed to the light-emitting panel.

In any of the above structures, the elastic body is preferably a spring or rubber.

In any of the above structures, the length of the elastic body is preferably a natural length or longer in a state where the light-emitting device is opened. Note that the natural length here means the length of the elastic body (such as a spring or rubber) to which no load is applied (i.e., the length of the elastic body not expanding or contracting).

In any of the above structures, a protective layer is preferably further included. The first region includes a portion where the connection portion and the light-emitting panel overlap with each other with the protective layer positioned therebetween. The second region includes a portion where the first support and the light-emitting panel overlap with each other with the protective layer positioned therebetween. The third region includes a portion where the second support and the light-emitting panel overlap with each other with the protective layer positioned therebetween.

In any of the above structures, in the first region, the plurality of spacers each preferably include a portion fixed to the protective layer.

In any of the above structures, in the first region, the protective layer preferably includes a portion fixed to the light-emitting panel.

In any of the above structures, the width of a first surface of the spacer on the light-emitting panel side is larger than the width of a second surface of the spacer on the side opposite to the light-emitting panel side.

In the above, the light-emitting device including the light-emitting panel is described as an example; however, a display device or an input/output device to which any of the above structures is applied is also one embodiment of the present invention. A display device of one embodiment of the present invention includes a display panel. An input/output device of one embodiment of the present invention includes a touch panel.

One embodiment of the present invention is a module including a light-emitting device, a display device, or an input/output device to which any of the above structures is applied. The module is provided with a connector such as a flexible printed circuit (FPC) or a tape carrier package (TCP) or is mounted with an IC by a chip on glass (COG) method or the like.

An electronic device or a lighting device including the above module is also one embodiment of the present invention. For example, one embodiment of the present invention is an electronic device including the above module and at least one of an antenna, a battery, a housing, a speaker, a microphone, an operation switch, and an operation button.

According to one embodiment of the present invention, a highly portable light-emitting device, display device, input/output device, electronic device, or lighting device can be provided. According to one embodiment of the present invention, a highly browsable light-emitting device, display device, input/output device, or electronic device can be provided. According to one embodiment of the present invention, a highly portable and highly browsable light-emitting device, display device, input/output device, or electronic device can be provided.

According to one embodiment of the present invention, a novel light-emitting device, display device, input/output device, electronic device, or lighting device can be provided. According to one embodiment of the present invention, a light-emitting device, display device, input/output device, electronic device, or lighting device that is less likely to be broken can be provided. According to one embodiment of the present invention, a highly reliable light-emitting device, display device, input/output device, electronic device, or lighting device can be provided. According to one embodiment of the present invention, a light-emitting device, display device, input/output device, electronic device, or lighting device with low power consumption can be provided.

According to one embodiment of the present invention, a lightweight light-emitting device or the like can be provided. According to one embodiment of the present invention, a thin light-emitting device or the like can be provided. According to one embodiment of the present invention, a flexible light-emitting device or the like can be provided. According to one embodiment of the present invention, a light-emitting device or lighting device with a seamless large light-emitting region or a display device, input/output device, or electronic device with a seamless large display region can be provided.

Note that the description of these effects does not disturb the existence of other effects. One embodiment of the present invention does not necessarily achieve all the effects listed above. Other effects can be derived from the description of the specification, the drawings, and the claims.

BRIEF DESCRIPTION OF DRAWINGS

FIGS. 11A to 11C illustrate an example of a light-emitting device.

FIGS. 16A to 16D illustrate examples of a light-emitting panel.

FIGS. 17A and 17B illustrate examples of a light-emitting panel.

BEST MODE FOR CARRYING OUT THE INVENTION

Figure 1A:
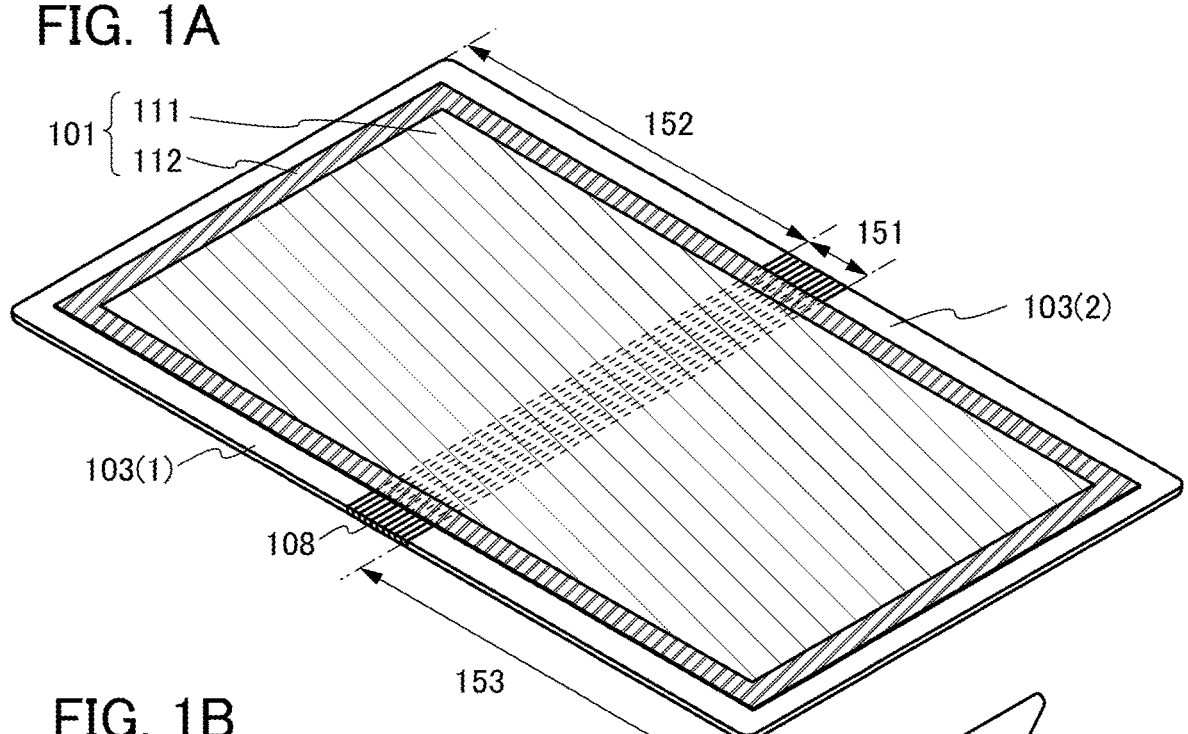
FIGS. 1A to 1C illustrate an example of a light-emitting device.

Embodiments will be described in detail with reference to the accompanying drawings. Note that the present invention is not limited to the description below, and it is easily understood by those skilled in the art that various changes and modifications can be made without departing from the spirit and scope of the present invention. Therefore, the present invention should not be construed as being limited to the description in the following embodiments.

Note that in the structures of the invention described below, the same portions or portions having similar functions are denoted by the same reference numerals in different drawings, and description of such portions is not repeated. Further, the same hatching pattern is applied to portions having similar functions, and the portions are not especially denoted by reference numerals in some cases.

The position, size, range, or the like of each structure illustrated in drawings is not accurately represented in some cases for easy understanding. Therefore, the disclosed invention is not necessarily limited to the position, size, range, or the like disclosed in the drawings.

Note that the terms "film" and "layer" can be interchanged with each other depending on the case or circumstances. For example, the term "conductive film" can be used instead of the term "conductive layer," and the term "insulating layer" can be used instead of the term "insulating film."

(Embodiment 1)

In this embodiment, a light-emitting device of one embodiment of the present invention will be described with reference to FIGS. 1A to 1C, FIGS. 2A to 2C, FIGS. 3A to 3C, FIGS. 4A and 4B, FIG. 5, FIGS. 6A and 6B, FIGS. 7A to 7C, FIGS. 8A to 8C, FIGS. 9A to 9C, FIGS. 10A to 10C, FIGS. 11A to 11C, FIGS. 12A to 12C, and FIGS. 13A to 13C.

Although a light-emitting device mainly including an organic EL element is described in this embodiment as an example, one embodiment of the present invention is not limited to this example. A light-emitting device or a display device including another light-emitting element or display element which will be described in Embodiment 2 as an example is also one embodiment of the present invention. Moreover, one embodiment of the present invention is not limited to the light-emitting device or the display device and can be applied to a variety of devices such as an input/output device.

A light-emitting device of one embodiment of the present invention includes a strip-like region with high flexibility and a strip-like region with low flexibility that are arranged alternately. The light-emitting device can be folded by bending the region with high flexibility. The light-emitting device of one embodiment of the present invention is highly portable in a folded state, and is highly browsable in an opened state because of a seamless large light-emitting region.

In the light-emitting device of one embodiment of the present invention, the region with high flexibility can be bent inwardly or outwardly. In the light-emitting device of this embodiment, one light-emitting panel can be folded once or more times. The radius of curvature in that case can be, for example, greater than or equal to 0.01 mm and less than or equal to 150 mm.

Note that in this specification, being "bent inwardly" means being bent such that a light-emitting surface of a light-emitting panel faces inward, and being "bent outwardly" means being bent such that a light-emitting surface of a light-emitting panel faces outward. A light-emitting surface of a light-emitting panel or a light-emitting device refers to a surface through which light emitted from a light-emitting element is extracted.

When the light-emitting device of one embodiment of the present invention is not in use, it can be folded such that a light-emitting surface of a light-emitting panel faces inward, whereby the light-emitting surface can be prevented from being damaged or contaminated.

When the light-emitting device of one embodiment of the present invention is in use, it can be opened so that the seamless large light-emitting region is entirely used, or it can be folded such that the light-emitting surface of the light-emitting panel faces outward and the light-emitting region can be partly used. Folding the light-emitting device and putting part of the light-emitting region that is hidden from a user in a non-light-emitting state can reduce the power consumption of the light-emitting device.

One embodiment of the present invention is a light-emitting device having a first region, a second region, and a third region. The first region is positioned between the second region and the third region. The first region has the highest flexibility of the first to third regions. The second region includes a light-emitting panel and a first support which overlap with each other. The third region includes the light-emitting panel and a second support which overlap with each other. Note that the light-emitting panel has higher flexibility than the first support and the second support.

The first region includes the light-emitting panel and a plurality of spacers. In the first region, the plurality of spacers each overlap with the light-emitting panel.

In the first region that has high flexibility, the light-emitting panel and a member (here, the spacers) are positioned so as to overlap with each other; thus, the first region can have high mechanical strength and high resistance to bending as compared with the case where the first region includes only the light-emitting panel.

However, when the light-emitting panel and the member are positioned so as to overlap with each other, a neutral plane (a plane which does not expand or contract) in which distortion of stress, such as compressive stress or tensile stress, due to deformation such as bending might be positioned apart from the light-emitting panel. As the neural plane is farther from the light-emitting panel, comparative stress or tensile stress due to bending is more applied to the light-emitting panel; thus, the light-emitting panel is likely to be broken.

In view of the above, the light-emitting device of one embodiment of the present invention has a structure in which, when the first region is bent, the angle between normals of facing planes of the two adjacent spacers changes according to the bending of the light-emitting panel. With such a structure, the neutral plane can be prevented from being apart from the light-emitting panel. The neutral plane is formed close to the light-emitting panel or in the light-emitting panel, whereby the light-emitting panel cannot easily expand or contract even when the light-emitting device is bent. Accordingly, the light-emitting panel can be prevented from being broken owing to the folding.

An example of a light-emitting device that has two regions having low flexibility and one region having high flexibility between the two regions and can be folded in two parts will be described below. In this embodiment, a region having high flexibility and a region having low flexibility or regions with low flexibility are parallel to each other; however, the regions are not necessarily arranged parallel to each other.

<Structure Example A>

Figure 1B:
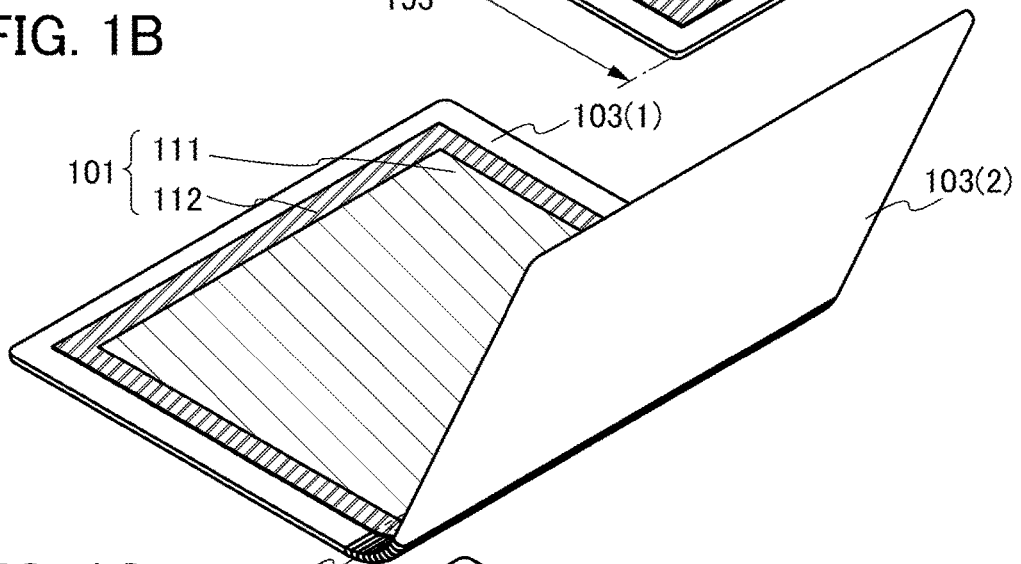
Figure 1C:
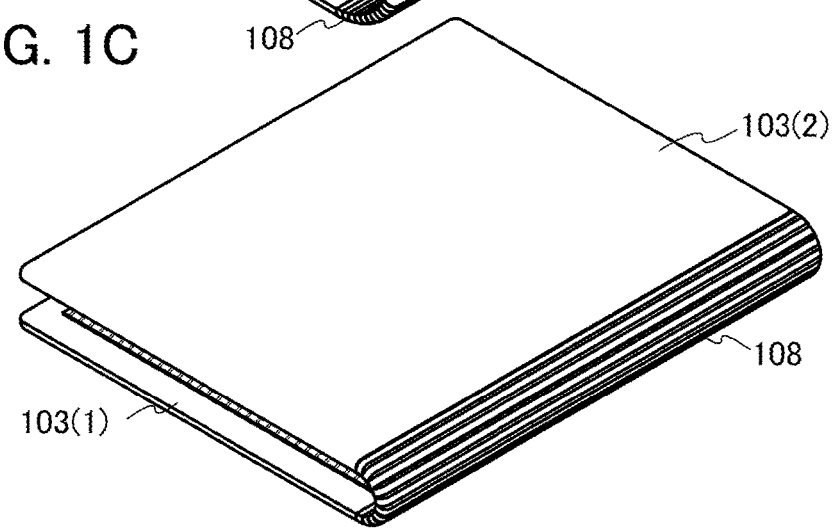

FIG. 1A illustrates a light-emitting device that is opened. FIG. 1B illustrates the light-emitting device that is being opened or being folded. FIG. 1C illustrates the light-emitting device that is folded.

The light-emitting device has a first region 151, a second region 152, and a third region 153. The first region 151 is positioned between the second region 152 and the third region 153. The first region 151 has the highest flexibility of the three regions.

The light-emitting device includes a light-emitting panel 101, a support 103(1), a support 103(2), and a plurality of spacers 108.

The light-emitting panel 101 has a light-emitting region 111 (also referred to as a light-emitting portion, a pixel portion, or a display portion) and a non-light-emitting region 112. The non-light-emitting region 112 is provided so as to surround the light-emitting region 111.

The light-emitting panel 101 is flexible. A light-emitting panel using organic EL elements is particularly preferable, in which case it can have high flexibility and impact resistance, and in addition, can be thinner and more lightweight.

The support 103(1) and the support 103(2) are apart from each other. The two supports each have lower flexibility than the light-emitting panel 101.

The first region 151 includes the light-emitting panel 101 and the plurality of spacers 108. The plurality of spacers 108 each overlap with the light-emitting panel 101. The plurality of spacers 108 are each fixed to the light-emitting panel 101. The adjacent spacers 108 are not fixed to each other. With such a structure, when the first region 151 is bent, the angle between normals of facing planes of the two adjacent spacers 108 changes according to the bending of the light-emitting panel 101. Accordingly, a neutral plane can be formed in the light-emitting panel 101 or in the vicinity of the light-emitting panel 101.

Some of the spacers 108 may be positioned in a region which does not overlap with the light-emitting panel 101. Alternatively, all the spacers 108 may overlap with the light-emitting panel 101.

In this embodiment, the spacers 108 are positioned on the side opposite to the light-emitting surface side of the light-emitting panel 101; however, one embodiment of the present invention is not limited thereto. For example, the spacers 108 may be positioned on the light-emitting surface side of the light-emitting panel 101. In the case where the spacers 108 are positioned on the light-emitting surface side of the light-emitting panel 101, the spacers 108 preferably overlap with only the non-light-emitting region 112. In the case where the spacers 108 overlap with the light-emitting region 111, a material which transmits visible light is preferably used for the spacers 108.

In the second region 152, the light-emitting panel 101 and the support 103(1) overlap with each other. The support 103(1) is positioned on the side opposite to the light-emitting surface side of the light-emitting panel 101. The light-emitting panel 101 and the support 103(1) may be fixed to each other.

In the third region 153, the light-emitting panel 101 and the support 103(2) overlap with each other. The support 103(2) is positioned on the side opposite to the light-emitting surface side of the light-emitting panel 101. The light-emitting panel 101 and the support 103(2) may be fixed to each other.

The supports are preferably provided only on the side opposite to the light-emitting surface side of the light-emitting panel 101 because the light-emitting device can be thin and lightweight.

<Structure Example B>

Figure 2A:
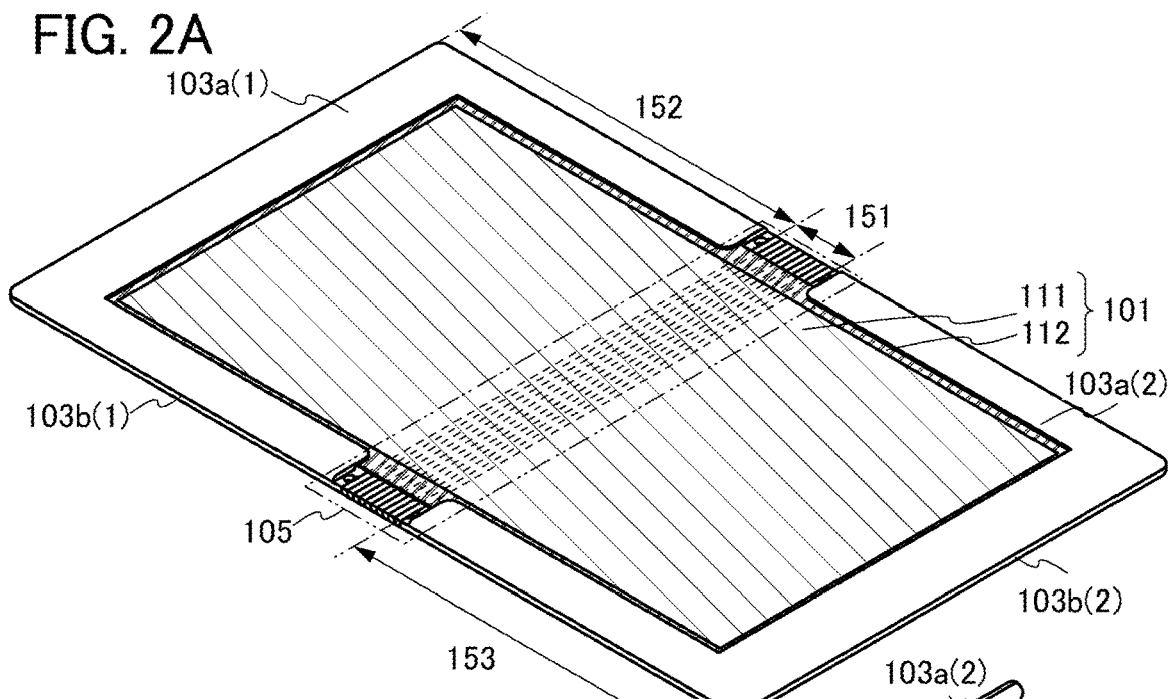
FIGS. 2A to 2C illustrate an example of a light-emitting device.
Figure 2B:
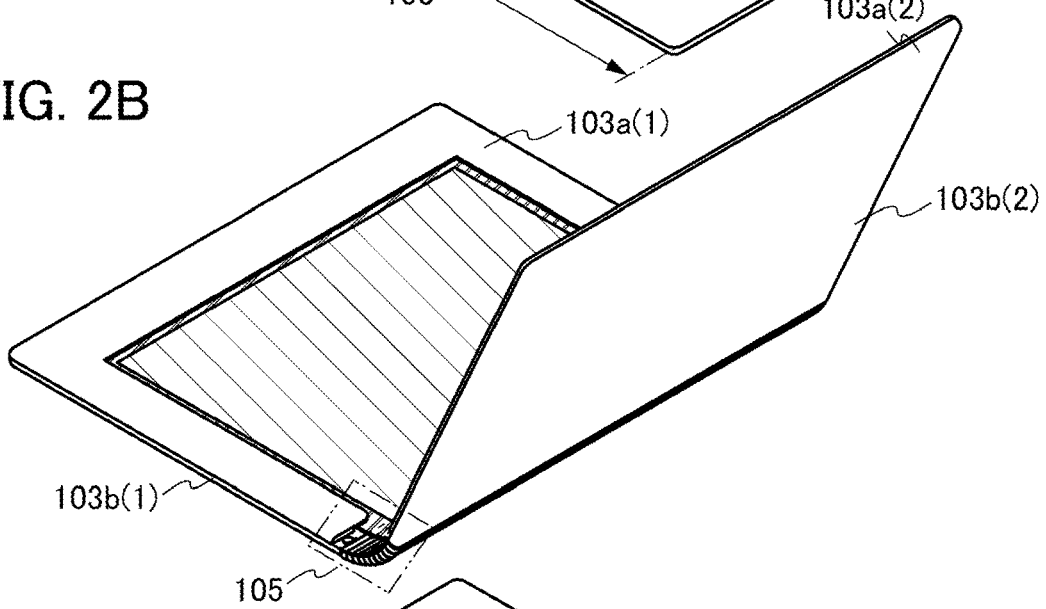
Figure 2C:
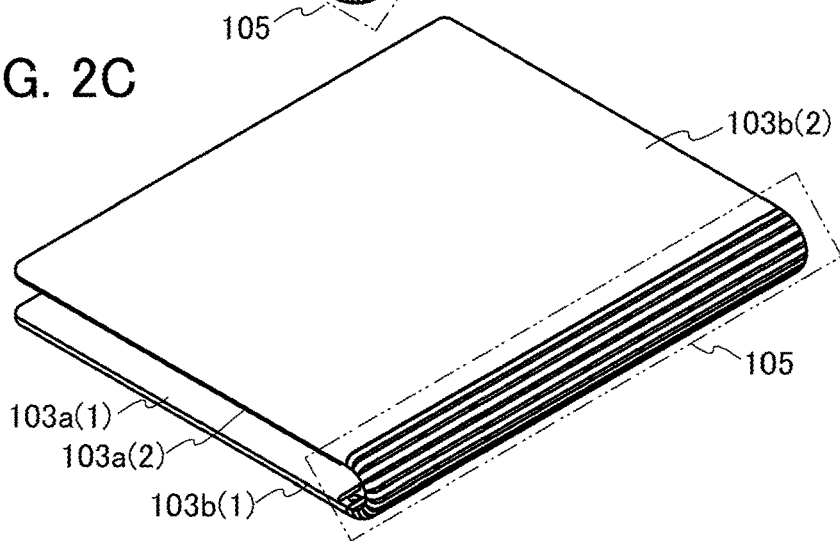

FIG. 2A illustrates a light-emitting device that is opened. FIG. 2B illustrates the light-emitting device that is being opened or being folded. FIG. 2C illustrates the light-emitting device that is folded. Note that in the following structure examples (including modification examples), description of structures similar to those described in any of the above structure examples is omitted in some cases.

The light-emitting device includes the light-emitting panel 101, a support 103a(1), a support 103a(2), a support 103b(1), a support 103b(2), and a connection portion 105.

The support 103a(1) and the support 103a(2) are apart from each other. The support 103b(1) and the support 103b(2) are apart from each other. The four supports each have lower flexibility than the light-emitting panel 101.

In the second region 152, the light-emitting panel 101 is provided between the support 103a(1) and the support 103b(1). The support 103a(1) is positioned on the light-emitting surface side of the light-emitting panel 101. The support 103b(1) is positioned on the side opposite to the light-emitting surface side of the light-emitting panel 101. The light-emitting panel 101 may be fixed to at least one of the support 103a(1) and the support 103b(1).

In the third region 153, the light-emitting panel 101 is provided between the support 103a(2) and the support 103b(2). The support 103a(2) is positioned on the light-emitting surface side of the light-emitting panel 101. The support 103b(2) is positioned on the side opposite to the light-emitting surface side of the light-emitting panel 101. The light-emitting panel 101 may be fixed to at least one of the support 103a(2) and the support 103b(2).

The supports are preferably provided on both the light-emitting surface side and the side opposite to the light-emitting surface side of the light-emitting panel 101 because the light-emitting panel 101 can be sandwiched between the pair of supports and thus the mechanical strength of a region having low flexibility can be increased. As a result, the light-emitting device can be less likely to be broken.

The first region 151 includes the light-emitting panel 101 and the connection portion 105. The light-emitting panel 101 and the connection portion 105 overlap with each other.

Figure 3A:
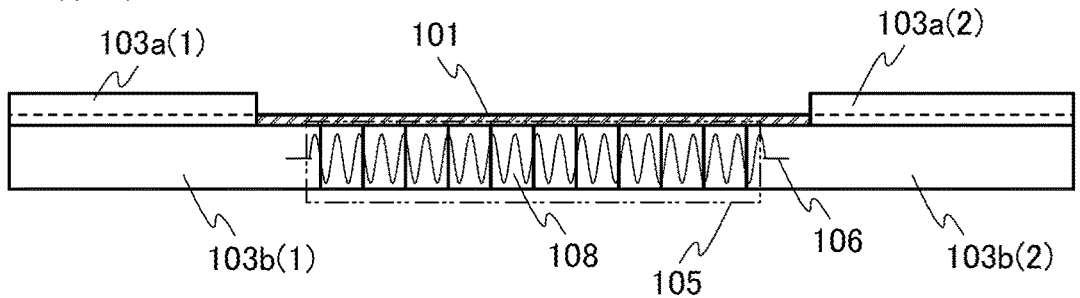
FIGS. 3A to 3C illustrate an example of a light-emitting device.
Figure 3B:
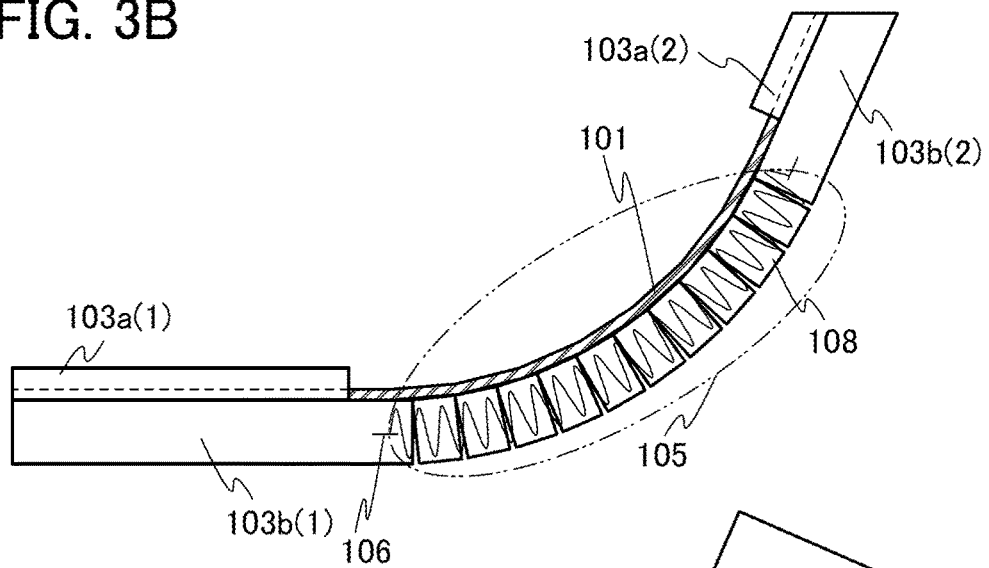
Figure 3C:
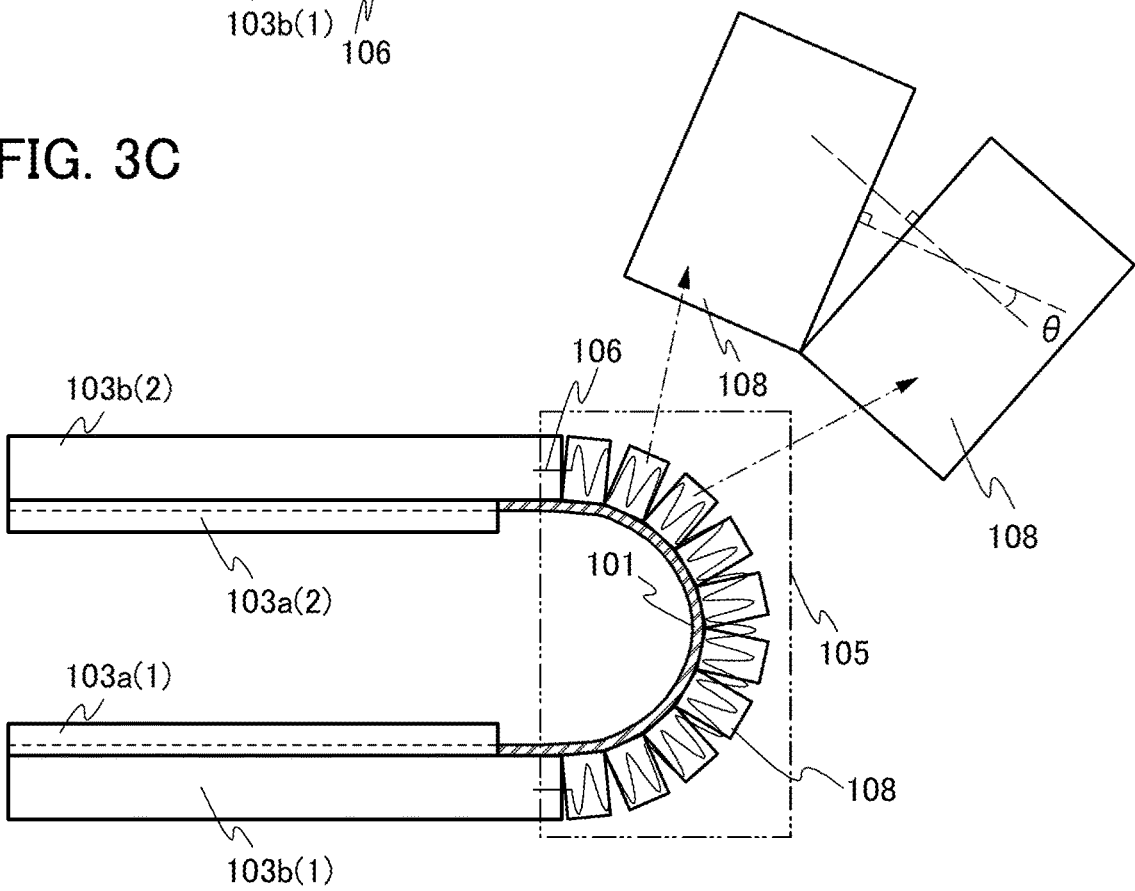
Figure 4A:
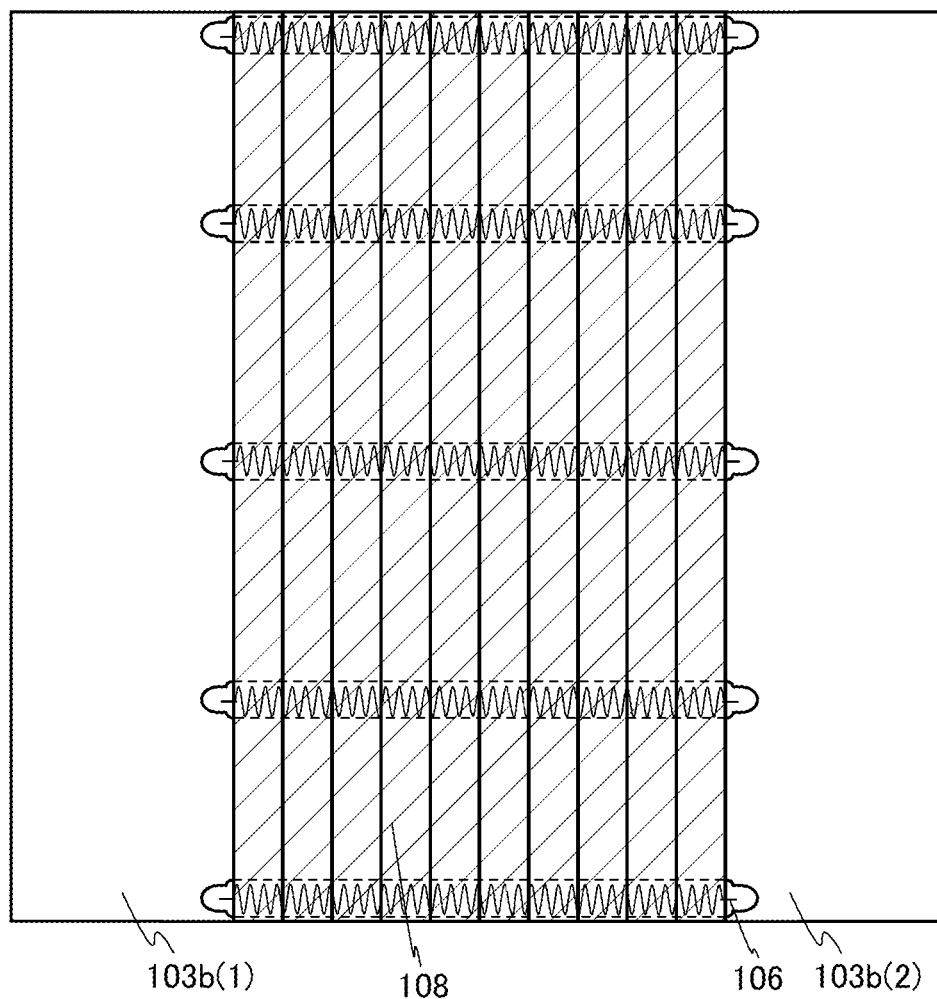
FIGS. 4A and 4B illustrate examples of a connection portion and a spacer.
Figure 4B:
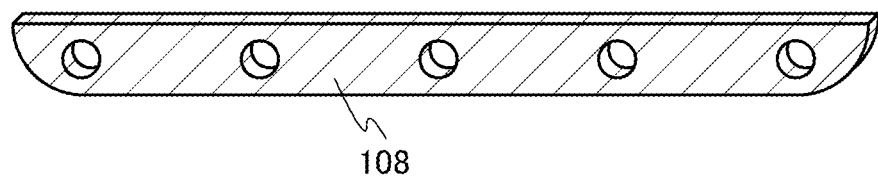
Figure 5:
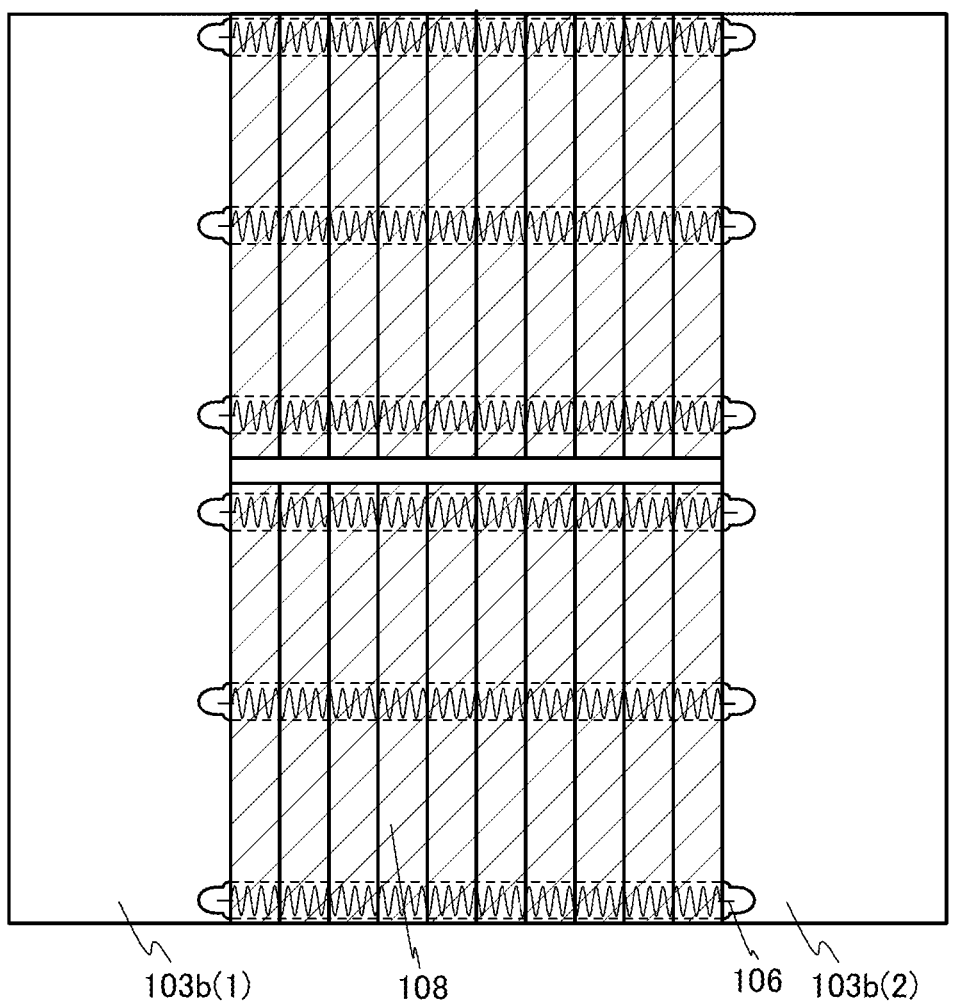
FIG. 5 illustrates an example of a connection portion.

FIGS. 3A to 3C are side views of the connection portion 105 in the states shown in FIGS. 2A to 2C, respectively. FIG. 4A and FIG. 5 are each an example of a top view of the connection portion 105. FIG. 4B is a perspective view of the spacer 108.

The connection portion 105 includes an elastic body 106 and the plurality of spacers 108.

In FIGS. 3A to 3C, FIG. 4A, and FIG. 5, the elastic body 106 is shown with a thin solid line; however, in an actual structure, the elastic body 106 is not exposed on the outside of the spacers 108 but positioned in openings provided in the spacers 108.

One end portion of the elastic body 106 is fixed to the support 103b(1), and the other end portion of the elastic body 106 is fixed to the support 103b(2). That is, the elastic body 106 connects the support 103b(1) and the support 103b(2).

The openings are provided in the spacers 108. The spacers 108 are connected to each other through the elastic body 106. Specifically, the elastic body 106 connects the plurality of spacers 108 through the openings. There is no particular limitation on the number of the openings in the spacers 108.

There is no particular limitation on the number of the spacers 108.

The number of the spacers 108 in the light-emitting device may be one. In the case where one spacer 108 is provided in the light-emitting device, the angle between normals of facing planes of the spacer 108 and the support needs to change according to the bending of the light-emitting panel. With such a structure, the neutral plane can be prevented from being apart from the light-emitting panel.

The number of the spacers 108 in the light-emitting device is preferably two or more.

In the example of FIG. 4A, 10 spacers 108 are arranged in one direction. In the example of FIG. 5, there are two lines in each of which 10 spacers 108 are arranged in one direction, and the connection portion 105 includes 20 spacers 108 in total.

The number of the spacers 108 arranged in one line is preferably larger because the light-emitting device can be bent more smoothly. Furthermore, the width (the length in the short-side direction) of each of the spacers 108 is preferably narrower because the light-emitting device can be bent more smoothly. The light-emitting device can have high resistance to bending when a large number of spacers 108 each having a small width are arranged.

In the structure of FIG. 5, the spacers 108 are arranged in two lines, and there is a space between the two lines. On the other hand, in the structure of FIG. 4A, the spacers 108 are arranged in one line, and thus there is no space. Therefore, a bent portion of the light-emitting panel is less likely to be exposed when the light-emitting device is folded; thus, the light-emitting panel can be prevented from being damaged and elements in the light-emitting panel can be prevented from being broken.

The plurality of spacers 108 each overlap with the light-emitting panel 101. The plurality of spacers 108 are connected to each other through the elastic body 106 in the openings, but are not fixed to each other. With such a structure, when the first region 151 is bent, the angle between normals of facing planes of the two adjacent spacers 108 changes according to the bending of the light-emitting panel 101. Accordingly, a neutral plane can be formed in the light-emitting panel 101 or in the vicinity of the light-emitting panel 101.

An enlarged view of two adjacent spacers 108 is shown in the upper right portion of FIG. 3C. In FIG. 3C, an angle θ between the normals of the facing planes of the two adjacent spacers 108 is an acute angle. As the light-emitting device is opened from the state of FIG. 3C, the angle θ becomes smaller. When the angle θ becomes 0° in the state of FIG. 3A, that is, when the facing planes of the two adjacent spacers 108 are in contact with each other, the light-emitting device cannot be further bent. That is, the first region 151 in this case can be regarded as a portion that cannot be outwardly bent.

In this example, the spacers 108 are positioned on the side opposite to the light-emitting surface side of the light-emitting panel 101 and the first region 151 can be inwardly bent but cannot be outwardly bent; however, one embodiment of the present invention is not limited thereto. In the case where the spacers 108 are positioned on the light-emitting surface side of the light-emitting panel 101, the first region 151 can be outwardly bent but cannot be inwardly bent.

It is possible to bend the light-emitting device illustrated in FIG. 3C with a radius of curvature smaller than that shown in FIG. 3C. However, there is a possibility that the light-emitting panel 101 is broken when the light-emitting panel 101 is bent with too small a radius of curvature. In order to prevent that, the support 103b(1) and the support 103b(2) are preferably kept at a certain distance from each other by adjusting the thicknesses of the support 103a(1) and the support 103a(2) or providing a fixing unit for fixing the two supports to each other, for example. In this case, the light-emitting panel 101 can be prevented from being bent with too small a radius of curvature.

The range in which the light-emitting device can be bent at the first region 151 can be controlled by adjusting the shapes or the number of the spacers 108.

For example, there is no particular limitation on the cross-sectional shape of the spacer 108 along the direction perpendicular to the longitudinal direction, and it may be a circle or a polygon (including a polygon with rounded corners) such as a triangle, a quadrangle, a pentagon, or a hexagon.

For example, as described in this Structure Example B, as the cross-sectional shape of the spacer 108 along the direction perpendicular to the longitudinal direction, a shape in which two facing side surfaces of the spacer 108 (two surfaces facing the respective adjacent spacers 108) are parallel to each other, such as a square, a rectangle, or a parallelogram, can be used. In this case, a region having high flexibility can be either inwardly or outwardly bent.

Alternatively, for example, as described below in Structure Example D, the cross-sectional shape of the spacer 108 along the direction perpendicular to the longitudinal direction can be a shape in which two facing side surfaces of the spacer 108 are not parallel to each other, such as a trapezoid. In this case, a region having high flexibility can be inwardly and outwardly bent.

The plurality of spacers 108 are each preferably fixed to the light-emitting panel 101 because the spacers 108 can be prevented from being moved in the longitudinal direction of the spacers 108.

For the elastic body 106, a spring or rubber can be used, for example. In the light-emitting device that is opened, the length of the elastic body 106 is preferably a natural length or longer. In this case, the light-emitting device can be easily kept opened. On the other hand, in order to easily keep the light-emitting device folded, the length of the elastic body 106 is made shorter than the natural length when the light-emitting device is opened.

<Modification Example 1>

Figure 6A:
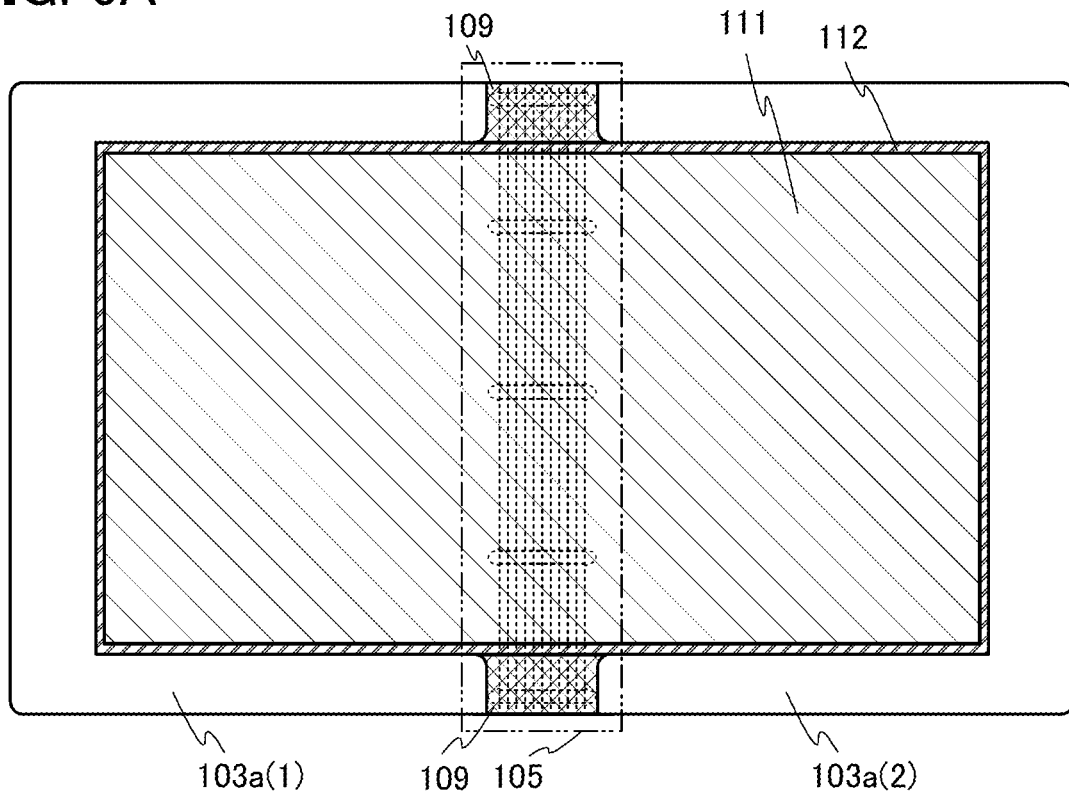
FIGS. 6A and 6B each illustrate an example of a light-emitting device.
Figure 6B:
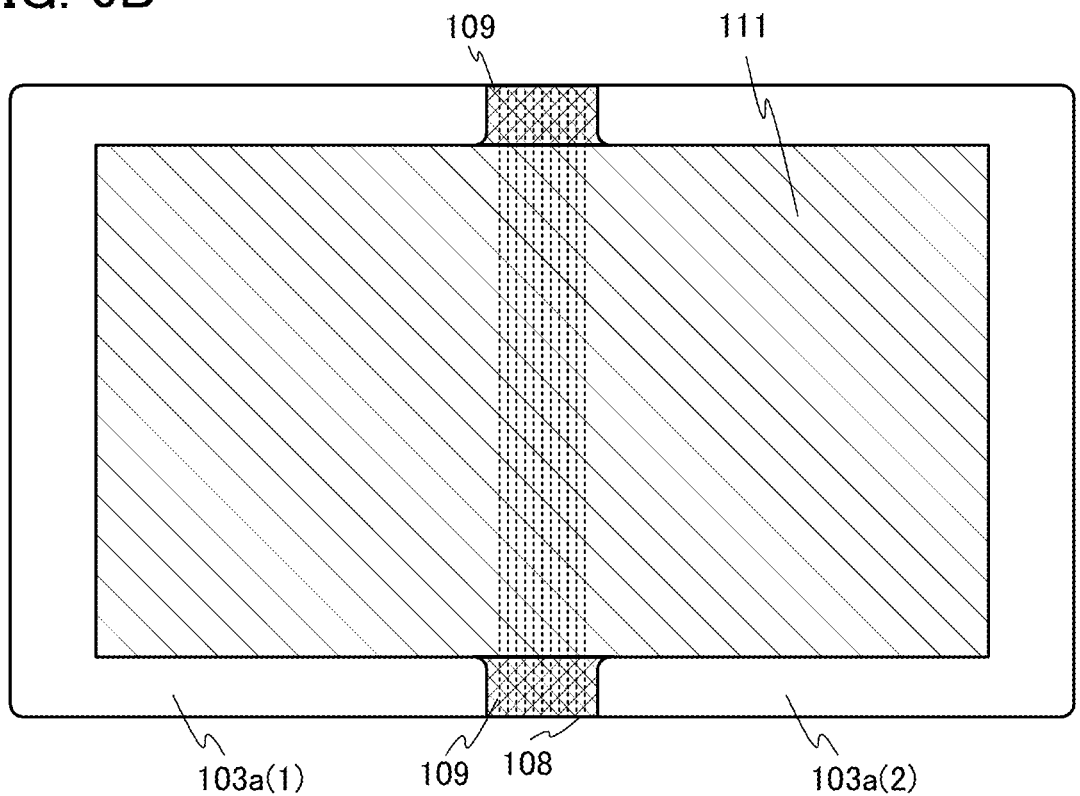

FIGS. 6A and 6B are each a top view of a light-emitting device that is opened.

In the case of the light-emitting device illustrated in FIG. 6A, both the light-emitting region 111 and the non-light-emitting region 112 are seen by a user viewing a light-emitting surface of the light-emitting device.

In the case of the light-emitting device illustrated in FIG. 6B, the non-light-emitting region 112 is not seen and only the light-emitting region 111 is seen by a user viewing a light-emitting surface of the light-emitting device.

The light-emitting device illustrated in FIG. 6A is a modification example of Structure Example B, but may be applied to Structure Example A. Similarly, the light-emitting device illustrated in FIG. 6B is a modification example of Structure Example A, but may be applied to Structure Example B.

In the light-emitting devices illustrated in FIGS. 6A and 6B, a light-blocking layer 109 is provided. The light-blocking layer 109 overlaps with the connection portion 105 or the spacers 108. Since the light-blocking layer 109 is positioned so as to overlap with the connection portion 105 or the spacers 108, the connection portion 105 or the spacers 108 can be prevented from being seen by a user viewing the light-emitting surface of the light-emitting device.

The light-blocking layer 109 may overlap with the non-light-emitting region 112 of the light-emitting panel. When the light-blocking layer 109 is positioned so as to overlap with the non-light-emitting region 112, the non-light-emitting region 112 can be prevented from being irradiated with external light. Accordingly, photodegradation of a transistor and the like of a driver circuit that is included in the non-light-emitting region 112 can be prevented.

For the light-blocking layer 109, a flexible material that can block light is used. For example, resin, plastic, metal, alloy, rubber, paper, or the like can be used. A film or a tape formed using any of them may be used. Note that a bonding layer may be provided between the light-blocking layer 109 and the connection portion 105.

<Modification Example 2>

Figure 7A:
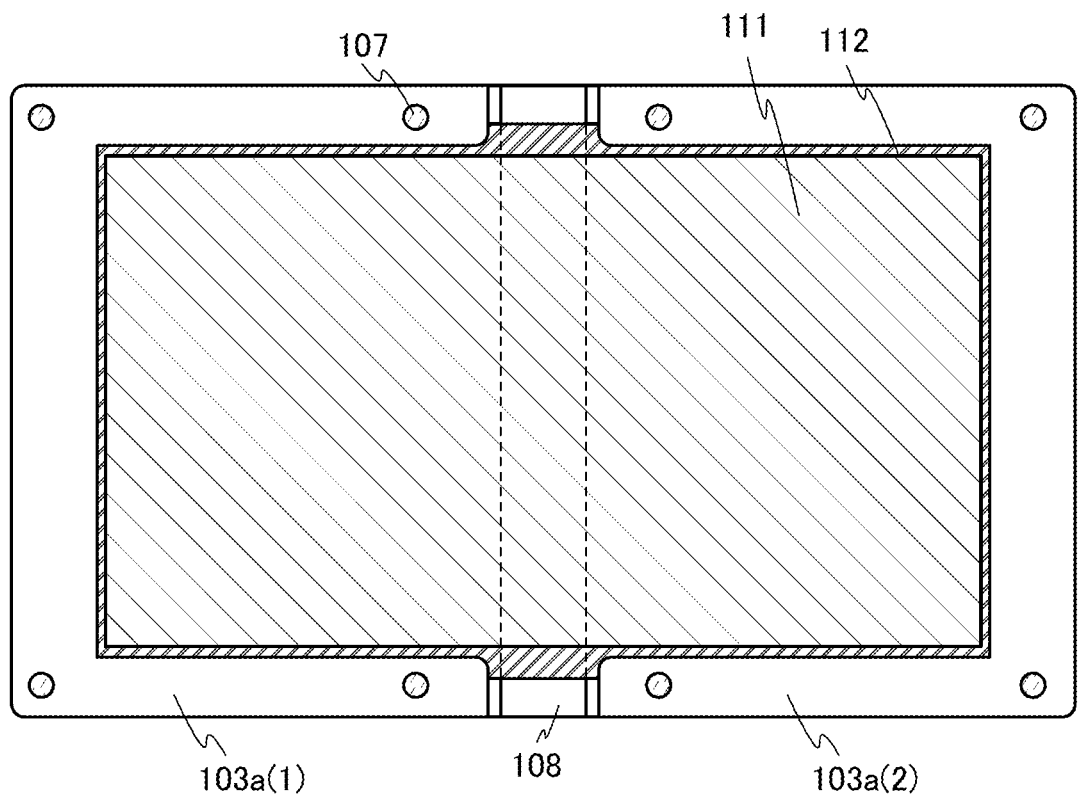
FIGS. 7A to 7C illustrate examples of a light-emitting device.
Figure 7B:
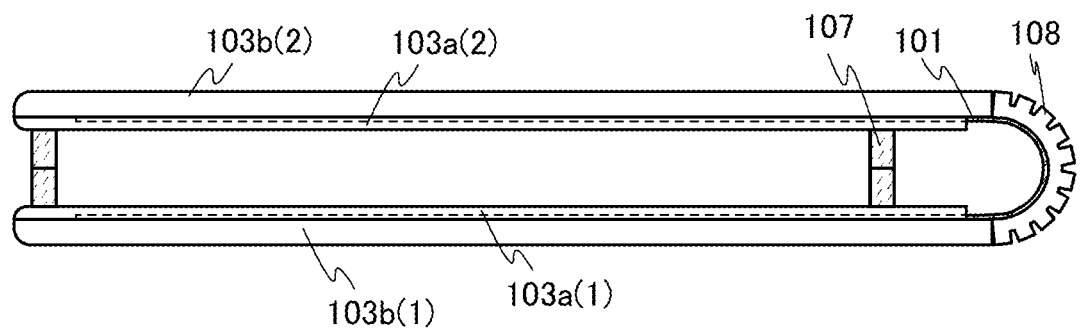

FIG. 7A is a top view of a light-emitting device that is opened. FIG. 7B is a side view of the light-emitting device that is folded.

The light-emitting device illustrated in FIGS. 7A and 7B includes one spacer 108. In the spacer 108, a plurality of cuts are provided. A plurality of projections separated by the cuts function like the plurality of spacers described in the above structure examples. That is, when the first region 151 is bent, the angle between normals of facing planes of the two adjacent projections changes according to the bending of the light-emitting panel 101. Accordingly, a neutral plane can be formed in the light-emitting panel 101 or in the vicinity of the light-emitting panel 101. The cuts are preferably formed deeply because a neutral plane can be easily formed in the light-emitting panel 101 or in the vicinity of the light-emitting panel 101. Note that two or more spacers 108 each having a cut may be provided.

The light-emitting device illustrated in FIGS. 7A and 7B includes a fixing unit 107. With the fixing unit 107, the light-emitting panel 101 can be prevented from being bent with too small a radius of curvature when the light-emitting device is folded, and thus the light-emitting device can be prevented from being broken. As the fixing unit 107, a magnet-type or mechanical-type fixing unit can be used. The fixing unit 107 can keep the light-emitting device folded.

<Modification Example 3>

Figure 7C:
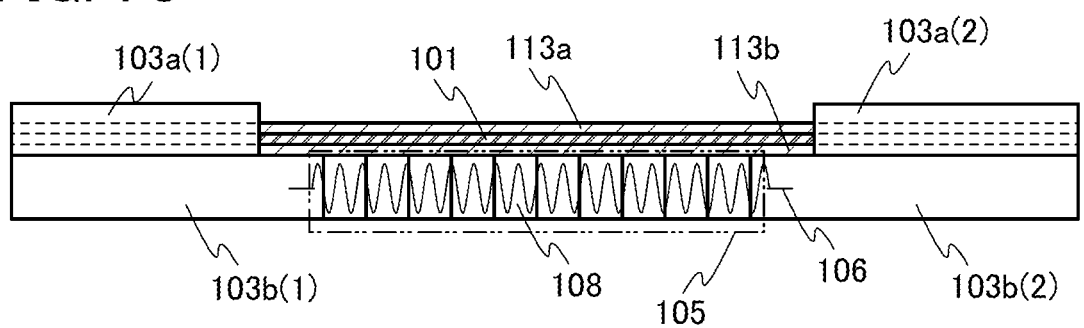

FIG. 7C is a side view of a light-emitting device that is opened. The light-emitting device illustrated in FIG. 7C is a modification example of the light-emitting device illustrated in FIGS. 3A to 3C.

A protective layer 113a may be provided on a light-emitting surface of the light-emitting panel 101. In the case where the protective layer 113a transmits visible light, the protective layer 113a can be positioned so as to overlap with the light-emitting region 111. In the case where the protective layer 113a does not transmit visible light, the protective layer 113a has an opening in a portion overlapping with the light-emitting region 111. The protective layer 113a may also serve as the light-blocking layer 109.

A protective layer 113b may be provided between the light-emitting panel 101 and the connection portion 105. The protective layer 113b is fixed to the connection portion 105. For example, the plurality of spacers 108 are each fixed to the protective layer 113b, in which case the spacers 108 can be prevented from being moved in the longitudinal direction of the spacers 108.

The protective layer 113b is also preferably fixed to the light-emitting panel 101. In particular, in a region where the light-emitting panel 101, the protective layer 113b, and the connection portion 105 overlap with one another, the protective layer 113b is preferably fixed to the light-emitting panel 101. In that case, the mechanical strength of the first region 151 with high flexibility can be further increased.

The protective layer 113b is preferably thinner because a neutral plane is less likely to be apart from the light-emitting panel 101 and the light-emitting panel 101 can be prevented from being broken. The protective layer 113b is positioned on the side opposite to the light-emitting surface side of the light-emitting panel 101, and thus the protective layer 113b does not necessarily transmit visible light. The protective layer 113b is preferably thicker because the mechanical strength of the light-emitting device can be increased and thus the light-emitting panel 101 can be effectively protected. The thickness of the protective layer 113b can be, for example, 0.01 to 10 times, preferably 0.05 to 5 times, more preferably 0.05 to 3 times as large as the thickness of the light-emitting panel 101.

The protective layer 113b can be positioned so as to overlap with both the light-emitting region 111 and the non-light-emitting region 112. A region where the protective layer 113b and the light-emitting panel 101 overlap with each other preferably has a larger area because the light-emitting panel 101 can be more effectively protected and the reliability of the light-emitting device can be improved. For example, the protective layer 113b is positioned so as to overlap with at least one of (preferably, each of) the support 103a(1), the support 103a(2), the support 103b(1), and the support 103b(2).

The protective layers preferably have higher flexibility than the supports. Furthermore, the protective layers are preferably thinner than the supports.

When at least one of the protective layer 113a and the protective layer 113b is provided, a region with high flexibility can also have high mechanical strength; thus, the light-emitting device can be less likely to be broken. This structure makes the light-emitting device less likely to be broken by deformation due to external force or the like in the region with high flexibility as well as a region with low flexibility.

In the case where one of the protective layer 113a and the protective layer 113b is provided, the light-emitting device can be thinner and more lightweight.

In the case where both the protective layer 113a and the protective layer 113b are provided, the light-emitting panel can be sandwiched between the pair of protective layers and thus the mechanical strength of the light-emitting device can be increased; as a result, the light-emitting device can be less likely to be broken.

<Examples of Materials for Light-Emitting Device>

There is no particular limitation on materials for the spacer, the protective layer, and the support; they can each be formed using plastic, metal, alloy, rubber, or the like, for example. Plastic, rubber, or the like is preferably used because it can form a spacer, a protective layer, or a housing that is lightweight and less likely to be broken. For example, silicone rubber may be used for the protective layer and stainless steel or aluminum may be used for the spacer and the support.

The spacer, the protective layer, and the support are each preferably formed using a material with high toughness. In that case, a light-emitting device with high impact resistance that is less likely to be broken can be provided. For example, when an organic resin, a thin metal material, or a thin alloy material is used for the spacer, the protective layer, and the support, the light-emitting device can be lightweight and less likely to be broken. For a similar reason, also a substrate of the light-emitting panel is preferably formed using a material with high toughness.

The spacer, the protective layer, and the support on the light-emitting surface side do not necessarily have a light-transmitting property if they do not overlap with the light-emitting region of the light-emitting panel. When the spacer, the protective layer, and the support on the light-emitting surface side overlap with at least part of the light-emitting region, they are preferably formed using a material that transmits light emitted from the light-emitting panel. There is no limitation on the light-transmitting property of the spacer, the protective layer, and the support on the side opposite to the light-emitting surface side.

When any two of the spacer, the protective layer, the support, and the light-emitting panel are bonded to each other, any of a variety of adhesives can be used, and for example, a curable resin that is curable at room temperature (e.g., a two-component-mixture-type resin), a light curable resin, a heat curable resin, or the like can be used. Alternatively, a sheet-like adhesive may be used. Alternatively, components of the light-emitting device may be fixed with, for example, a screw that penetrates two or more of the spacer, the protective layer, the support, and the light-emitting panel or a pin or clip that holds them.

The light-emitting device of one embodiment of the present invention can be used with one light-emitting panel (one light-emitting region) divided into two or more regions at a folded portion(s). For example, it is possible to put the region that is hidden by folding the light-emitting device in a non-light-emitting state and put only the exposed region in a light-emitting state. Thus, power consumed by a region that is not used by a user can be reduced.

The light-emitting device of one embodiment of the present invention may include a sensor for determining whether each region with high flexibility is bent or not. The sensor can be composed of, for example, a switch such as a magnetic switch or a pressure sensor such as a MEMS pressure sensor.

A light-emitting device that includes two regions with high flexibility and three regions with low flexibility and can be folded in three parts is described below as an example. In this embodiment, an example in which one of the two regions with high flexibility is bent inwardly and the other is bent outwardly is described; however, one embodiment of the present invention is not limited thereto. That is, when a light-emitting device having a plurality of regions with high flexibility is folded, a light-emitting panel is not necessarily bent inwardly and outwardly alternately. All the plurality of regions with high flexibility may be bent either inwardly or outwardly. Furthermore, the plurality of regions with high flexibility may be bent inwardly plural times and outwardly plural times.

<Structure Example C>

Figure 8A:
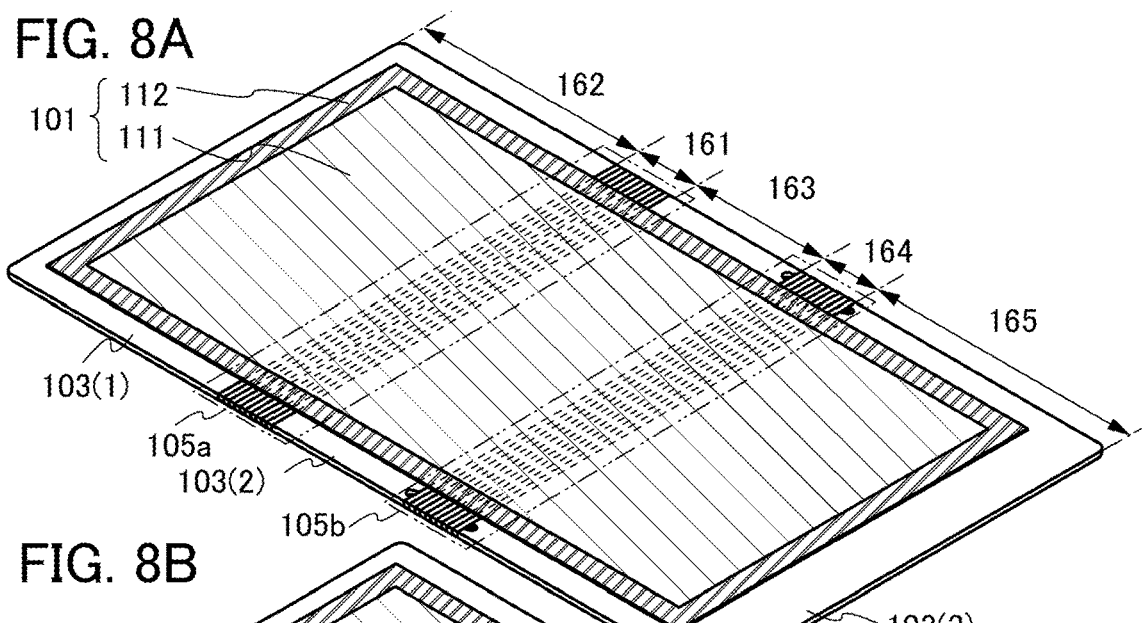
FIGS. 8A to 8C illustrate an example of a light-emitting device.
Figure 8B:
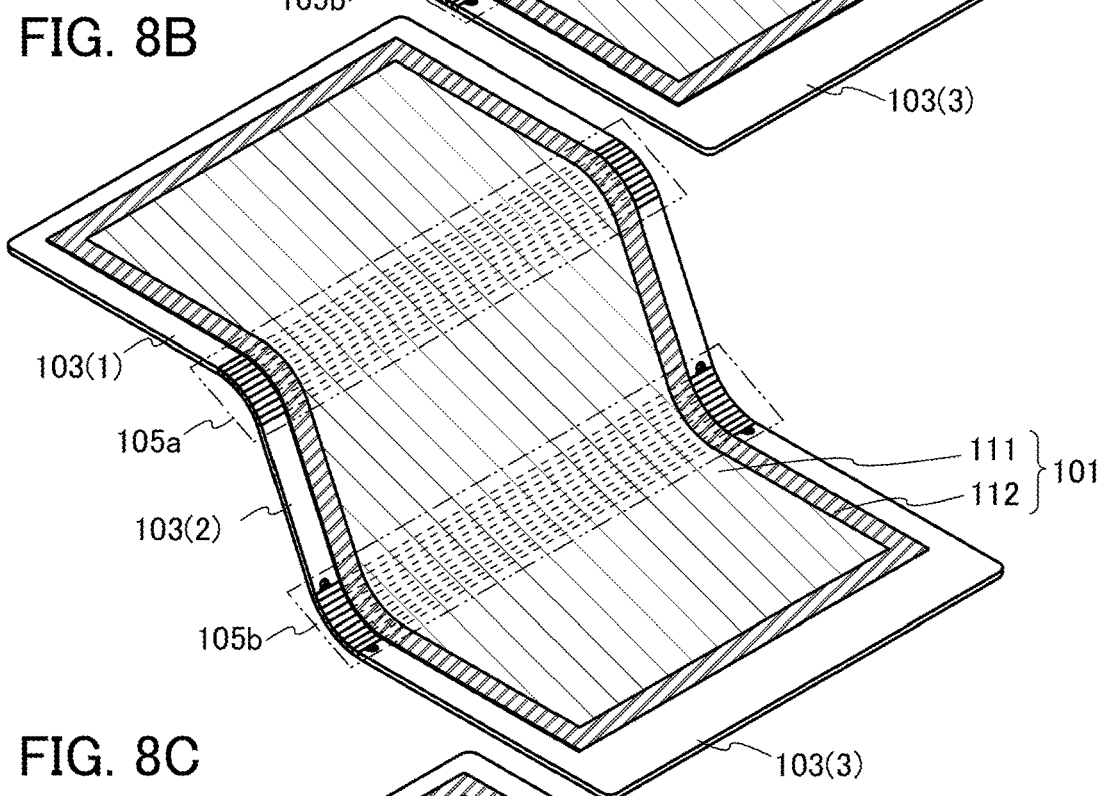
Figure 8C:
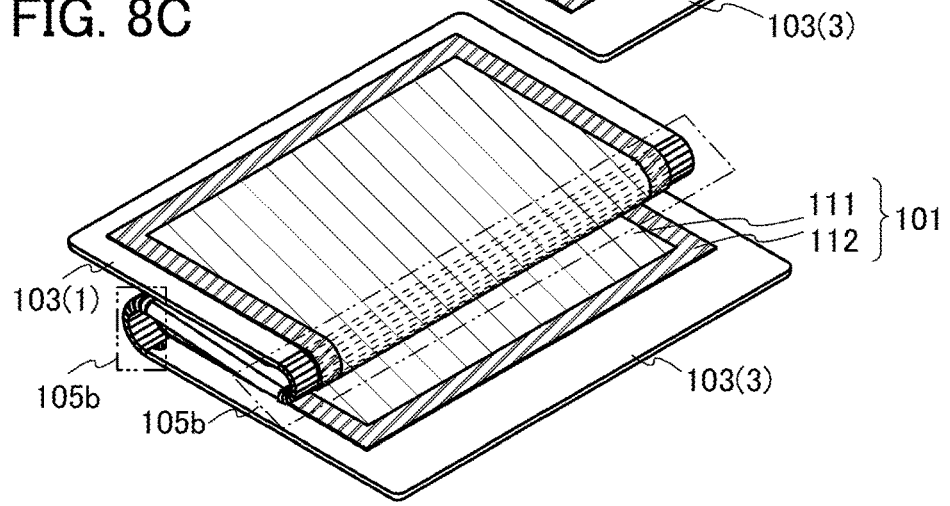

FIG. 8A illustrates a light-emitting device that is opened. FIG. 8B illustrates the light-emitting device that is being opened or being folded. FIG. 8C illustrates the light-emitting device that is folded.

The light-emitting device has a first region 161, a second region 162, a third region 163, a fourth region 164, and a fifth region 165. The first region 161 is positioned between the second region 162 and the third region 163. The first region 161 has the highest flexibility of the first to third regions. The fourth region 164 is positioned between the third region 163 and the fifth region 165. The fourth region 164 has the highest flexibility of the third to fifth regions.

The light-emitting device includes the light-emitting panel 101, the support 103(1), the support 103(2), a support 103(3), a connection portion 105a, and a connection portion 105b.

The light-emitting panel 101 has the light-emitting region 111 and the non-light-emitting region 112. The non-light-emitting region 112 is provided so as to surround the light-emitting region 111.

The support 103(1) and the support 103(2) are apart from each other. The support 103(2) and the support 103(3) are apart from each other. The three supports each have lower flexibility than the light-emitting panel 101.

The first region 161 includes the light-emitting panel 101 and the connection portion 105a. The light-emitting panel 101 and the connection portion 105a overlap with each other.

The fourth region 164 includes the light-emitting panel 101 and the connection portion 105b. The light-emitting panel 101 and the connection portion 105b overlap with each other.

The first region 161 is a portion at which the light-emitting panel 101 can be bent outwardly. The details of the connection portion 105a will be described later in Structure Example D.

The fourth region 164 is a portion at which the light-emitting panel 101 can be bent inwardly. For the details of the connection portion 105b, the description of the connection portion 105 in Structure Example B can be referred to.

In the second region 162, the light-emitting panel 101 and the support 103(1) overlap with each other. The support 103(1) is positioned on the side opposite to the light-emitting surface side of the light-emitting panel 101. The light-emitting panel 101 and the support 103(1) may be fixed to each other.

In the third region 163, the light-emitting panel 101 and the support 103(2) overlap with each other. The support 103(2) is positioned on the side opposite to the light-emitting surface side of the light-emitting panel 101. The light-emitting panel 101 and the support 103(2) may be fixed to each other.

In the fifth region 165, the light-emitting panel 101 and the support 103(3) overlap with each other. The support 103(3) is positioned on the side opposite to the light-emitting surface side of the light-emitting panel 101. The light-emitting panel 101 and the support 103(3) may be fixed to each other.

The supports are preferably provided only on the side opposite to the light-emitting surface side of the light-emitting panel 101 because the light-emitting device can be thin and lightweight.

<Structure Example D>

Figure 9A:
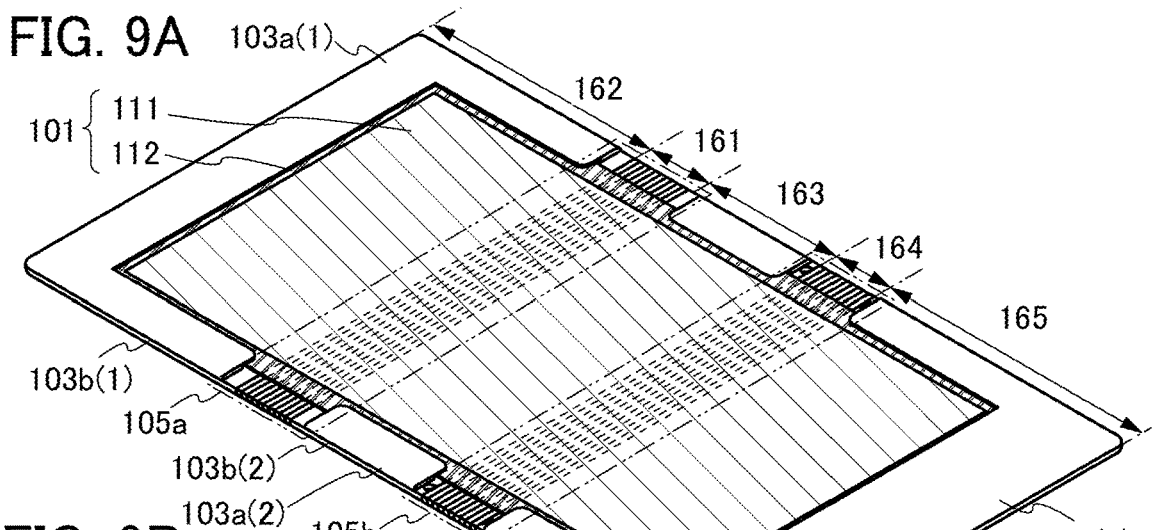
FIGS. 9A to 9C illustrate an example of a light-emitting device.
Figure 9B:
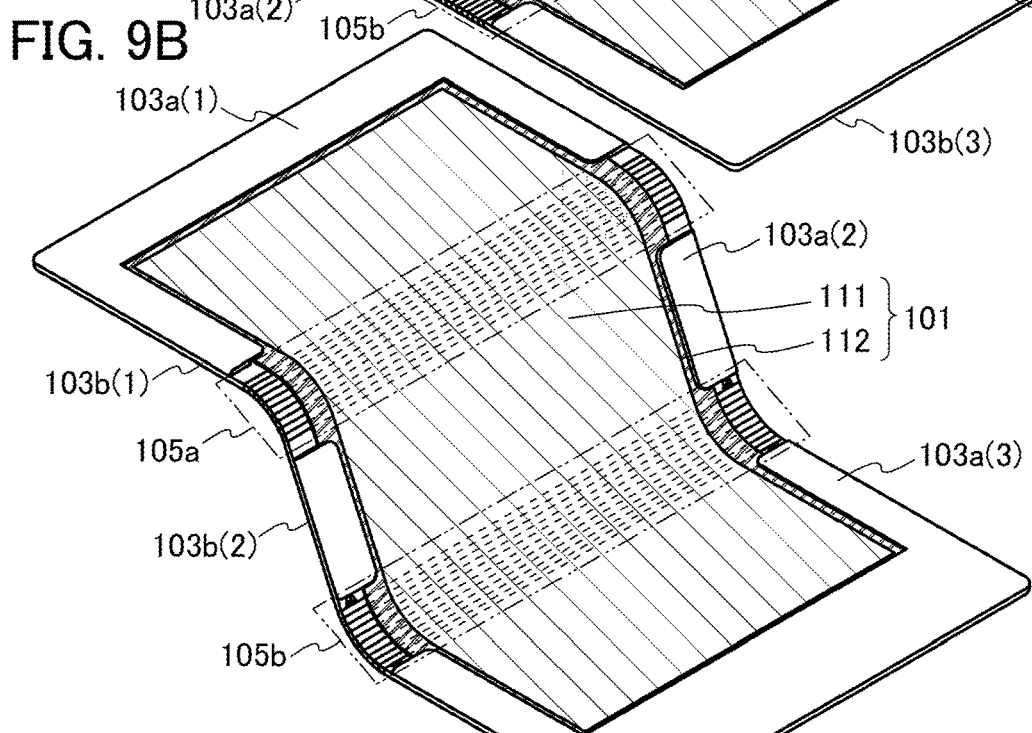
Figure 9C:
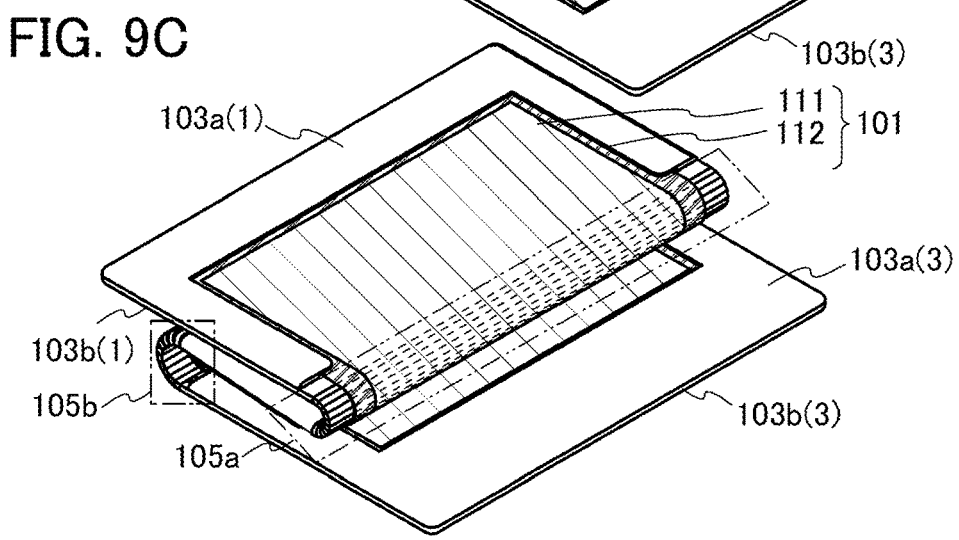

FIG. 9A illustrates a light-emitting device that is opened. FIG. 9B illustrates the light-emitting device that is being opened or being folded. FIG. 9C illustrates the light-emitting device that is folded.

The light-emitting device includes the light-emitting panel 101, the support 103a(1), the support 103a(2), a support 103a(3), the support 103b(1), the support 103b(2), a support 103b(3), the connection portion 105a, and the connection portion 105b.

The support 103a(1) and the support 103a(2) are apart from each other. The support 103a(2) and the support 103a(3) are apart from each other. The support 103b(1) and the support 103b(2) are apart from each other. The support 103b(2) and the support 103b(3) are apart from each other. The six supports each have lower flexibility than the light-emitting panel 101.

The first region 161 includes the light-emitting panel 101 and the connection portion 105a. The light-emitting panel 101 and the connection portion 105a overlap with each other.

The fourth region 164 includes the light-emitting panel 101 and the connection portion 105b. The light-emitting panel 101 and the connection portion 105b overlap with each other.

In the second region 162, the light-emitting panel 101 is provided between the support 103a(1) and the support 103b(1). The support 103a(1) is positioned on the light-emitting surface side of the light-emitting panel 101. The support 103b(1) is positioned on the side opposite to the light-emitting surface side of the light-emitting panel 101. The light-emitting panel 101 may be fixed to at least one of the support 103a(1) and the support 103b(1).

In the third region 163, the light-emitting panel 101 is provided between the support 103a(2) and the support 103b(2). The support 103a(2) is positioned on the light-emitting surface side of the light-emitting panel 101. The support 103b(2) is positioned on the side opposite to the light-emitting surface side of the light-emitting panel 101. The light-emitting panel 101 may be fixed to at least one of the support 103a(2) and the support 103b(2).

In the fifth region 165, the light-emitting panel 101 is provided between the support 103a(3) and the support 103b(3). The support 103a(3) is positioned on the light-emitting surface side of the light-emitting panel 101. The support 103b(3) is positioned on the side opposite to the light-emitting surface side of the light-emitting panel 101. The light-emitting panel 101 may be fixed to at least one of the support 103a(3) and the support 103b(3).

The supports are preferably provided on both the light-emitting surface side and the side opposite to the light-emitting surface side of the light-emitting panel 101 because the light-emitting panel 101 can be sandwiched between the pair of supports and thus the mechanical strength of a region having low flexibility can be increased. As a result, the light-emitting device can be less likely to be broken.

Figure 10A:
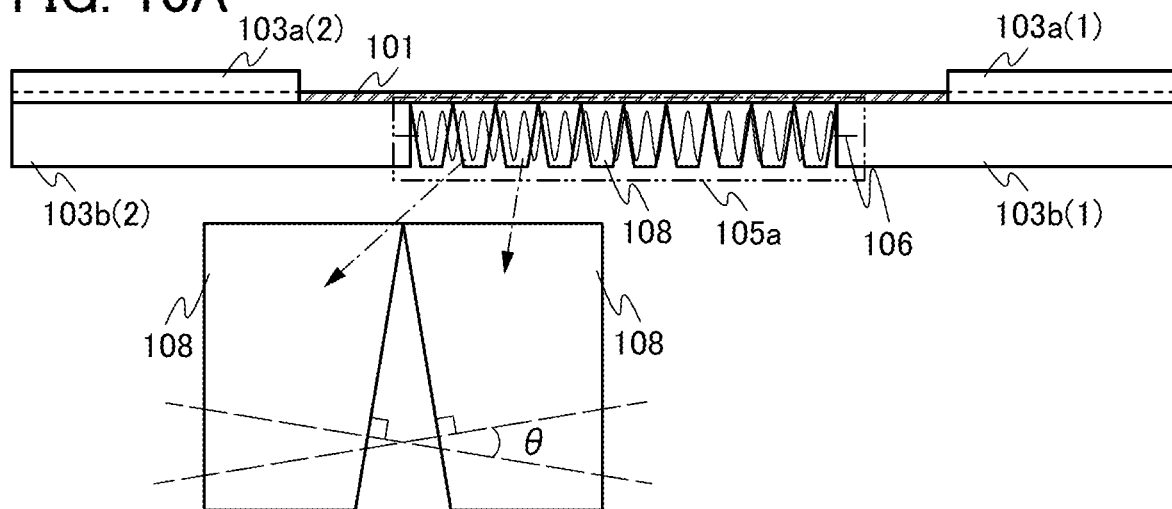
FIGS. 10A to 10C illustrate an example of a light-emitting device.
Figure 10B:
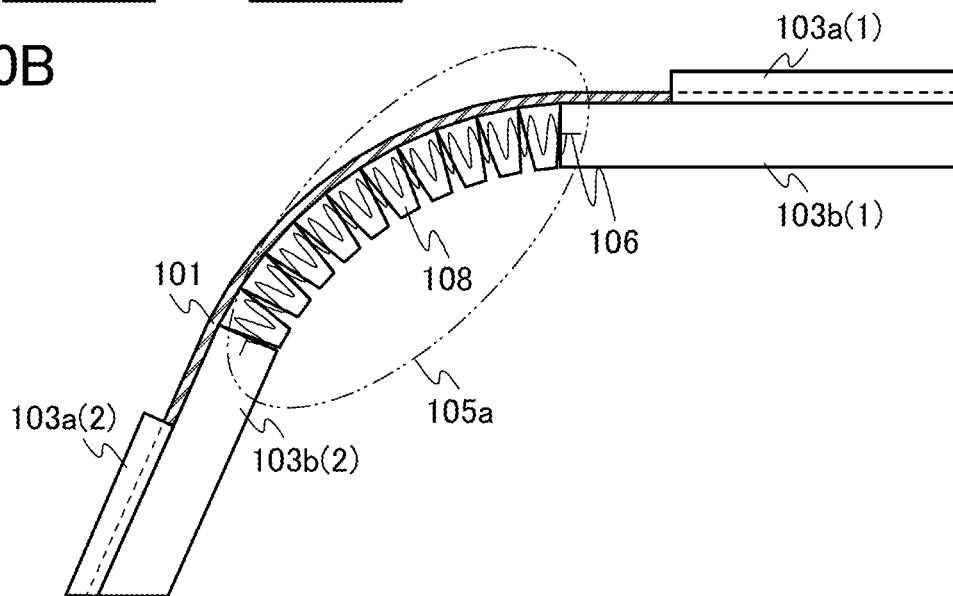
Figure 10C:
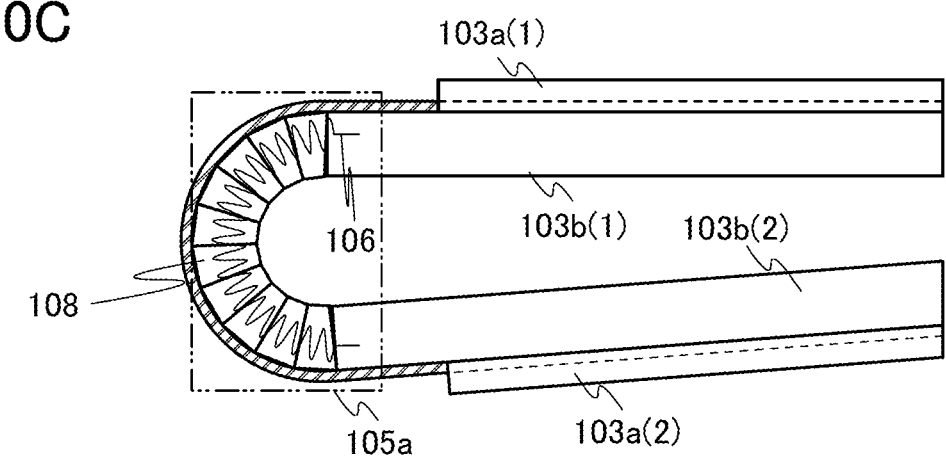

FIGS. 10A to 10C are side views of the connection portion 105a in the states shown in FIGS. 9A to 9C, respectively.

The connection portion 105a includes the elastic body 106 and the plurality of spacers 108. In Structure Example D, a cross-sectional shape of the spacer 108 along the direction perpendicular to the longitudinal direction of the spacer 108 is a trapezoid. In this case, in the first region 161, a region with high flexibility can be bent inwardly and outwardly.

In FIGS. 10A to 10C, the elastic body 106 is shown with a thin solid line; however, in an actual structure, the elastic body 106 is not exposed on the outside of the spacers 108 but positioned in openings provided in the spacers 108.

One end portion of the elastic body 106 is fixed to the support 103b(1), and the other end portion of the elastic body 106 is fixed to the support 103b(2). That is, the elastic body 106 connects the support 103b(1) and the support 103b(2).

The openings are provided in the spacers 108. The elastic body 106 connects the plurality of spacers 108 through the openings.

The plurality of spacers 108 each overlap with the light-emitting panel 101. The plurality of spacers 108 are connected to each other through the elastic body 106 in the openings, but are not fixed to each other. With such a structure, when the first region 161 is bent, the angle between normals of facing planes of the two adjacent spacers 108 changes according to the bending of the light-emitting panel 101. Accordingly, a neutral plane can be formed in the light-emitting panel 101 or in the vicinity of the light-emitting panel 101.

An enlarged view of two adjacent spacers 108 is shown in the lower left portion of FIG. 10A. In FIG. 10A, an angle θ between the normals of the facing planes of the two adjacent spacers 108 is an acute angle. As the light-emitting device is bent from the state of FIG. 10A, the angle θ becomes smaller. When the angle θ becomes 0° in the state of FIG. 10C, the light-emitting device cannot be further bent. That is, depending on the shape or the number of the spacers 108, the light-emitting panel 101 can be prevented from being bent with too small a radius of curvature when the light-emitting device is folded at the first region 161.

The light-emitting device can also be bent inwardly at the first region 161 because the angle θ can be larger than in the state of FIG. 10A.

The width or the area of the surface of the spacer 108 on the light-emitting panel 101 side is preferably larger than that on the opposite side because the light-emitting panel 101 can be bent outwardly in the light-emitting device. The shape of the side surface of the spacer 108 is, for example, a trapezoid as illustrated in FIG. 10A. Note that corner portions of the spacer 108 may have curvature.

The plurality of spacers 108 are each preferably fixed to the light-emitting panel 101 because the spacers 108 can be prevented from being moved in the longitudinal direction of the spacers 108.

<Structure Example E>

Figure 12A:
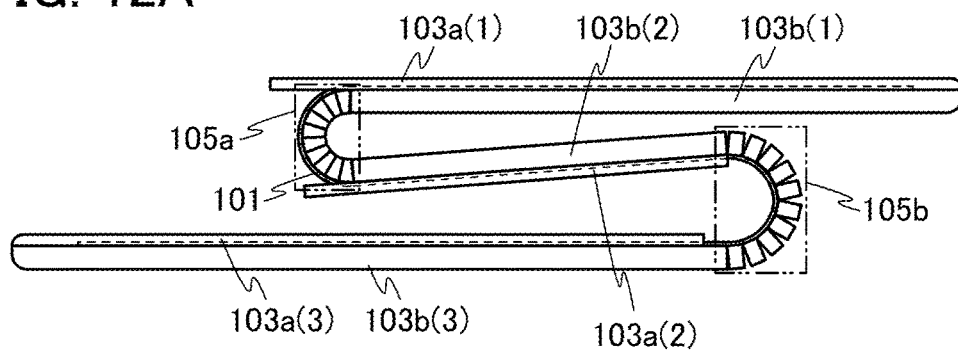
FIGS. 12A to 12C illustrate examples of a light-emitting device.
Figure 12B:
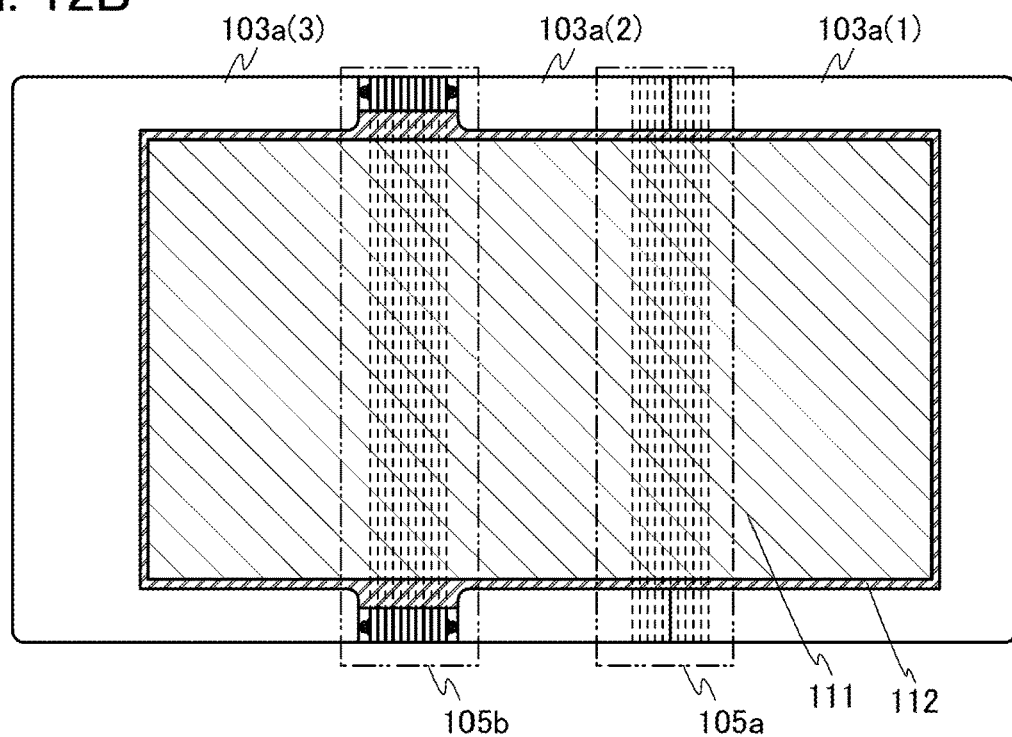

FIG. 11A illustrates a light-emitting device that is opened. FIG. 11B illustrates the light-emitting device that is being opened or being folded. FIG. 11C illustrates the light-emitting device that is folded. FIG. 12A is a side view of the light-emitting device in the state shown in FIG. 11C. FIG. 12B is a top view of the light-emitting device in the state shown in FIG. 11A.

As illustrated in FIG. 11A, FIG. 12B, and the like, the support 103a(1) may overlap with the connection portion 105a or the spacers 108. At this time, the support 103a(1) is preferably formed using a material that blocks visible light in order that the connection portion 105a or the spacers 108 can be prevented from being seen by a user viewing the light-emitting surface of the light-emitting device. Note that a light-blocking layer may be provided as described in Modification Example 1.

In the structure where the support 103a(1) and the support 103a(2) are in contact with each other when the light-emitting device is opened as illustrated in FIG. 11A, FIG. 12B, and the like, the first region 161 cannot be bent inwardly. In this manner, the direction in which a region with high flexibility is bent in the light-emitting device can be controlled by the structure of the support.

Furthermore, as illustrated in FIG. 12A, it is preferable that a pair of regions with low flexibility positioned on the outer side among the regions with low flexibility that overlap with one another when the light-emitting device is folded be parallel to the support plane of the light-emitting device, and that a region with low flexibility positioned on the inner side not be parallel to the support plane. In that case, the light-emitting device can be made thinner.

<Modification Example 4>

Figure 12C:
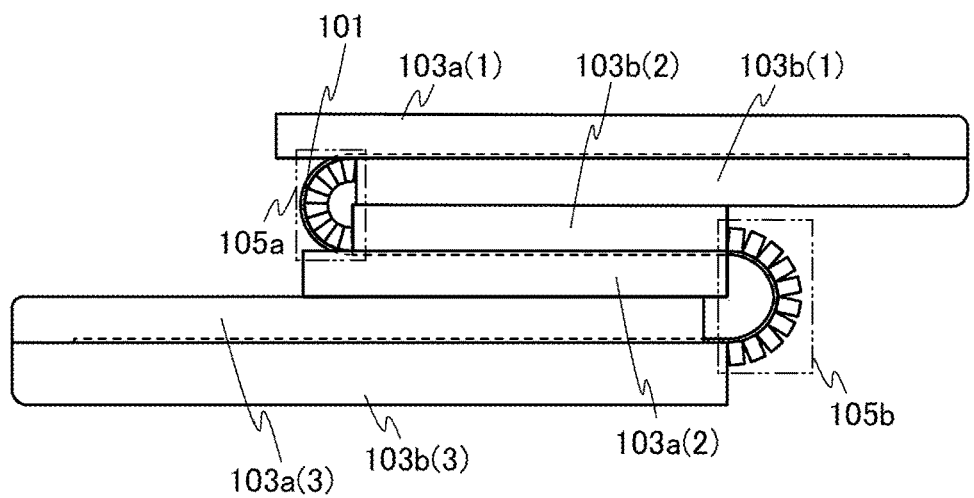

FIG. 12C is a side view of a light-emitting device that is folded. The light-emitting device illustrated in FIG. 12C is a modification example of the light-emitting device illustrated in FIG. 12A.

In the structure where the support 103b(2) and the support 103b(3) can keep a certain distance from each other as illustrated in FIG. 12C by adjusting the thickness of the support 103a(2) or the support 103a(3), the light-emitting panel 101 can be prevented from being bent with too small a radius of curvature.

An example of a light-emitting device that can be folded inwardly in two parts is described in Structure Example A, Structure Example B, and the like; however, one embodiment of the present invention is not limited thereto. As in Structure Example F below, a light-emitting device that can be folded outwardly in two parts is also one embodiment of the present invention.

<Structure Example F>

Figure 13A:
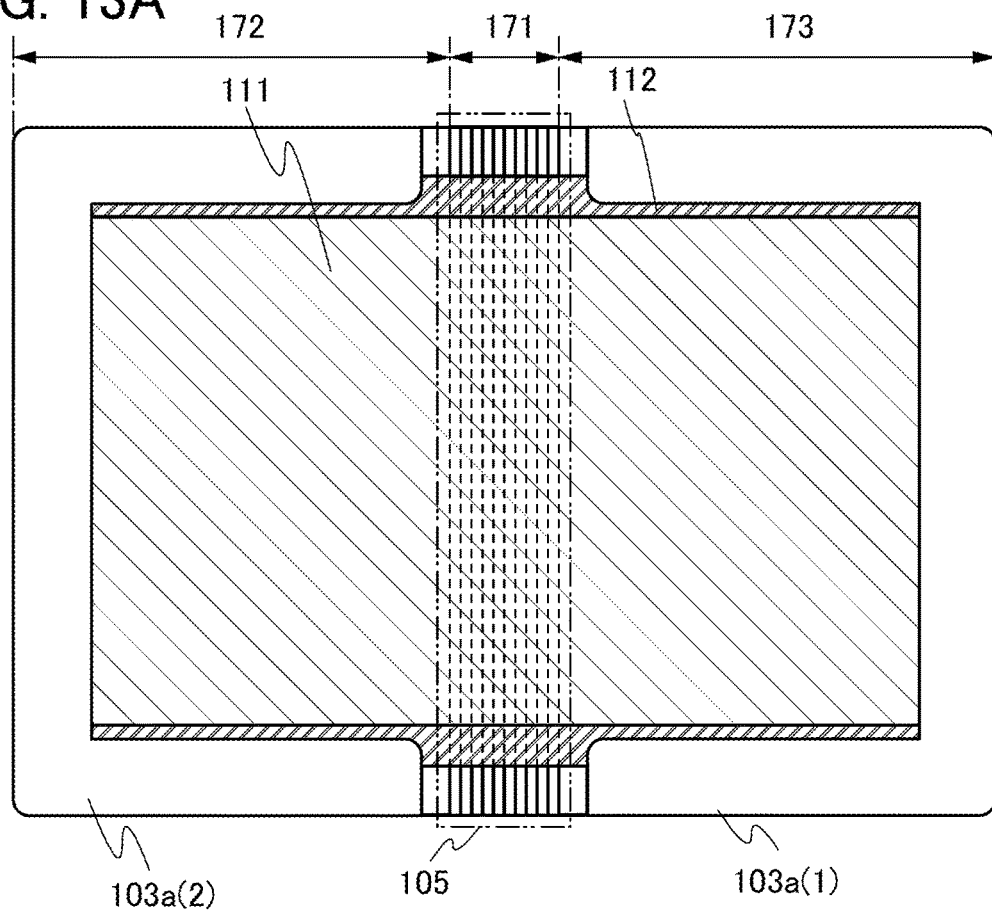
FIGS. 13A to 13C illustrate examples of a light-emitting device.
Figure 13B:
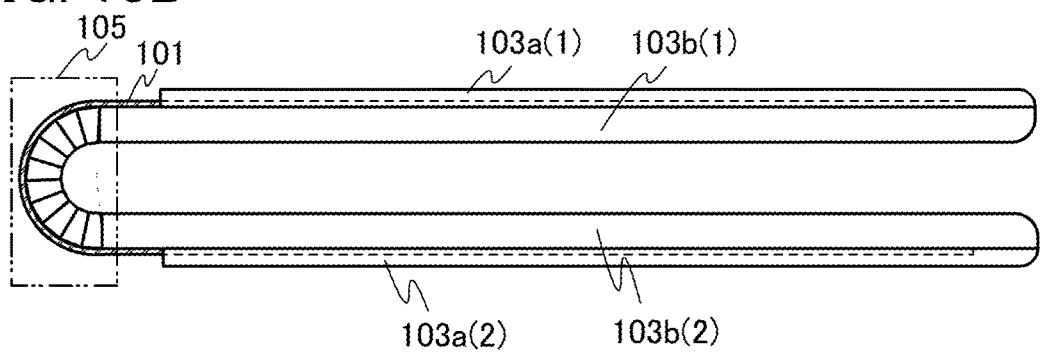

FIG. 13A illustrates a light-emitting device that is opened. FIG. 13B is a side view of the light-emitting device that is folded.

The light-emitting device has a first region 171, a second region 172, and a third region 173. The first region 171 is positioned between the second region 172 and the third region 173. The first region 171 has the highest flexibility of the three regions.

The light-emitting device includes the light-emitting panel 101, the support 103a(1), the support 103a(2), the support 103b(1), the support 103b(2), and the connection portion 105.

The support 103a(1) and the support 103a(2) are apart from each other. The support 103b(1) and the support 103b(2) are apart from each other. The four supports each have lower flexibility than the light-emitting panel 101.

The first region 171 includes the light-emitting panel 101 and the connection portion 105. The light-emitting panel 101 and the connection portion 105 overlap with each other.

The first region 171 is a portion at which the light-emitting panel 101 can be bent outwardly. For the details, the description of the connection portion 105a in Structure Example D can be referred to. The light-emitting panel 101 may be bent inwardly at the first region 171.

In the second region 172, the light-emitting panel 101 is provided between the support 103a(1) and the support 103b(1). In the third region 173, the light-emitting panel 101 is provided between the support 103a(2) and the support 103b(2).

<Modification Example 5>

Figure 13C:
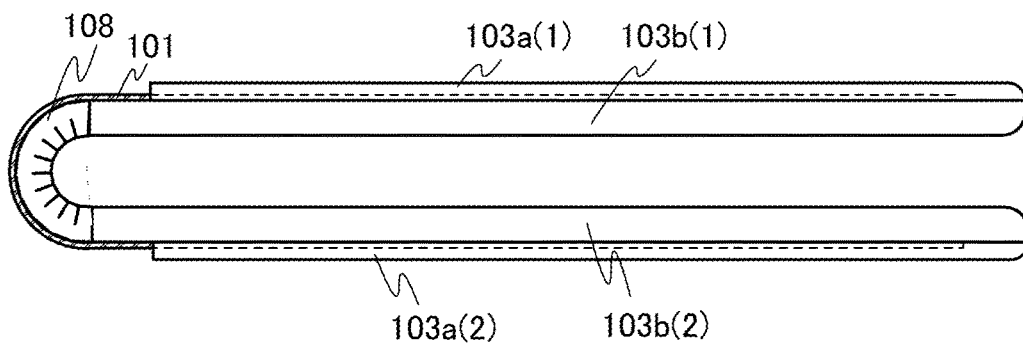

FIG. 13C is a side view of a light-emitting device that is folded. The light-emitting device illustrated in FIG. 13C is a modification example of the light-emitting device illustrated in FIG. 13B.

The light-emitting device illustrated in FIG. 13C includes one spacer 108. In the spacer 108, a plurality of cuts are provided. A plurality of projections separated by the cuts function like the plurality of spacers described in the above structure examples. That is, when the first region 171 is bent, the angle between normals of facing planes of the two adjacent projections changes according to the bending of the light-emitting panel 101. Accordingly, a neutral plane can be formed in the light-emitting panel 101 or in the vicinity of the light-emitting panel 101. The cuts are preferably formed deeply because a neutral plane can be easily formed in the light-emitting panel 101 or in the vicinity of the light-emitting panel 101. Note that two or more spacers 108 each having a cut may be provided.

As described above, in this embodiment, when a region with high flexibility in a light-emitting device has the structure in which a light-emitting panel and a member overlap with each other, the mechanical strength of the region with high flexibility can be improved. A neutral plane can be formed in the light-emitting panel or in the vicinity of the light-emitting panel even when the member is provided. As a result, the light-emitting panel does not easily expand or contract even when the light-emitting device is bent, and thus the light-emitting panel can be prevented from being broken.

This embodiment can be combined with any of the other embodiments as appropriate.

(Embodiment 2)

In this embodiment, a light-emitting panel will be described with reference to drawings.

Although a light-emitting panel mainly including an organic EL element will be described in this embodiment as an example, one embodiment of the present invention is not limited to this example.

When the light-emitting panel described in this embodiment is bent, the minimum radius of curvature of a bent portion of the light-emitting panel can be greater than or equal to 1 mm and less than or equal to 150 mm, greater than or equal to 1 mm and less than or equal to 100 mm, greater than or equal to 1 mm and less than or equal to 50 mm, greater than or equal to 1 mm and less than or equal to 10 mm, or greater than or equal to 2 mm and less than or equal to 5 mm. The light-emitting panel in this embodiment is free from breakage of an element even when bent with a small radius of curvature (e.g., greater than or equal to 2 mm and less than or equal to 5 mm) and has high reliability. Bending the light-emitting panel with a small radius of curvature can make the light-emitting device of one embodiment of the present invention thin. There is no limitation on the direction in which the light-emitting panel in this embodiment is bent. Further, the number of bent portions may be one or more than one.

<Specific Example 1>

Figure 14A:
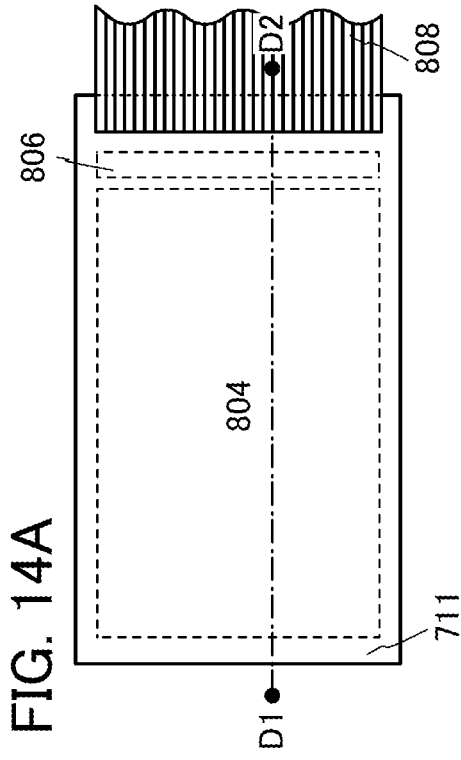
FIGS. 14A and 14B illustrate an example of a light-emitting panel.
Figure 14B:
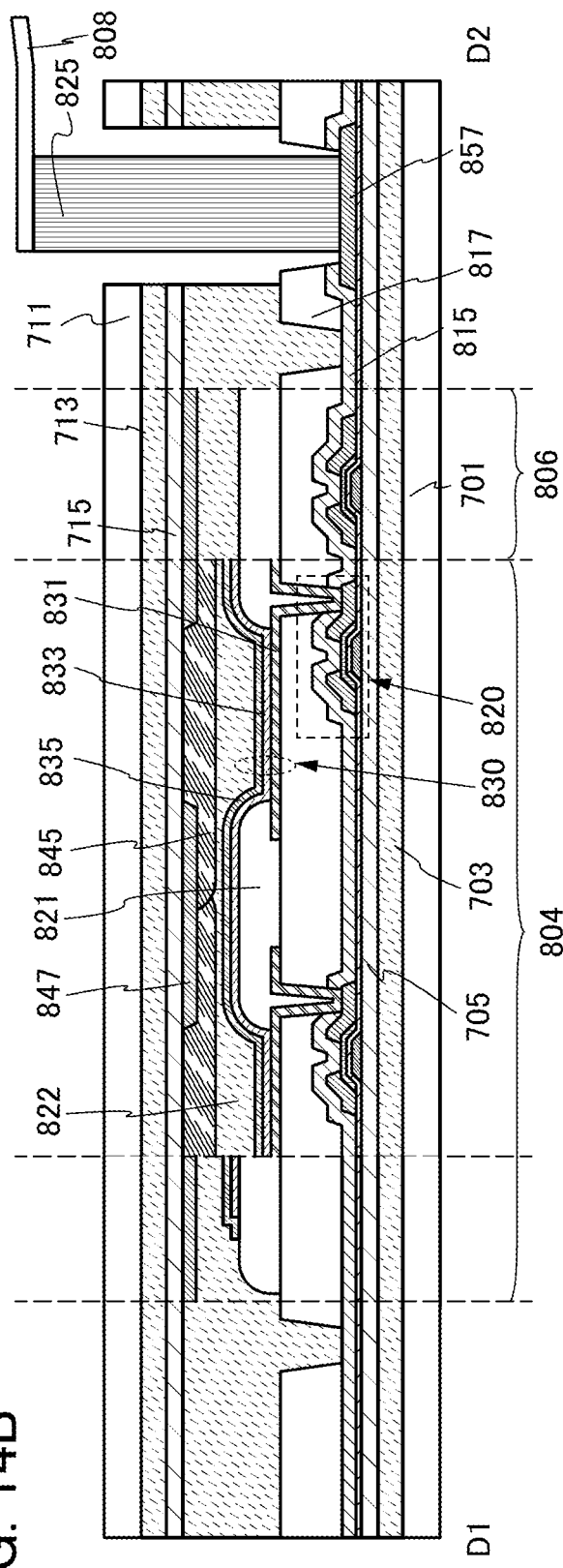

FIG. 14A is a plan view of a light-emitting panel, and FIG. 14B is an example of a cross-sectional view taken along dashed-dotted line D1-D2 in FIG. 14A. The light-emitting panel in Specific Example 1 is a top-emission light-emitting panel using a color filter method. In this embodiment, the light-emitting panel can have a structure in which subpixels of three colors of red (R), green (G), and blue (B), for example, express one color; a structure in which subpixels of four colors of R, G, B, and white (W) express one color;

a structure in which subpixels of four colors of R, G, B, and yellow (Y) express one color; or the like. There is no particular limitation on color elements, and colors other than R, G, B, W, and Y may be used. For example, cyan or magenta may be used.

The light-emitting panel illustrated in FIG. 14A includes a light-emitting portion 804, a driver circuit portion 806, and an FPC 808.

The light-emitting panel illustrated in FIG. 14B includes a first flexible substrate 701, a first bonding layer 703, a first insulating layer 705, a first functional layer (a plurality of transistors, a conductive layer 857, an insulating layer 815, an insulating layer 817, a plurality of light-emitting elements, and an insulating layer 821), a third bonding layer 822, a second functional layer (a coloring layer 845 and a light-blocking layer 847), a second insulating layer 715, a second bonding layer 713, and a second flexible substrate 711. The third bonding layer 822, the second insulating layer 715, the second bonding layer 713, and the second flexible substrate 711 transmit visible light. Light-emitting elements and transistors in the light-emitting portion 804 and the driver circuit portion 806 are sealed with the first flexible substrate 701, the second flexible substrate 711, and the third bonding layer 822.

In the light-emitting portion 804, a transistor 820 and a light-emitting element 830 are provided over the first flexible substrate 701 with the first bonding layer 703 and the first insulating layer 705 placed therebetween. The light-emitting element 830 includes a lower electrode 831 over the insulating layer 817, an EL layer 833 over the lower electrode 831, and an upper electrode 835 over the EL layer 833. The lower electrode 831 is electrically connected to a source electrode or a drain electrode of the transistor 820. An end portion of the lower electrode 831 is covered with the insulating layer 821. The lower electrode 831 preferably reflects visible light. The upper electrode 835 transmits visible light.

In the light-emitting portion 804, the coloring layer 845 overlapping with the light-emitting element 830 and the light-blocking layer 847 overlapping with the insulating layer 821 are provided. The space between the light-emitting element 830 and the coloring layer 845 is filled with the third bonding layer 822.

The insulating layer 815 has an effect of preventing diffusion of impurities into a semiconductor included in the transistor. As the insulating layer 817, an insulating layer having a planarization function is preferably used in order to reduce surface unevenness due to the transistor.

In the driver circuit portion 806, a plurality of transistors are provided over the first flexible substrate 701 with the first bonding layer 703 and the first insulating layer 705 positioned therebetween. FIG. 14B illustrates one of the transistors included in the driver circuit portion 806.

The first insulating layer 705 and the first flexible substrate 701 are attached to each other with the first bonding layer 703. The second insulating layer 715 and the second flexible substrate 711 are attached to each other with the second bonding layer 713. The first insulating layer 705 and the second insulating layer 715 are preferably highly resistant to moisture, in which case impurities such as water can be prevented from entering the light-emitting element 830 or the transistor 820, leading to higher reliability of the light-emitting panel.

The conductive layer 857 is electrically connected to an external input terminal through which a signal or a potential from the outside is transmitted to the driver circuit portion 806. Here, an example in which the FPC 808 is provided as the external input terminal is described. To prevent an increase in the number of fabrication steps, the conductive layer 857 is preferably formed using the same material and the same step as the electrode or the wiring in the light-emitting portion or the driver circuit portion. Here, an example is described in which the conductive layer 857 is formed using the same material and the same step as the electrodes of the transistor 820.

In the light-emitting panel in FIG. 14B, the FPC 808 is positioned over the second flexible substrate 711. A connector 825 is connected to the conductive layer 857 through an opening provided in the second flexible substrate 711, the second bonding layer 713, the second insulating layer 715, the third bonding layer 822, the insulating layer 817, and the insulating layer 815. Furthermore, the connector 825 is connected to the FPC 808. That is, the FPC 808 and the conductive layer 857 are electrically connected to each other through the connector 825. When the conductive layer 857 and the second flexible substrate 711 overlap with each other, an opening formed in the second flexible substrate 711 (or the use of a substrate with an opening) allows the conductive layer 857, the connector 825, and the FPC 808 to be electrically connected to each other.

Figure 15A:
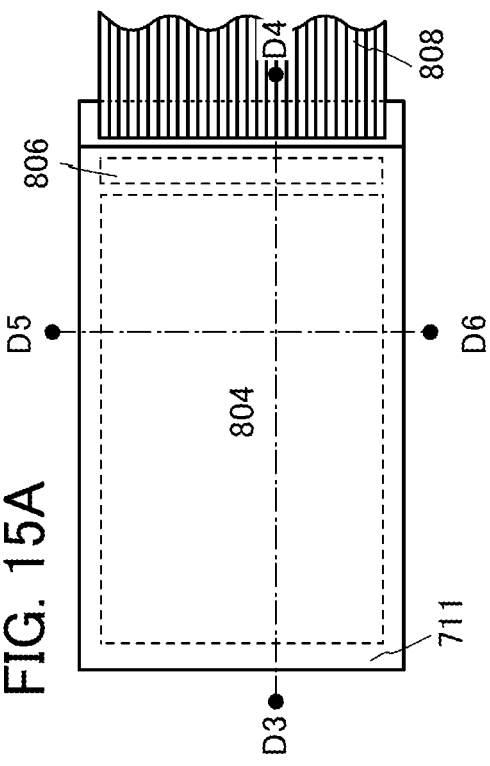
FIGS. 15A and 15B illustrate an example of a light-emitting panel.
Figure 15B:
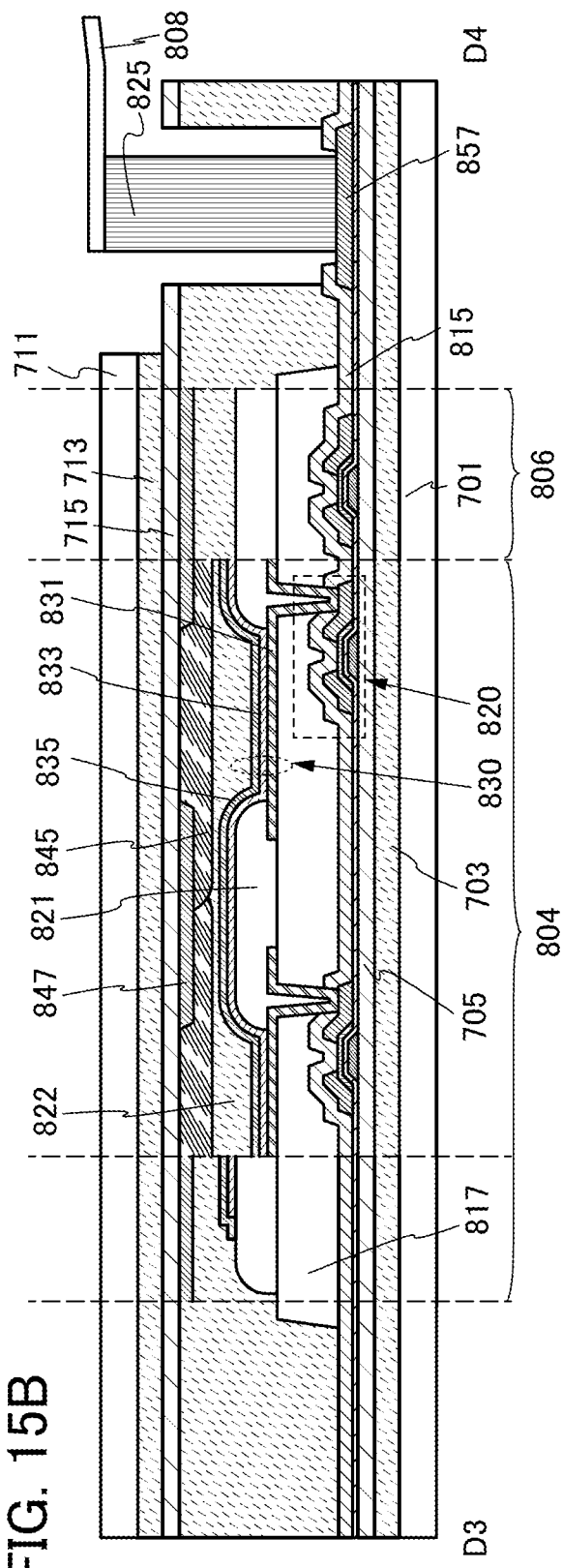

A modification example of the light-emitting panel illustrated in FIGS. 14A and 14B will be described. FIG. 15A is a plan view of a light-emitting panel, and FIG. 15B is an example of a cross-sectional view taken along dashed-dotted line D3-D4 in FIG. 15A. FIG. 16A is an example of a cross-sectional view taken along dashed-dotted line D5-D6 in FIG. 15A.

The light-emitting panel illustrated in FIGS. 15A and 15B shows an example in which the first flexible substrate 701 and the second flexible substrate 711 have different sizes. The FPC 808 is positioned over the second insulating layer 715 and does not overlap with the second flexible substrate 711. The connector 825 is connected to the conductive layer 857 through an opening provided in the second insulating layer 715, the third bonding layer 822, the insulating layer 817, and the insulating layer 815. There is no limitation on the material for the second flexible substrate 711 because an opening does not need to be provided in the second flexible substrate 711.

It is preferred that the insulating layer formed using an organic resin having a poor gas barrier property and a poor moisture-resistant property not be exposed in an end portion of the light-emitting device. With such a structure, entry of impurities from the side surface of the light-emitting device can be prevented. For example, as illustrated in FIG. 15B and FIG. 16A, the structure in which the insulating layer 817 is not provided in the end portion of the light-emitting device may be employed.

FIG. 16B shows a modification example of the light-emitting portion 804.

The light-emitting panel illustrated in FIG. 16B includes insulating layers 817a and 817b and a conductive layer 856 over the insulating layer 817a. The source electrode or the drain electrode of the transistor 820 and the lower electrode of the light-emitting element 830 are electrically connected to each other through the conductive layer 856.

The light-emitting panel illustrated in FIG. 16B includes a spacer 823 over the insulating layer 821. The spacer 823 can adjust the distance between the first flexible substrate 701 and the second flexible substrate 711.

The light-emitting panel in FIG. 16B includes an overcoat 849 covering the coloring layer 845 and the light-blocking layer 847. The space between the light-emitting element 830 and the overcoat 849 is filled with the bonding layer 822.

FIG. 16C shows a modification example of the light-emitting element 830.

Note that as illustrated in FIG. 16C, the light-emitting element 830 may include an optical adjustment layer 832 between the lower electrode 831 and the EL layer 833. A light-transmitting conductive material is preferably used for the optical adjustment layer 832.

Owing to the combination of a color filter (the coloring layer) and a microcavity structure (the optical adjustment layer), light with high color purity can be extracted from the light-emitting panel of one embodiment of the present invention. The thickness of the optical adjustment layer may be varied depending on the color of the subpixel.

<Specific Example 2>

A light-emitting panel illustrated in FIG. 16D includes the first flexible substrate 701, the first bonding layer 703, the first insulating layer 705, a first functional layer (a conductive layer 814, a conductive layer 857a, a conductive layer 857b, the light-emitting element 830, and the insulating layer 821), the second bonding layer 713, and the second flexible substrate 711.

The conductive layer 857a and the conductive layer 857b serve as external connection electrodes of the light-emitting panel and can each be electrically connected to an FPC or the like.

The light-emitting element 830 includes the lower electrode 831, the EL layer 833, and the upper electrode 835. An end portion of the lower electrode 831 is covered with the insulating layer 821. The light-emitting element 830 has a bottom-emission structure, a top-emission structure, or a dual-emission structure. The electrode, substrate, insulating layer, and the like through which light is extracted transmit visible light. The conductive layer 814 is electrically connected to the lower electrode 831.

The substrate through which light is extracted may have, as a light extraction structure, a hemispherical lens, a micro lens array, a film provided with an uneven surface structure, a light diffusing film, or the like. For example, the substrate with the light extraction structure can be formed by bonding the above lens or film to a resin substrate with an adhesive or the like having substantially the same refractive index as the substrate, the lens, or the film.

The conductive layer 814 is preferably, though not necessarily, provided because voltage drop due to the resistance of the lower electrode 831 can be inhibited. In addition, for a similar purpose, a conductive layer electrically connected to the upper electrode 835 may be provided over the insulating layer 821, the EL layer 833, the upper electrode 835, or the like.

The conductive layer 814 can be a single layer or a stacked layer formed using a material selected from copper, titanium, tantalum, tungsten, molybdenum, chromium, neodymium, scandium, nickel, and aluminum, an alloy material containing any of these materials as its main component, and the like. The thickness of the conductive layer 814 can be, for example, greater than or equal to 0.1 μm and less than or equal to 3 μm, preferably greater than or equal to 0.1 μm and less than or equal to 0.5 μm.

<Specific Example 3>

FIG. 15A is a plan view of a light-emitting panel. FIG. 17A is an example of a cross-sectional view taken along dashed-dotted line D3-D4 in FIG. 15A. The light-emitting panel in Specific Example 3 is a bottom-emission light-emitting panel using a color filter method.

The light-emitting panel illustrated in FIG. 17A includes the first flexible substrate 701, the first bonding layer 703, the first insulating layer 705, a first functional layer (a plurality of transistors, the conductive layer 857, the insulating layer 815, the coloring layer 845, the insulating layer 817a, the insulating layer 817b, the conductive layer 856, a plurality of light-emitting elements, and the insulating layer 821), the second bonding layer 713, and the second flexible substrate 711. The first flexible substrate 701, the first bonding layer 703, the first insulating layer 705, the insulating layer 815, the insulating layer 817a, and the insulating layer 817b transmit visible light.

In the light-emitting portion 804, the transistor 820, a transistor 824, and the light-emitting element 830 are provided over the first flexible substrate 701 with the first bonding layer 703 and the first insulating layer 705 positioned therebetween. The light-emitting element 830 includes the lower electrode 831 over the insulating layer 817b, the EL layer 833 over the lower electrode 831, and the upper electrode 835 over the EL layer 833. The lower electrode 831 is electrically connected to the source electrode or the drain electrode of the transistor 820. An end portion of the lower electrode 831 is covered with the insulating layer 821. The upper electrode 835 preferably reflects visible light. The lower electrode 831 transmits visible light. There is no particular limitation on the position of the coloring layer 845 overlapping with the light-emitting element 830; for example, the coloring layer 845 may be provided between the insulating layer 817a and the insulating layer 817b or between the insulating layer 815 and the insulating layer 817a.

In the driver circuit portion 806, a plurality of transistors are provided over the first flexible substrate 701 with the first bonding layer 703 and the first insulating layer 705 positioned therebetween. FIG. 17A illustrates two of the transistors in the driver circuit portion 806.

The first insulating layer 705 and the first flexible substrate 701 are attached to each other with the first bonding layer 703. The first insulating layer 705 is preferably highly resistant to moisture, in which case impurities such as water can be prevented from entering the light-emitting element 830, the transistor 820, or the transistor 824, leading to higher reliability of the light-emitting panel.

The conductive layer 857 is electrically connected to an external input terminal through which a signal or a potential from the outside is transmitted to the driver circuit portion 806. In this example, the FPC 808 is provided as the external input terminal, and the conductive layer 857 is formed using the same material and the same step as the conductive layer 856.

<Specific Example 4>

FIG. 15A is a plan view of a light-emitting panel. FIG. 17B is an example of a cross-sectional view taken along dashed-dotted line D3-D4 in FIG. 15A. The light-emitting panel in Specific Example 4 is a top-emission light-emitting panel using a separate coloring method.

The light-emitting panel in FIG. 17B includes the first flexible substrate 701, the first bonding layer 703, the first insulating layer 705, a first functional layer (a plurality of transistors, the conductive layer 857, the insulating layer 815, the insulating layer 817, a plurality of light-emitting elements, the insulating layer 821, and the spacer 823), the second bonding layer 713, and the second flexible substrate 711. The second bonding layer 713 and the second flexible substrate 711 transmit visible light.

In the light-emitting panel illustrated in FIG. 17B, the connector 825 is positioned over the insulating layer 815. The connector 825 is connected to the conductive layer 857 through an opening provided in the insulating layer 815. The connector 825 is also connected to the FPC 808. That is, the FPC 808 and the conductive layer 857 are electrically connected to each other through the connector 825.

<Examples of Materials>

Next, materials that can be used for the light-emitting panel will be described. Note that description of the components already described in this specification is omitted in some cases.

For the substrates, glass, quartz, an organic resin, a metal, an alloy, or the like can be used. The substrate through which light from the light-emitting element is extracted is formed using a material that transmits the light.

It is particularly preferable to use a flexible substrate. For example, it is possible to use glass, a metal, or an alloy that is thin enough to have flexibility, or an organic resin. For example, the thickness of the flexible substrate is preferably greater than or equal to 1 µm and less than or equal to 200 µm, further preferably greater than or equal to 1 µm and less than or equal to 100 µm, still further preferably greater than or equal to 1 µm and less than or equal to 50 µm, and particularly preferably greater than or equal to 1 µm and less than or equal to 25 µm.

An organic resin, which has a smaller specific gravity than glass, is preferably used for the flexible substrate, in which case the light-emitting panel can be lighter in weight than that using glass.

A material with high toughness is preferably used for the substrates. In that case, a light-emitting panel with high impact resistance that is less likely to be broken can be provided. For example, when an organic resin substrate or a metal or alloy substrate with a small thickness is used, the light-emitting panel can be lightweight and less likely to be broken as compared with the case where a glass substrate is used.

A metal material and an alloy material, which have high thermal conductivity, are preferred because they can easily conduct heat to the whole substrate and accordingly can prevent a local temperature rise in the light-emitting panel. The thickness of a substrate using a metal material or an alloy material is preferably greater than or equal to 10 µm and less than or equal to 200 µm, further preferably greater than or equal to 20 µm and less than or equal to 50 µm.

Although there is no particular limitation on a material for the metal substrate and the alloy substrate, it is preferable to use, for example, aluminum, copper, nickel, or a metal alloy such as an aluminum alloy or stainless steel.

Furthermore, when a material with high thermal emissivity is used for the substrate, the surface temperature of the light-emitting panel can be prevented from rising, leading to prevention of breakage or a decrease in reliability of the light-emitting panel. For example, the substrate may have a stacked-layer structure of a metal substrate and a layer with high thermal emissivity (e.g., a layer formed using a metal oxide or a ceramic material).

Examples of a material having flexibility and a light-transmitting property include polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin (e.g., nylon or aramid), a cycloolefin resin, a polystyrene resin, a polyamide imide resin, a polyvinyl chloride resin, and a polytetrafluoroethylene (PTFE) resin. In particular, a material with a low coefficient of linear expansion is preferred, and for example, a polyamide imide resin, a polyimide resin, a polyamide resin, or PET can be suitably used. It is also possible to use a substrate in which a fibrous body is impregnated with a resin (also referred to as prepreg) or a substrate whose coefficient of linear expansion is reduced by mixing an organic resin with an inorganic filler.

The flexible substrate may have a stacked-layer structure of a layer of any of the above-mentioned materials and a hard coat layer by which a surface of the device is protected from damage (e.g., a silicon nitride layer), a layer that can disperse pressure (e.g., an aramid resin layer), or the like.

The flexible substrate may be formed by stacking a plurality of layers. When a glass layer is used, a barrier property against water and oxygen can be improved and thus a reliable light-emitting panel can be provided.

For example, it is possible to use a flexible substrate in which a glass layer, a bonding layer, and an organic resin layer are stacked from the side closer to a light-emitting element. The thickness of the glass layer is greater than or equal to 20 µm and less than or equal to 200 µm, preferably greater than or equal to 25 µm and less than or equal to 100 µm. With such a thickness, the glass layer can have both high flexibility and a high barrier property against water and oxygen. The thickness of the organic resin layer is greater than or equal to 10 µm and less than or equal to 200 µm, preferably greater than or equal to 20 µm and less than or equal to 50 µm. Providing such an organic resin layer outside the glass layer, occurrence of a crack or a break in the glass layer can be suppressed and mechanical strength can be improved. With the substrate using such a composite material of a glass material and an organic resin, a flexible light-emitting panel with high reliability can be provided.

For the bonding layer, various curable adhesives such as a photo curable adhesive (e.g., an ultraviolet curable adhesive), a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. A material with low moisture permeability, such as an epoxy resin, is particularly preferred. Alternatively, a two-component resin may be used. An adhesive sheet or the like may be used.

Furthermore, the resin may include a drying agent. For example, it is possible to use a substance that adsorbs moisture by chemical adsorption, such as oxide of an alkaline earth metal (e.g., calcium oxide or barium oxide). Alternatively, it is possible to use a substance that adsorbs moisture by physical adsorption, such as zeolite or silica gel. The drying agent is preferably included because it can prevent impurities such as moisture from entering the functional element, thereby improving the reliability of the light-emitting panel.

When a filler with a high refractive index or a light scattering member is mixed into the resin, the efficiency of light extraction from the light-emitting element can be improved. For example, titanium oxide, barium oxide, zeolite, or zirconium can be used.

Insulating films highly resistant to moisture are preferably used as the first insulating layer 705 and the second insulating layer 715. Alternatively, the first insulating layer 705 and the second insulating layer 715 preferably have a function of preventing diffusion of impurities to the light-emitting element.

Examples of the insulating film highly resistant to moisture include a film containing nitrogen and silicon (e.g., a silicon nitride film and a silicon nitride oxide film) and a film containing nitrogen and aluminum (e.g., an aluminum nitride film). Alternatively, a silicon oxide film, a silicon oxynitride film, an aluminum oxide film, or the like may be used.

For example, the moisture vapor transmission rate of the insulating film highly resistant to moisture is lower than or equal to $1\times10^{-5}$ [g/(m$^2$·day)], preferably lower than or equal to $1\times10^{-6}$ [g/(m$^2$·day)], further preferably lower than or equal to $1\times10^{-7}$ [g/(m$^2$·day)], still further preferably lower than or equal to $1\times10^{-8}$ [g/(m$^2$·day)].

In the light-emitting panel, it is necessary that at least one of the first insulating layer 705 and the second insulating layer 715 transmit light emitted from the light-emitting element. One of the first insulating layer 705 and the second insulating layer 715, which transmits light emitted from the light-emitting element, preferably has higher average transmittance of light having a wavelength greater than or equal to 400 nm and less than or equal to 800 nm than the other.

There is no particular limitation on the structure of the transistors in the light-emitting panel. For example, a forward staggered transistor or an inverted staggered transistor may be used. A top-gate transistor or a bottom-gate transistor may be used. There is no particular limitation on a semiconductor material used for the transistors, and silicon, germanium, or an organic semiconductor can be used, for example. Alternatively, an oxide semiconductor containing at least one of indium, gallium, and zinc (e.g., In—Ga—Zn-based metal oxide) may be used.

There is no particular limitation on the crystallinity of a semiconductor material used for the transistors, and an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used, in which case deterioration of the transistor characteristics can be suppressed.

For stable characteristics of the transistor, a base film is preferably provided. The base film can be formed with a single-layer structure or a stacked-layer structure using an inorganic insulating film such as a silicon oxide film, a silicon nitride film, a silicon oxynitride film, or a silicon nitride oxide film. The base film can be formed by a sputtering method, a chemical vapor deposition (CVD) method (e.g., a plasma CVD method, a thermal CVD method, or a metal organic CVD (MOCVD) method), an atomic layer deposition (ALD) method, a coating method, a printing method, or the like. Note that the base film is not necessarily provided if not necessary. In each of the above structure examples, the first insulating layer 705 can serve as a base film of the transistor.

As the light-emitting element, a self-luminous element can be used, and an element whose luminance is controlled by current or voltage is included in the category of the light-emitting element. For example, a light-emitting diode (LED), an organic EL element, or an inorganic EL element can be used.

The light-emitting element can have any of a top-emission structure, a bottom-emission structure, and a dual-emission structure. A conductive film that transmits visible light is used as the electrode through which light is extracted. A conductive film that reflects visible light is preferably used as the electrode through which light is not extracted.

The conductive film that transmits visible light can be formed using, for example, indium oxide, indium tin oxide (ITO), indium zinc oxide, zinc oxide (ZnO), or zinc oxide to which gallium is added. It is also possible to use a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) when the film is thin enough to have a light-transmitting property. Alternatively, a stack of any of the above materials can be used as the conductive layer. For example, a stacked film of ITO and an alloy of silver and magnesium is preferably used, in which case conductivity can be increased. Further alternatively, graphene or the like may be used.

For the conductive film that reflects visible light, a metal material such as aluminum, gold, platinum, silver, nickel, tungsten, chromium, molybdenum, iron, cobalt, copper, or palladium or an alloy containing any of these metal materials can be used, for example. Lanthanum, neodymium, germanium, or the like may be added to the metal material or the alloy. Moreover, the conductive film can be formed using an alloy containing aluminum (an aluminum alloy) such as an alloy of aluminum and titanium, an alloy of aluminum and nickel, an alloy of aluminum and neodymium, or an alloy of aluminum, nickel, and lanthanum (Al—Ni—La), or an alloy containing silver such as an alloy of silver and copper, an alloy of silver, palladium, and copper (Ag—Pd—Cu, also referred to as APC), or an alloy of silver and magnesium. An alloy of silver and copper is preferable because of its high heat resistance. When a metal film or a metal oxide film is stacked on an aluminum alloy film, oxidation of the aluminum alloy film can be suppressed. Examples of a material for the metal film or the metal oxide film are titanium and titanium oxide. Alternatively, the conductive film having a property of transmitting visible light and a film containing any of the above metal materials may be stacked. For example, it is possible to use a stacked film of silver and ITO or a stacked film of an alloy of silver and magnesium and ITO.

Each of the electrodes can be formed by an evaporation method or a sputtering method. Alternatively, a discharging method such as an ink-jet method, a printing method such as a screen printing method, or a plating method can be used.

When a voltage higher than the threshold voltage of the light-emitting element is applied between the lower electrode 831 and the upper electrode 835, holes are injected to the EL layer 833 from the anode side and electrons are injected to the EL layer 833 from the cathode side. The injected electrons and holes are recombined in the EL layer 833 and a light-emitting substance contained in the EL layer 833 emits light.

The EL layer 833 includes at least a light-emitting layer. In addition to the light-emitting layer, the EL layer 833 may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron-transport property and a high hole-transport property), and the like.

For the EL layer 833, either a low molecular compound or a high molecular compound can be used, and an inorganic compound may be used. Each of the layers included in the EL layer 833 can be formed by any of the following methods: an evaporation method (including a vacuum evaporation method), a transfer method, a printing method, an ink-jet method, a coating method, and the like.

The light-emitting element 830 may contain two or more kinds of light-emitting substances. Thus, for example, a light-emitting element that emits white light can be achieved. For example, light-emitting substances are selected so that two or more light-emitting substances emit complementary colors to obtain white light emission. A light-emitting substance that emits red (R) light, green (G) light, blue (B) light, yellow (Y) light, or orange (O) light or a light-emitting substance that emits light containing spectral components of two or more of R light, G light, and B light can be used, for example. A light-emitting substance that emits blue light and a light-emitting substance that emits yellow light may be used, for example. At this time, the emission spectrum of the light-emitting substance that emits yellow light preferably contains spectral components of G light and R light. The emission spectrum of the light-emitting element 830 preferably has two or more peaks in the visible region (e.g., greater than or equal to 350 nm and less than or equal to 750 nm or greater than or equal to 400 nm and less than or equal to 800 nm).

The EL layer 833 may include a plurality of light-emitting layers. In the EL layer 833, the plurality of light-emitting layers may be stacked in contact with one another or may be stacked with a separation layer provided therebetween. The separation layer may be provided between a fluorescent layer and a phosphorescent layer, for example.

The separation layer can be provided, for example, to prevent energy transfer by the Dexter mechanism (particularly triplet energy transfer) from a phosphorescent material in an excited state which is generated in the phosphorescent layer to a fluorescent material in the fluorescent layer. The thickness of the separation layer may be several nanometers. Specifically, the thickness of the separation layer may be greater than or equal to 0.1 nm and less than or equal to 20 nm, greater than or equal to 1 nm and less than or equal to 10 nm, or greater than or equal to 1 nm and less than or equal to 5 nm. The separation layer contains a single material (preferably, a bipolar substance) or a plurality of materials (preferably, a hole-transport material and an electron-transport material).

The separation layer may be formed using a material contained in the light-emitting layer in contact with the separation layer. This facilitates the manufacture of the light-emitting element and reduces the drive voltage. For example, in the case where the phosphorescent layer contains a host material, an assist material, and the phosphorescent material (a guest material), the separation layer may contain the host material and the assist material. In other words, the separation layer includes a region not containing the phosphorescent material and the phosphorescent layer includes a region containing the phosphorescent material in the above structure. Thus, the separation layer and the phosphorescent layer can be separately deposited depending on the presence of the phosphorescent material. With such a structure, the separation layer and the phosphorescent layer can be formed in the same chamber. Thus, the manufacturing cost can be reduced.

Moreover, the light-emitting element 830 may be a single element including one EL layer or a tandem element in which EL layers are stacked with a charge generation layer provided therebetween.

The light-emitting element is preferably provided between a pair of insulating films that are highly resistant to moisture, in which case impurities such as water can be prevented from entering the light-emitting element, thereby preventing a decrease in the reliability of the light-emitting panel. Specifically, the use of an insulating film highly resistant to moisture for the first insulating layer 705 and the second insulating layer 715 allows the light-emitting element to be located between a pair of insulating films highly resistant to moisture, by which a decrease in the reliability of the light-emitting panel can be prevented.

As the insulating layer 815, an inorganic insulating film such as a silicon oxide film, a silicon oxynitride film, or an aluminum oxide film can be used, for example. For the insulating layers 817, 817a, and 817b, an organic material such as polyimide, acrylic, polyamide, polyimide amide, or a benzocyclobutene-based resin can be used, for example. Alternatively, a low dielectric constant material (low-k material) or the like can be used. Furthermore, each of the insulating layers may be formed by stacking a plurality of insulating films.

The insulating layer 821 is formed using an organic insulating material or an inorganic insulating material. As a resin, a polyimide resin, a polyamide resin, an acrylic resin, a siloxane resin, an epoxy resin, or a phenol resin can be used, for example. It is particularly preferable that the insulating layer 821 be formed using a photosensitive resin material to have an opening portion over the lower electrode 831 so that a sidewall of the opening portion is formed as an inclined surface with continuous curvature.

There is no particular limitation on the method for forming the insulating layer 821. A photolithography method, a sputtering method, an evaporation method, a droplet discharging method (e.g., an ink-jet method), a printing method (e.g., screen printing or off-set printing), or the like may be used.

The spacer 823 can be formed using an inorganic insulating material, an organic insulating material, a metal material, or the like. As the inorganic insulating material and the organic insulating material, a variety of materials that can be used for the aforementioned insulating layers can be used, for example. As the metal material, titanium, aluminum, or the like can be used. When the spacer 823 containing a conductive material and the upper electrode 835 are electrically connected to each other, a potential drop due to the resistance of the upper electrode 835 can be suppressed. The spacer 823 may have a tapered shape or an inverse tapered shape.

A conductive layer functioning as an electrode of the transistor, a wiring, an auxiliary wiring of the light-emitting element, or the like in the light-emitting panel can be formed with a single-layer structure or a stacked-layer structure using any of metal materials such as molybdenum, titanium, chromium, tantalum, tungsten, aluminum, copper, neodymium, and scandium and an alloy material containing any of these elements, for example. The conductive layer may be formed using a conductive metal oxide such as indium oxide (e.g., $In_2O_3$), tin oxide (e.g., $SnO_2$), ZnO, ITO, indium zinc oxide (e.g., $In_2O_3$—ZnO), or any of these metal oxide materials containing silicon oxide.

The coloring layer is a colored layer that transmits light in a specific wavelength range. For example, a color filter for transmitting light in a red, green, blue, or yellow wavelength range can be used. Each coloring layer is formed in a desired position with any of various materials by a printing method, an ink-jet method, an etching method using a photolithography method, or the like. In a white subpixel, a resin such as a transparent resin may be provided so as to overlap with the light-emitting element.

The light-blocking layer is provided between adjacent coloring layers. The light-blocking layer blocks light emitted from an adjacent light-emitting element to prevent color mixture between adjacent light-emitting elements. Here, the coloring layer is provided such that its end portion overlaps with the light-blocking layer, whereby light leakage can be reduced. For the light-blocking layer, a material that blocks light from the light-emitting element can be used; for example, a black matrix may be formed using a metal material or a resin material containing pigment or dye. Note that it is preferable to provide the light-blocking layer in a region other than the light-emitting portion, such as a driver circuit portion, in which case undesired leakage of guided light or the like can be suppressed.

An overcoat covering the coloring layer and the light-blocking layer may be provided. The overcoat can prevent impurities and the like contained in the coloring layer from being diffused into the light-emitting element. The overcoat is formed with a material that transmits light emitted from the light-emitting element; for example, it is possible to use an inorganic insulating film such as a silicon nitride film or a silicon oxide film, an organic insulating film such as an acrylic film or a polyimide film, or a stacked layer of an organic insulating film and an inorganic insulating film.

In the case where upper surfaces of the coloring layer and the light-blocking layer are coated with a material of the bonding layer, a material that has high wettability with respect to the material of the bonding layer is preferably used as the material of the overcoat. For example, the overcoat is preferably an oxide conductive film such as an ITO film or a metal film such as an Ag film that is thin enough to transmit light.

When the overcoat is formed using a material that has high wettability with respect to the material for the bonding layer, the material for the bonding layer can be uniformly applied. Thus, entry of bubbles in the step of attaching the pair of substrates to each other can be prevented, and thus a display defect can be prevented.

For the connector, any of a variety of anisotropic conductive films (ACF), anisotropic conductive pastes (ACP), and the like can be used.

As described above, one embodiment of the present invention can be applied to a light-emitting panel, a display panel, a touch panel, and the like.

Examples of a display element include a light-emitting element such as an organic EL element, an inorganic EL element, or an LED, a liquid crystal element, an electrophoretic element, and a display element using micro electro mechanical systems (MEMS).

Note that the light-emitting panel of one embodiment of the present invention may be used as a display device or as a lighting device. For example, it may be used as a light source such as a backlight or a front light, that is, a lighting device for a display panel.

This embodiment can be combined with any of the other embodiments as appropriate.

(Embodiment 3)

In this embodiment, a touch panel will be described with reference to drawings. Note that the above description can be referred to for the components of a touch panel, which are similar to those of the light-emitting panel described in Embodiment 2. Although a touch panel including a light-emitting element is described in this embodiment as an example, one embodiment of the present invention is not limited to this example. For example, a touch panel including another element (e.g., a display element), the example of which is shown in Embodiment 2, is also one embodiment of the present invention.

<Structure Example 1>

Figure 18A:
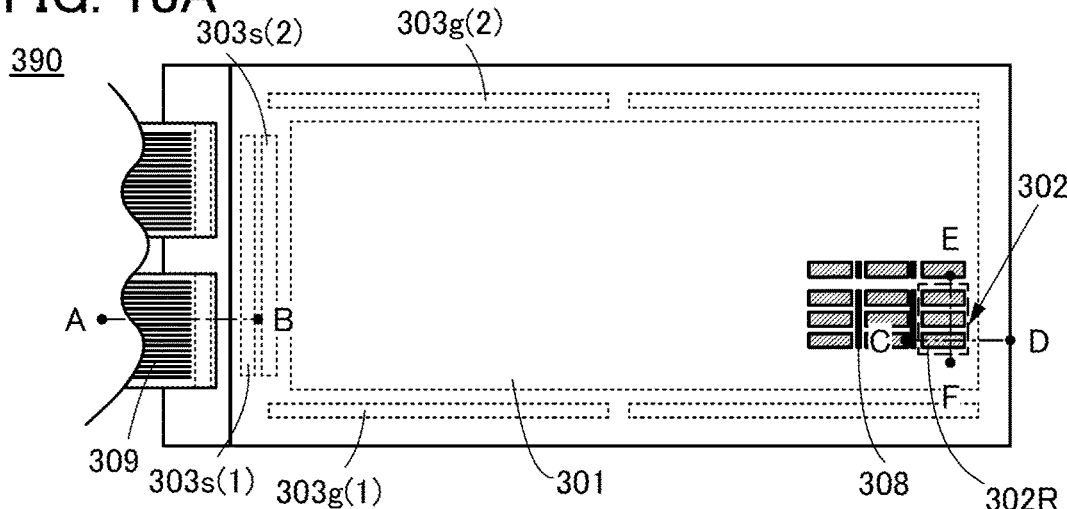
FIGS. 18A to 18C illustrate an example of a touch panel.
Figure 18B:
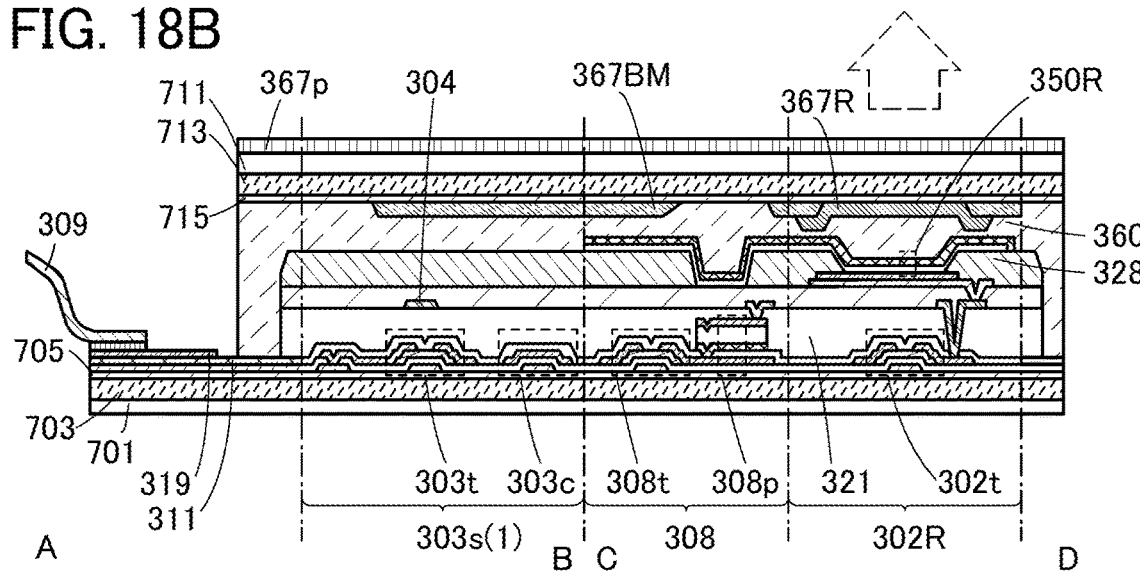
Figure 18C:
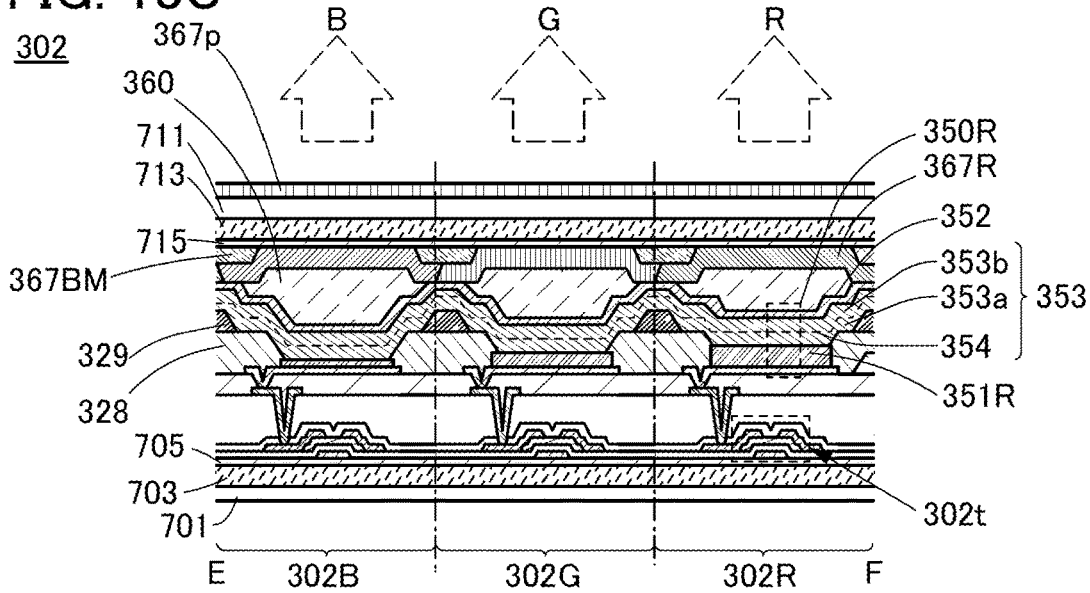

FIG. 18A is a top view of the touch panel. FIG. 18B is a cross-sectional view taken along dashed-dotted line A-B and dashed-dotted line C-D in FIG. 18A. FIG. 18C is a cross-sectional view taken along dashed-dotted line E-F in FIG. 18A.

A touch panel 390 illustrated in FIG. 18A includes a display portion 301 (serving also as an input portion), a scan line driver circuit 303$g$(1), an imaging pixel driver circuit 303$s$(2), an image signal line driver circuit 303$s$(1), and an imaging signal line driver circuit 303$s$(2).

The display portion 301 includes a plurality of pixels 302 and a plurality of imaging pixels 308.

The pixel 302 includes a plurality of subpixels. Each subpixel includes a light-emitting element and a pixel circuit.

The pixel circuits can supply electric power for driving the light-emitting element. The pixel circuits are electrically connected to wirings through which selection signals are supplied. The pixel circuits are also electrically connected to wirings through which image signals are supplied.

The scan line driver circuit 303$g$(1) can supply selection signals to the pixels 302.

The image signal line driver circuit 303$s$(1) can supply image signals to the pixels 302.

A touch sensor can be formed using the imaging pixels 308. Specifically, the imaging pixels 308 can sense a touch of a finger or the like on the display portion 301.

The imaging pixels 308 include photoelectric conversion elements and imaging pixel circuits.

The imaging pixel circuits can drive photoelectric conversion elements. The imaging pixel circuits are electrically connected to wirings through which control signals are supplied. The imaging pixel circuits are also electrically connected to wirings through which power supply potentials are supplied.

Examples of the control signal include a signal for selecting an imaging pixel circuit from which a recorded imaging signal is read, a signal for initializing an imaging pixel circuit, and a signal for determining the time it takes for an imaging pixel circuit to sense light.

The imaging pixel driver circuit 303$g$(2) can supply control signals to the imaging pixels 308.

The imaging signal line driver circuit 303$s$(2) can read out imaging signals.

As illustrated in FIGS. 18B and 18C, the touch panel 390 includes the first flexible substrate 701, the first bonding layer 703, the first insulating layer 705, the second flexible substrate 711, the second bonding layer 713, and the second insulating layer 715. The first flexible substrate 701 and the second flexible substrate 711 are bonded to each other with a third bonding layer 360.

The first flexible substrate 701 and the first insulating layer 705 are attached to each other with the first bonding layer 703. The second flexible substrate 711 and the second insulating layer 715 are attached to each other with the second bonding layer 713. Embodiment 2 can be referred to for materials used for the substrates, the bonding layers, and the insulating layers.

Each of the pixels 302 includes a subpixel 302R, a subpixel 302G, and a subpixel 302B (see FIG. 18C).

For example, the subpixel 302R includes a light-emitting element 350R and the pixel circuit. The pixel circuit includes a transistor 302$t$ that can supply electric power to the light-emitting element 350R. Furthermore, the subpixel 302R includes the light-emitting element 350R and an optical element (e.g., a coloring layer 367R that transmits red light).

The light-emitting element 350R includes a lower electrode 351R, an EL layer 353, and an upper electrode 352, which are stacked in this order (see FIG. 18C).

The EL layer 353 includes a first EL layer 353$a$, an intermediate layer 354, and a second EL layer 353$b$, which are stacked in this order.

Note that a microcavity structure can be provided for the light-emitting element 350R so that light with a specific wavelength can be efficiently extracted. Specifically, an EL layer may be provided between a film that reflects visible light and a film that partly reflects and partly transmits visible light, which are provided so that light with a specific wavelength can be efficiently extracted.

The subpixel 302R includes the third bonding layer 360 that is in contact with the light-emitting element 350R and the coloring layer 367R. The coloring layer 367R is positioned in a region overlapping with the light-emitting element 350R. Accordingly, part of light emitted from the light-emitting element 350R passes through the third bonding layer 360 and through the coloring layer 367R and is emitted to the outside of the subpixel 302R as indicated by an arrow in FIG. 18B or 18C.

The touch panel 390 includes a light-blocking layer 367BM. The light-blocking layer 367BM is provided so as to surround the coloring layer (e.g., the coloring layer 367R).

The touch panel 390 includes an anti-reflective layer 367$p$ positioned in a region overlapping with the display portion 301. As the anti-reflective layer 367$p$, a circular polarizing plate can be used, for example.

The touch panel 390 includes an insulating layer 321. The insulating layer 321 covers the transistor 302$t$ and the like. Note that the insulating layer 321 can be used as a layer for planarizing unevenness caused by the pixel circuits and the imaging pixel circuits. An insulating layer that can inhibit diffusion of impurities to the transistor 302$t$ and the like can be used as the insulating layer 321.

The touch panel 390 includes a partition 328 that overlaps with an end portion of the lower electrode 351R. A spacer 329 that controls the distance between the first flexible substrate 701 and the second flexible substrate 711 is provided on the partition 328.

The image signal line driver circuit 303$s$(1) includes a transistor 303$t$ and a capacitor 303$c$. Note that the driver circuit can be formed in the same process and over the same substrate as the pixel circuits. As illustrated in FIG. 18B, the transistor 303$t$ may include a second gate 304 over the insulating layer 321. The second gate 304 may be electrically connected to a gate of the transistor 303$t$, or different potentials may be supplied to these gates. Alternatively, if necessary, the second gate 304 may be provided for the transistor 308$t$, the transistor 302$t$, or the like.

The imaging pixels 308 each include a photoelectric conversion element 308$p$ and an imaging pixel circuit. The imaging pixel circuit can sense light received by the photoelectric conversion element 308$p$. The imaging pixel circuit includes the transistor 308$t$. For example, a PIN photodiode can be used as the photoelectric conversion element 308$p$.

The touch panel 390 includes a wiring 311 through which a signal is supplied. The wiring 311 is provided with a terminal 319. Note that an FPC 309 through which a signal such as an image signal or a synchronization signal is supplied is electrically connected to the terminal 319. Note that a printed wiring board (PWB) may be attached to the FPC 309.

Note that transistors such as the transistors 302$t$, 303$t$, and 308$t$ can be formed in the same process. Alternatively, the transistors may be formed in different processes.

<Structure Example 2>

Figure 19A:
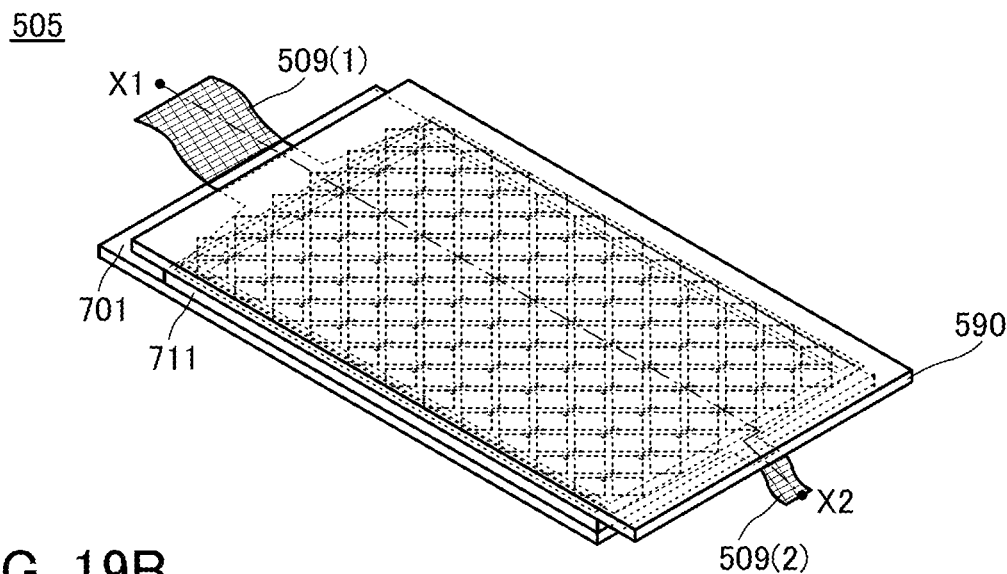
FIGS. 19A and 19B illustrate an example of a touch panel.
Figure 19B:
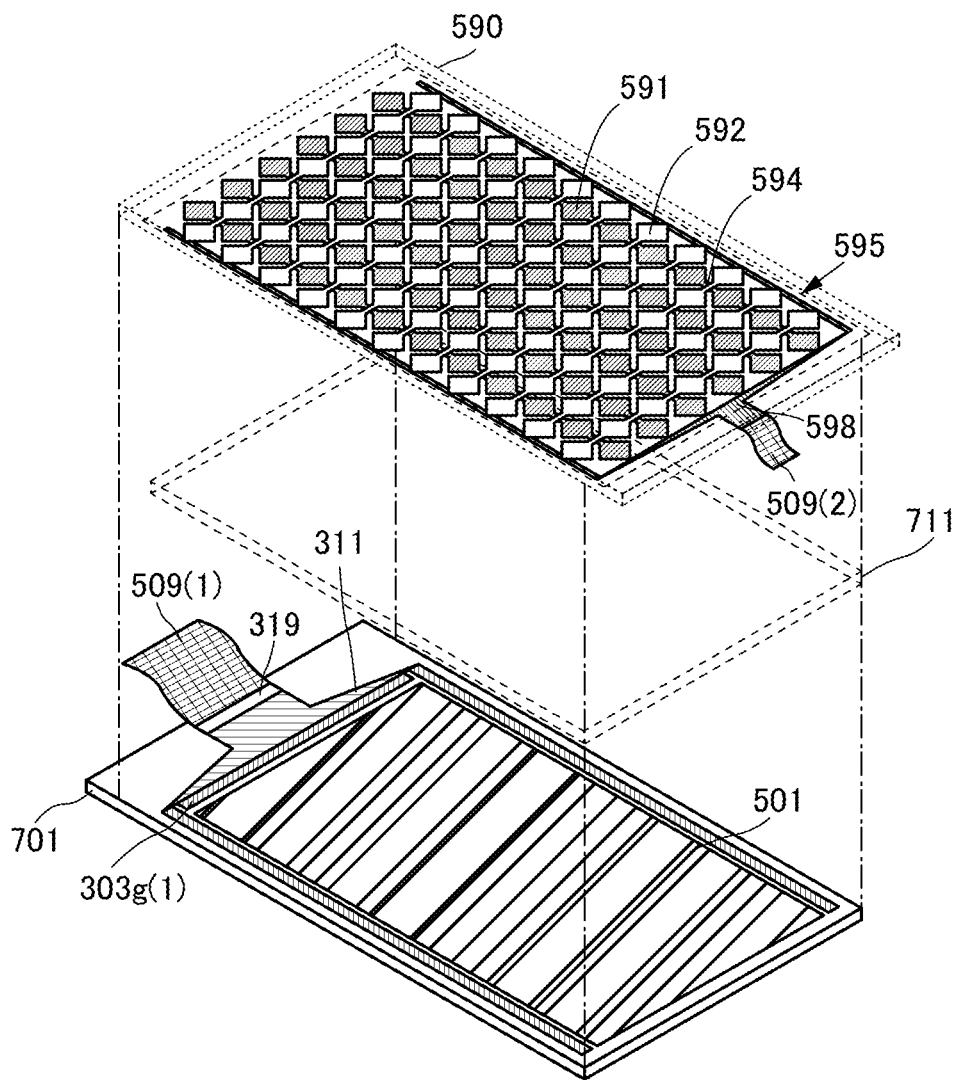
Figure 20A:
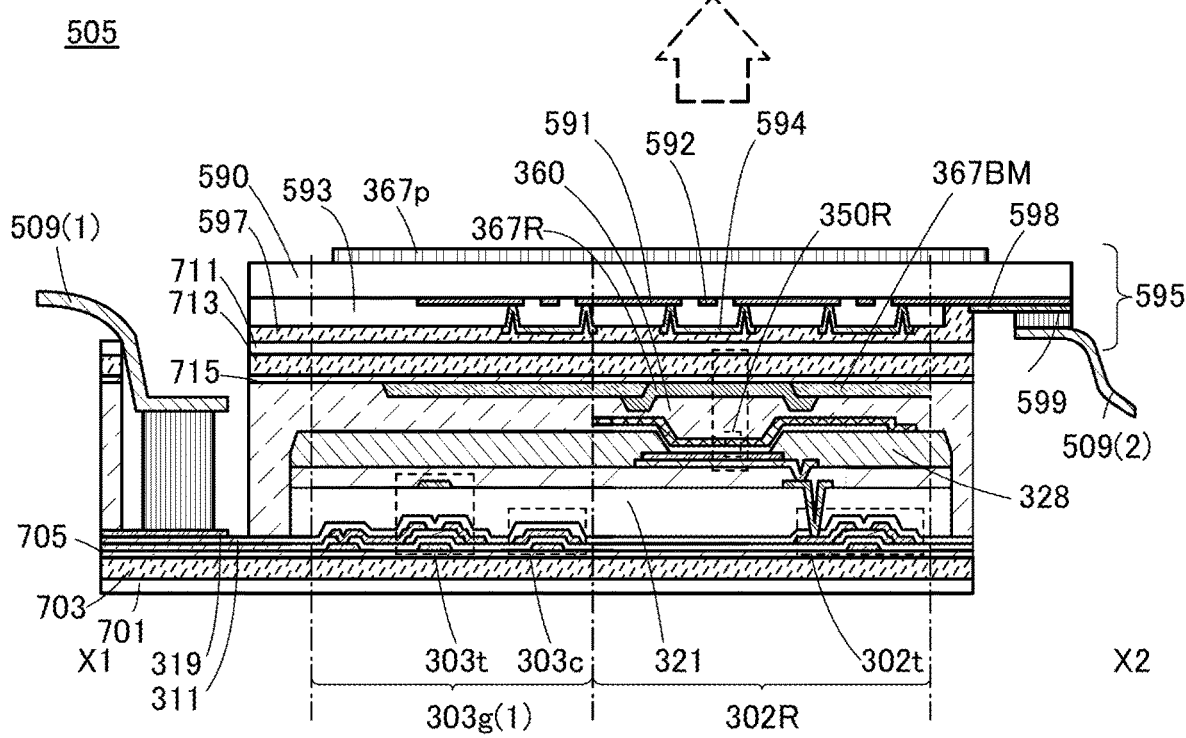
FIGS. 20A and 20B each illustrate an example of a touch panel.
Figure 20B:
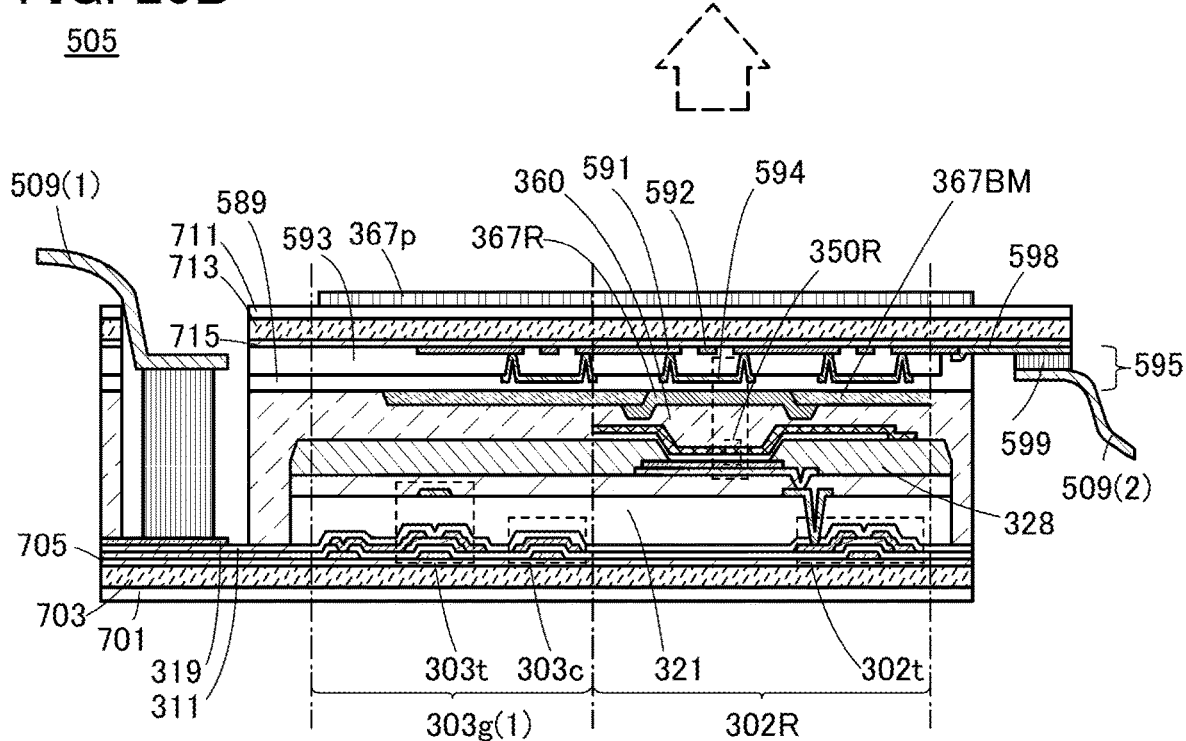

FIGS. 19A and 19B are perspective views of a touch panel 505. Note that FIGS. 19A and 19B illustrate only main components for simplicity. FIGS. 20A and 20B are each a cross-sectional view taken along dashed-dotted line X1-X2 in FIG. 19A.

As illustrated in FIGS. 19A and 19B, the touch panel 505 includes a display portion 501, the scan line driver circuit 303$g$(1), a touch sensor 595, and the like. Furthermore, the touch panel 505 includes the first flexible substrate 701, the second flexible substrate 711, and a flexible substrate 590.

The touch panel 505 includes a plurality of pixels and a plurality of wirings 311. The plurality of wirings 311 can supply signals to the pixels. The plurality of wirings 311 are arranged to a peripheral portion of the first flexible substrate 701, and part of the plurality of wirings 311 form the terminal 319. The terminal 319 is electrically connected to an FPC 509(1).

The touch panel 505 includes the touch sensor 595 and a plurality of wirings 598. The plurality of wirings 598 are electrically connected to the touch sensor 595. The plurality of wirings 598 are arranged to a peripheral portion of the flexible substrate 590, and part of the plurality of wirings 598 form a terminal. The terminal is electrically connected to an FPC 509(2). Note that in FIG. 19B, electrodes, wirings, and the like of the touch sensor 595 provided on the back side of the flexible substrate 590 (the side facing the first flexible substrate 701) are indicated by solid lines for clarity.

As the touch sensor 595, for example, a capacitive touch sensor can be used. Examples of the capacitive touch sensor are a surface capacitive touch sensor and a projected capacitive touch sensor. An example of using a projected capacitive touch sensor is described here.

Examples of a projected capacitive touch sensor are a self-capacitive touch sensor and a mutual capacitive touch sensor. The use of a mutual capacitive type is preferable because multiple points can be sensed simultaneously.

Note that a variety of sensors that can sense the closeness or the contact of a sensing target such as a finger can be used as the touch sensor 595.

The projected capacitive touch sensor 595 includes electrodes 591 and electrodes 592. The electrodes 591 are electrically connected to any of the plurality of wirings 598, and the electrodes 592 are electrically connected to any of the other wirings 598.

The electrodes 592 each have a shape of a plurality of quadrangles arranged in one direction with one corner of a quadrangle connected to one corner of another quadrangle as illustrated in FIGS. 19A and 19B.

The electrodes 591 each have a quadrangular shape and are arranged in a direction intersecting with the direction in which the electrodes 592 extend. Note that the plurality of electrodes 591 are not necessarily arranged in the direction orthogonal to one electrode 592 and may be arranged to intersect with one electrode 592 at an angle of less than 90 degrees.

The wiring 594 intersects with the electrode 592. The wiring 594 electrically connects two electrodes 591 between which one of the electrodes 592 is positioned. The intersecting area of the electrode 592 and the wiring 594 is preferably as small as possible. Such a structure allows a reduction in the area of a region where the electrodes are not provided, reducing unevenness in transmittance. As a result, unevenness in luminance of light from the touch sensor 595 can be reduced.

Note that the shapes of the electrodes 591 and the electrodes 592 are not limited to the above-mentioned shapes and can be any of a variety of shapes.

As illustrated in FIG. 20A, the touch panel 505 includes the first flexible substrate 701, the first bonding layer 703, the first insulating layer 705, the second flexible substrate 711, the second bonding layer 713, and the second insulating layer 715. The first flexible substrate 701 and the second flexible substrate 711 are attached to each other with the third bonding layer 360.

A bonding layer 597 attaches the flexible substrate 590 to the second flexible substrate 711 so that the touch sensor 595 overlaps with the display portion 501. The bonding layer 597 has a light-transmitting property.

The electrodes 591 and the electrodes 592 are formed using a light-transmitting conductive material. As a light-transmitting conductive material, a conductive oxide such as indium oxide, indium tin oxide, indium zinc oxide, zinc oxide, or zinc oxide to which gallium is added can be used. Note that a film including graphene may be used as well. The film including graphene can be formed, for example, by reducing a film including graphene oxide. As a reducing method, a method with application of heat or the like can be employed.

Note that as a material of the conductive films such as the electrodes 591, the electrodes 592, and the wiring 594, that is, wirings and electrodes forming the touch panel, a transparent conductive film including indium oxide, tin oxide, zinc oxide, or the like (e.g., ITO) can be given. A low-resistance material is preferably used as a material that can be used as the wirings and electrodes forming the touch panel. For example, silver, copper, aluminum, a carbon nanotube, graphene, or a metal halide (such as a silver halide) may be used. Alternatively, a metal nanowire including a number of conductors with an extremely small width (for example, a diameter of several nanometers) may be used. Further alternatively, a net-like metal mesh with a conductor may be used. For example, an Ag nanowire, a Cu nanowire, an Al nanowire, an Ag mesh, a Cu mesh, or an Al mesh may be used. For example, in the case of using an Ag nanowire as the wirings and electrodes forming the touch panel, a visible light transmittance of 89% or more and a sheet resistance of 40 ohm/square or more and 100 ohm/square or less can be achieved. Since the above-described metal nanowire, metal mesh, carbon nanotube, graphene, and the like, which are examples of the material that can be used as the wirings and electrodes forming the touch panel, have high visible light transmittances, they may be used as electrodes of display elements (e.g., a pixel electrode or a common electrode).

The electrodes 591 and the electrodes 592 may be formed by depositing a light-transmitting conductive material on the flexible substrate 590 by a sputtering method and then removing an unnecessary portion by any of various patterning techniques such as photolithography.

The electrodes 591 and the electrodes 592 are covered with an insulating layer 593. Furthermore, openings reaching the electrodes 591 are formed in the insulating layer 593, and the wiring 594 electrically connects the adjacent electrodes 591. A light-transmitting conductive material can be favorably used for the wiring 594 because the aperture ratio of the touch panel can be increased. Moreover, a material with higher conductivity than the conductivities of the electrodes 591 and the electrodes 592 can be favorably used for the wiring 594 because electric resistance can be reduced.

Note that an insulating layer covering the insulating layer 593 and the wiring 594 may be provided to protect the touch sensor 595.

Furthermore, a connection layer 599 electrically connects the wirings 598 to the FPC 509(2).

The display portion 501 includes a plurality of pixels arranged in a matrix. Each pixel has the same structure as Structure Example 1; thus, description is omitted.

As illustrated in FIG. 20B, the touch panel may include two substrates of the first flexible substrate 701 and the second flexible substrate 711 without including the flexible substrate 590. The second flexible substrate 711 and the second insulating layer 715 are attached to each other with the second bonding layer 713, and the touch sensor 595 is provided in contact with the second insulating layer 715. The coloring layer 367R and the light-blocking layer 367BM are provided in contact with the insulating layer 589 that covers the touch sensor 595. The insulating layer 589 is not necessarily provided, in which case the coloring layer 367R and the light-blocking layer 367BM are provided in contact with the wiring 594.

<Structure Example 3>

Figure 21A:
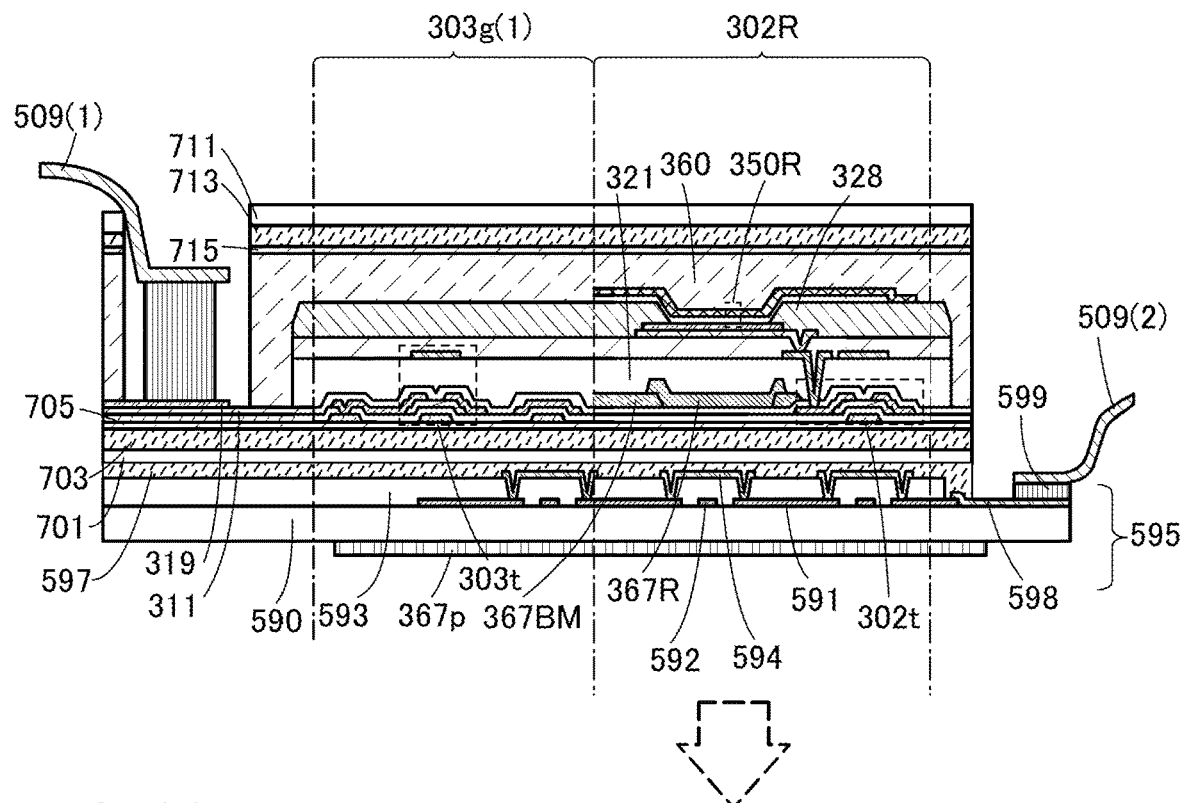
FIGS. 21A to 21C illustrate examples of a touch panel.
Figure 21B:
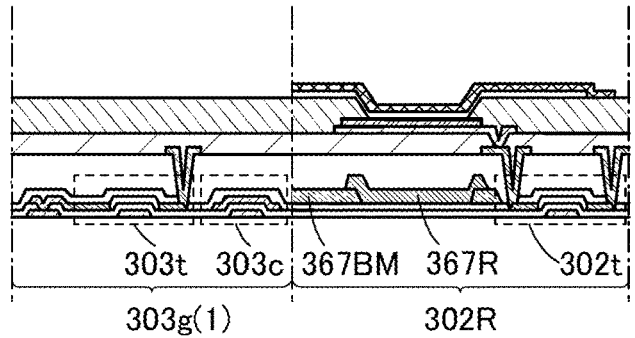
Figure 21C:
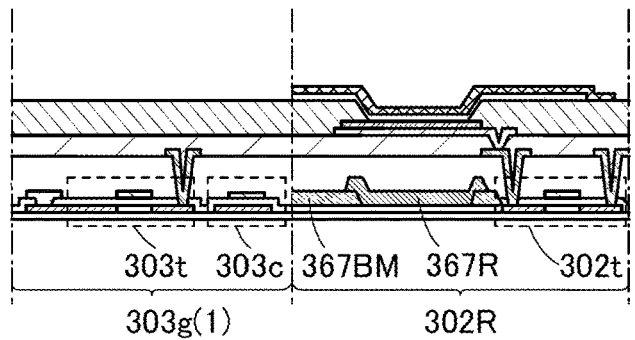

FIGS. 21A to 21C are cross-sectional views of a touch panel 505B. The touch panel 505B described in this embodiment is different from the touch panel 505 in Structure Example 2 in that received image data is displayed on the side where the transistors are provided and that the touch sensor is provided on the first flexible substrate 701 side of the display portion. Different structures will be described in detail below, and the above description is referred to for the other similar structures.

The coloring layer 367R is positioned in a region overlapping with the light-emitting element 350R. The light-emitting element 350R illustrated in FIG. 21A emits light to the side where the transistor 302t is provided. Accordingly, part of light emitted from the light-emitting element 350R passes through the coloring layer 367R and is emitted to the outside of the touch panel 505B as indicated by an arrow in FIG. 21A.

The touch panel 505B includes the light-blocking layer 367BM on the light extraction side. The light-blocking layer 367BM is provided so as to surround the coloring layer (e.g., the coloring layer 367R).

The touch sensor 595 is provided not on the second flexible substrate 711 side but on the first flexible substrate 701 side (see FIG. 21A).

The bonding layer 597 attaches the flexible substrate 590 to the first flexible substrate 701 so that the touch sensor 595 overlaps with the display portion. The bonding layer 597 has a light-transmitting property.

Note that a structure in the case of using bottom-gate transistors in the display portion 501 is illustrated in FIGS. 21A and 21B.

For example, a semiconductor layer containing an oxide semiconductor, amorphous silicon, or the like can be used in the transistor 302t and the transistor 303t illustrated in FIG. 21A.

For example, a semiconductor layer containing polycrystalline silicon or the like can be used in the transistor 302t and the transistor 303t illustrated in FIG. 21B.

A structure in the case of using top-gate transistors is illustrated in FIG. 21C.

For example, a semiconductor layer containing polycrystalline silicon, a single crystal silicon film that is transferred from a single crystal silicon substrate, or the like can be used in the transistor 302t and the transistor 303t illustrated in FIG. 21C. This embodiment can be combined with any of the other embodiments as appropriate.

EXAMPLE 1

In this example, light-emitting devices of one embodiment of the present invention were fabricated.

In this example, the light-emitting devices corresponding to Structure Example B (see FIG. 2A and the like) and Structure Example D (see FIG. 9A and the like), respectively, were fabricated.

Light-emitting panels of this example were fabricated in the following manner: a separation layer (tungsten film) was formed over each of a pair of formation substrates (glass substrates); layers to be separated (one of them included a transistor, a light-emitting element, and the like, and the other included a color filter and the like) were formed over the respective separation layers; the pair of formation substrates was separated from the layers to be separated; and then flexible substrates were attached to the layers to be separated with an adhesive.

As the transistor, a transistor including a c-axis aligned crystalline oxide semiconductor (CAAC-OS) was used. Unlike amorphous semiconductor, the CAAC-OS has few defect states, so that the reliability of the transistor can be improved. Moreover, since the CAAC-OS does not have a grain boundary, a stable and uniform film can be formed over a large area, and stress that is caused by bending a flexible light-emitting device does not easily make a crack in a CAAC-OS film.

A CAAC-OS is a crystalline oxide semiconductor having c-axis alignment of crystals in a direction substantially perpendicular to the film surface. It has been found that oxide semiconductors have a variety of crystal structures other than a single crystal structure. An example of such structures is a nano-crystal (nc) structure, which is an aggregate of nanoscale microcrystals. The crystallinity of a CAAC-OS structure is lower than that of a single crystal structure and higher than that of an nc structure.

In this example, a channel-etched transistor including an In—Ga—Zn-based oxide was used. The transistor was fabricated over a glass substrate at a process temperature lower than 500° C.

In a method of fabricating an element such as a transistor directly on an organic resin such as a plastic substrate, the temperature of the process for fabricating the element needs to be lower than the upper temperature limit of the organic resin. In this example, the formation substrate is a glass substrate and the peeling layer, which is an inorganic film, has high heat resistance; thus, the transistor can be fabricated at a temperature equal to that when a transistor is fabricated over a glass substrate. Thus, the performance and reliability of the transistor can be easily secured.

As the light-emitting element, a tandem (stacked-layer) organic EL element emitting white light was used. The light-emitting element has a top emission structure. Light from the light-emitting element is extracted outside through a color filter.

The light-emitting panels of two kinds were fabricated.

Figure 22A:
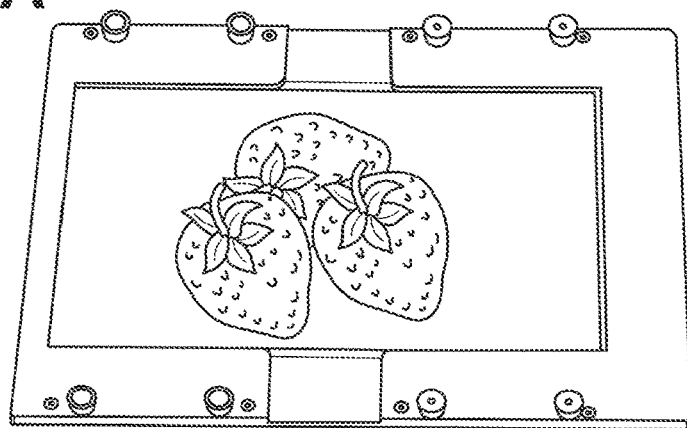
FIGS. 22A to 22C are photographs of a light-emitting device in Example.
Figure 22B:
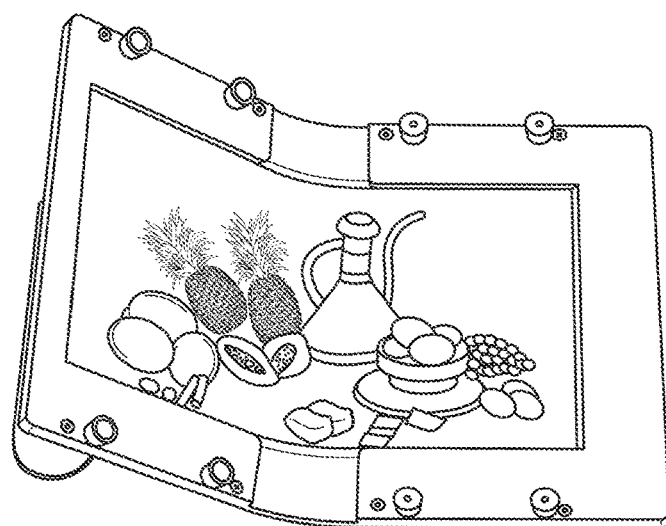
Figure 22C:
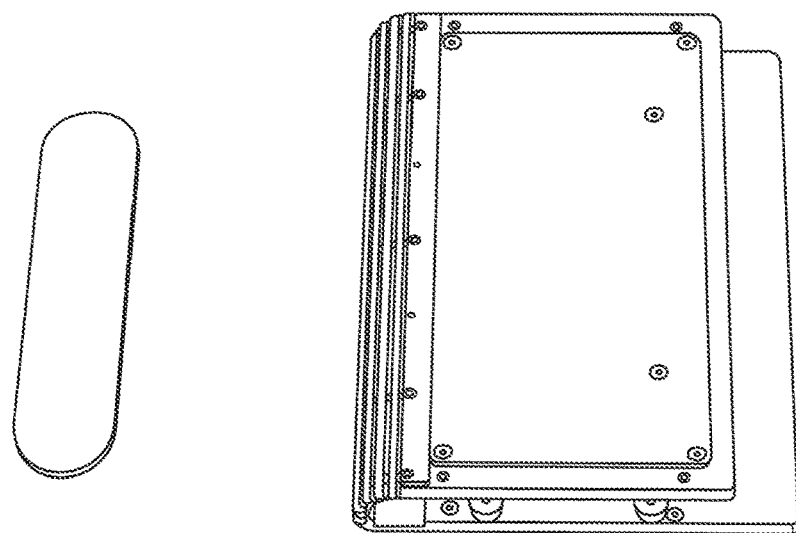

FIGS. 22A to 22C show the light-emitting device corresponding to Structure Example B. FIG. 22A illustrates the light-emitting device that is opened. FIG. 22B illustrates the light-emitting device that is being opened or being folded. FIG. 22C illustrates the light-emitting device that is folded.

The light-emitting device illustrated in FIGS. 22A to 22C includes a magnet-type fixing unit as the fixing unit 107. The connection portion 105 includes an elastic body and a plurality of spacers. The light-blocking layer 109 is positioned so as to overlap with the connection portion 105, whereby the connection portion 105 can be prevented from being seen by a user viewing a light-emitting surface of the light-emitting device.

In the light-emitting panel of the light-emitting device illustrated in FIGS. 22A to 22C, a light-emitting portion (also referred to as light-emitting region or pixel portion) has a size of 5.9 inches diagonal, 720×1280 pixels, a pixel size of 102 μm×102 μm, a resolution of 249 ppi, and an aperture ratio of 45.2%. A built-in scan driver and an external source driver attached by chip on film (COF) were used. The frame frequency was 60 Hz. Note that the light-emitting panel has a weight of approximately 3 g and a thickness less than 100 μm.

Figure 23A:
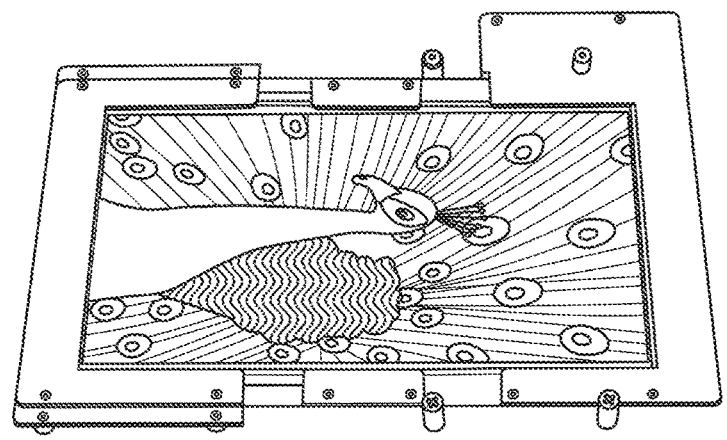
FIGS. 23A to 23C are photographs of a light-emitting device in Example.
Figure 23B:
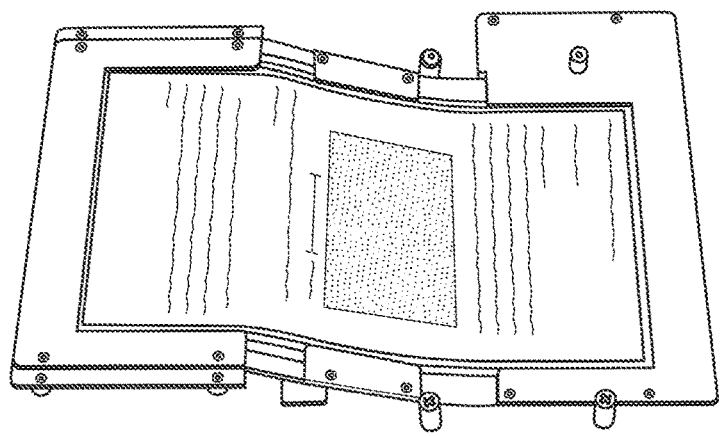
Figure 23C:
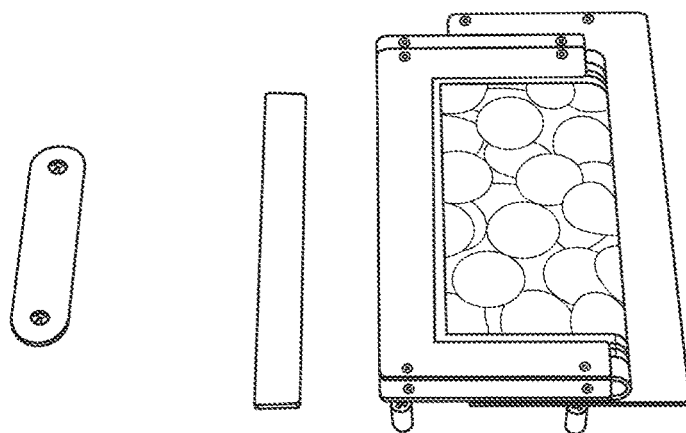

FIGS. 23A to 23C show the light-emitting device corresponding to Structure Example D. FIG. 23A illustrates the light-emitting device that is opened. FIG. 23B illustrates the light-emitting device that is being opened or being folded. FIG. 23C illustrates the light-emitting device that is folded.

In the light-emitting panel of the light-emitting device illustrated in FIGS. 23A to 23C, a light-emitting portion has a size of 8.7 inches diagonal, 1080×1920 pixels, a pixel size of 100 μm×100 μm, a resolution of 254 ppi, and an aperture ratio of 46.0%. A built-in scan driver and an external source driver attached by COF were used. The frame frequency was 60 Hz. Note that a capacitive touch sensor is incorporated in the light-emitting panel. Note that the light-emitting panel has a weight of approximately 6 g and a thickness less than 100 μm.

As described above, by application of one embodiment of the present invention, a light-emitting device that is highly portable in a folded state and is highly browsable in an opened state because of a seamless large light-emitting region was fabricated. Furthermore, a light-emitting device in which a light-emitting panel is prevented from being broken owing to folding was fabricated.

REFERENCE NUMERALS

101: light-emitting panel, 103: support, 103a: support, 103b: support, 105: connection portion, 105a: connection portion, 105b: connection portion, 106: elastic body, 107: fixing unit, 108: spacer, 109: light-blocking layer, 111: light-emitting region, 112: non-light-emitting region, 113a: protective layer, 113b: protective layer, 151: first region, 152: second region, 153: third region, 161: first region, 162: second region, 163: third region, 164: fourth region, 165: fifth region, 171: first region, 172: second region, 173: third region, 301: display portion, 302: pixel, 302B: subpixel, 302G: subpixel, 302R: subpixel, 302t: transistor, 303c: capacitor, 303g(1): scan line driver circuit, 303g(2): imaging pixel driver circuit, 303s(1): image signal line driver circuit, 303s(2): imaging signal line driver circuit, 303t: transistor, 304: gate, 308: imaging pixel, 308p: photoelectric conversion element, 308t: transistor, 309: FPC, 311: wiring, 319: terminal, 321: insulating layer, 328: partition, 329: spacer, 350R: light-emitting element, 351R: lower electrode, 352: upper electrode, 353: EL layer, 353a: EL layer, 353b: EL layer, 354: intermediate layer, 360: bonding layer, 367BM: light-blocking layer, 367p: anti-reflective layer, 367R: coloring layer, 390: touch panel, 501: display portion, 505: touch panel, 505B: touch panel, 509: FPC, 589: insulating layer, 590: flexible substrate, 591: electrode, 592: electrode, 593: insulating layer, 594: wiring, 595: touch sensor, 597: bonding layer, 598: wiring, 599: connection layer, 701: flexible substrate, 703: bonding layer, 705: insulating layer, 711: flexible substrate, 713: bonding layer, 715: insulating layer, 804: light-emitting portion, 806: driver circuit portion, 808: FPC, 814: conductive layer, 815: insulating layer, 817: insulating layer, 817a: insulating layer, 817b: insulating layer, 820: transistor, 821: insulating layer, 822: bonding layer, 823: spacer, 824: transistor, 825: connector, 830: light-emitting element, 831: lower electrode, 832: optical adjustment layer, 833: EL layer, 835: upper electrode, 845: coloring layer, 847: light-blocking layer, 849: overcoat, 856: conductive layer, 857: conductive layer, 857a: conductive layer, and 857b: conductive layer This application is based on Japanese Patent Application serial no. 2014-219135 filed with Japan Patent Office on Oct. 28, 2014, the entire contents of which are hereby incorporated by reference.

The invention claimed is:

1. An electronic device comprising:
a first support and a second support;
a region comprising a spacer between the first support and the second support;
a light-emitting panel overlapping with the first support, the region, and the second support;
a third support overlapping with the first support with the light-emitting panel interposed between the first support and the third support, the third support comprising a first portion and a second portion;
a fourth support overlapping with the second support with the light-emitting panel interposed between the second support and the fourth support, the fourth support comprising a third portion and a fourth portion; and
a unit in contact with the first portion of the third support,
wherein the region is configured to be kept folded,
wherein the third portion of the fourth support is in contact with the first portion of the third support through the unit when the light-emitting panel is folded at the region, and
wherein the fourth portion of the fourth support is not in contact with the second portion of the third support when the light-emitting panel is folded at the region.

2. The electronic device according to claim 1, further comprising an elastic body in an opening of the spacer.

3. The electronic device according to claim 2, wherein the elastic body is a spring or rubber.

4. The electronic device according to claim 1, wherein the spacer comprises a plurality of cuts.

5. The electronic device according to claim 4, wherein an angle between normal of facing planes of two adjacent projections separated by the plurality of cuts changes according to bending of the light-emitting panel.

6. The electronic device according to claim 1, wherein the unit is a magnet-type fixing unit or a mechanical-type fixing unit.

7. The electronic device according to claim 1, further comprising a protective layer over the light-emitting panel in the region.

8. An electronic device comprising:
a first support and a second support;
a region comprising a spacer between the first support and the second support;
a light-emitting panel overlapping with the first support, the region, and the second support;
a third support overlapping with the first support with the light-emitting panel interposed between the first support and the third support, the third support comprising a first portion and a second portion;
a fourth support overlapping with the second support with the light-emitting panel interposed between the second support and the fourth support, the fourth support comprising a third portion and a fourth portion;
a unit in contact with the first portion of the third support; and
a sensor,
wherein the region is configured to be kept folded,
wherein the third portion of the fourth support is in contact with the first portion of the third support through the unit when the light-emitting panel is folded at the region,
wherein the fourth portion of the fourth support is not in contact with the second portion of the third support when the light-emitting panel is folded at the region,
wherein the sensor is configured to determine whether the electronic device is folded or not, and
wherein when the sensor senses that the electronic device is folded, the light-emitting panel becomes in a non-light-emitting state.

9. The electronic device according to claim 8, further comprising an elastic body in an opening of the spacer.

10. The electronic device according to claim 9, wherein the elastic body is a spring or rubber.

11. The electronic device according to claim 8, wherein the spacer comprises a plurality of cuts.

12. The electronic device according to claim 11, wherein an angle between normal of facing planes of two adjacent projections separated by the plurality of cuts changes according to bending of the light-emitting panel.

13. The electronic device according to claim 8, wherein the unit is a magnet-type fixing unit or a mechanical-type fixing unit.

14. The electronic device according to claim 8, further comprising a protective layer over the light-emitting panel in the region.

* * * * *